(12) United States Patent
Ikeda

(10) Patent No.: US 10,090,344 B2
(45) Date of Patent: Oct. 2, 2018

(54) IMAGING DEVICE, METHOD FOR OPERATING THE SAME, MODULE, AND ELECTRONIC DEVICE

(71) Applicant: Semiconductor Energy Laboratory Co., Ltd., Atsugi-shi, Kanagawa-ken (JP)

(72) Inventor: Takayuki Ikeda, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 15/254,255

(22) Filed: Sep. 1, 2016

(65) Prior Publication Data

US 2017/0069673 A1 Mar. 9, 2017

(30) Foreign Application Priority Data

Sep. 7, 2015 (JP) .................................. 2015-175427

(51) Int. Cl.
*H01L 29/10* (2006.01)
*H01L 27/146* (2006.01)
*H04N 5/3745* (2011.01)

(52) U.S. Cl.
CPC .... *H01L 27/14616* (2013.01); *H01L 27/1462* (2013.01); *H01L 27/14607* (2013.01); *H01L 27/14609* (2013.01); *H01L 27/14627* (2013.01); *H04N 5/37457* (2013.01); *H01L 27/14696* (2013.01)

(58) Field of Classification Search
CPC ......... H01L 27/14616; H01L 27/14609; H01L 27/1462; H01L 27/14627; H01L 27/14607; H01L 27/14696
See application file for complete search history.

(56) References Cited

U.S. PATENT DOCUMENTS

| | | | |
|---|---|---|---|
| 7,674,650 B2 | 3/2010 | Akimoto et al. | |
| 8,378,391 B2 | 2/2013 | Koyama et al. | |
| 8,461,590 B2 | 6/2013 | Tamura et al. | |

(Continued)

FOREIGN PATENT DOCUMENTS

| | | |
|---|---|---|
| JP | 2007-096055 | 4/2007 |
| JP | 2007-123861 | 5/2007 |
| JP | 2011-119711 | 6/2011 |

OTHER PUBLICATIONS

Tomoaki Masuzawa, "Development of an Amorphous Selenium-Based Photodetector Driven by a Diamond Cold Cathode", Aug. 19, 2013.*

(Continued)

*Primary Examiner* — Dale E Page
*Assistant Examiner* — Wasiul Haider
(74) *Attorney, Agent, or Firm* — Fish & Richardson P.C.

(57) ABSTRACT

An imaging device which can perform imaging with a global shutter system and in which transistors are shared by pixels is provided. The imaging device includes first and second photoelectric conversion elements and first to sixth transistors. Active layers of the first to fourth transistors each include an oxide semiconductor. The imaging device has a configuration in which a reset transistor and an amplifier transistor are shared by a plurality of pixels and can perform imaging with a global shutter system. In addition, the imaging device can be used as a high-speed camera.

20 Claims, 52 Drawing Sheets

(56) References Cited

U.S. PATENT DOCUMENTS

| | | |
|---|---|---|
| 8,586,905 B2 | 11/2013 | Kurokawa |
| 8,654,231 B2 | 2/2014 | Kurokawa et al. |
| 8,674,972 B2 | 3/2014 | Kurokawa et al. |
| 8,698,782 B2 | 4/2014 | Kurokawa |
| 8,766,338 B2 | 7/2014 | Kurokawa et al. |
| 8,836,626 B2 | 9/2014 | Ikeda |
| 8,872,120 B2 | 10/2014 | Kurokawa et al. |
| 8,952,313 B2 | 2/2015 | Tamura |
| 9,055,245 B2 | 6/2015 | Kozuma |
| 2009/0261443 A1* | 10/2009 | Noh .................. H01L 27/14603 257/443 |
| 2011/0176038 A1* | 7/2011 | Kurokawa ........... H04N 5/3696 348/294 |
| 2011/0198483 A1 | 8/2011 | Kurokawa |
| 2011/0215323 A1 | 9/2011 | Kurokawa et al. |
| 2011/0220889 A1 | 9/2011 | Kurokawa et al. |
| 2011/0221723 A1 | 9/2011 | Kurokawa et al. |
| 2012/0002090 A1 | 1/2012 | Aoki et al. |
| 2012/0056861 A1 | 3/2012 | Kurokawa et al. |
| 2012/0146027 A1 | 6/2012 | Tamura et al. |
| 2012/0162167 A1 | 6/2012 | Kurokawa |
| 2012/0182791 A1* | 7/2012 | Koyama ................. H01L 21/84 365/149 |
| 2012/0327281 A1 | 12/2012 | Mabuchi et al. |
| 2013/0015326 A1 | 1/2013 | Tamura |
| 2013/0016035 A1 | 1/2013 | Ikeda |
| 2013/0075594 A1 | 3/2013 | Kozuma |
| 2013/0299888 A1 | 11/2013 | Kurokawa et al. |
| 2013/0320222 A1 | 12/2013 | Abenaim et al. |
| 2013/0321366 A1 | 12/2013 | Kozuma et al. |
| 2014/0027768 A1 | 1/2014 | Kurokawa |
| 2014/0054466 A1 | 2/2014 | Kurokawa et al. |
| 2014/0211056 A1* | 7/2014 | Fan .................. H01L 27/14643 348/308 |
| 2014/0267864 A1 | 9/2014 | Kurokawa et al. |
| 2014/0361296 A1 | 12/2014 | Ikeda |
| 2015/0028335 A1 | 1/2015 | Kurokawa et al. |
| 2015/0079728 A1* | 3/2015 | Yamazaki ............. H01L 21/441 438/104 |
| 2015/0129944 A1 | 5/2015 | Kurokawa et al. |
| 2015/0145006 A1 | 5/2015 | Tamura |
| 2015/0206981 A1 | 7/2015 | Komachi |
| 2015/0236061 A1 | 8/2015 | Kurokawa |
| 2015/0279896 A1 | 10/2015 | Kurokawa et al. |
| 2015/0296162 A1 | 10/2015 | Kurokawa et al. |
| 2015/0334321 A1 | 11/2015 | Kozuma |
| 2015/0340392 A1 | 11/2015 | Ikeda |
| 2015/0357476 A1 | 12/2015 | Kurokawa et al. |
| 2016/0021319 A1 | 1/2016 | Okamoto et al. |
| 2016/0064443 A1 | 3/2016 | Inoue et al. |
| 2016/0064444 A1 | 3/2016 | Inoue et al. |
| 2016/0118426 A1 | 4/2016 | Kurokawa et al. |
| 2016/0126275 A1 | 5/2016 | Kurokawa |
| 2016/0165159 A1* | 6/2016 | Hseih .................. H04N 5/23235 348/273 |
| 2016/0286151 A1 | 9/2016 | Lahav et al. |
| 2016/0307949 A1 | 10/2016 | Madurawe |
| 2017/0013214 A1 | 1/2017 | Ohmaru |
| 2017/0084649 A1 | 3/2017 | Ohmaru et al. |
| 2017/0104025 A1 | 4/2017 | Kusumoto |

OTHER PUBLICATIONS

Funatsu.R et al., "133Mpixel 60fps CMOS Image Sensor with 32-Column Shared High-Speed Column-Parallel SAR ADCs", ISSCC 2015 (Digest of Technical Papers. IEEE International Solid-State Circuits Conference), Feb. 23, 2015, pp. 112-113.

* cited by examiner

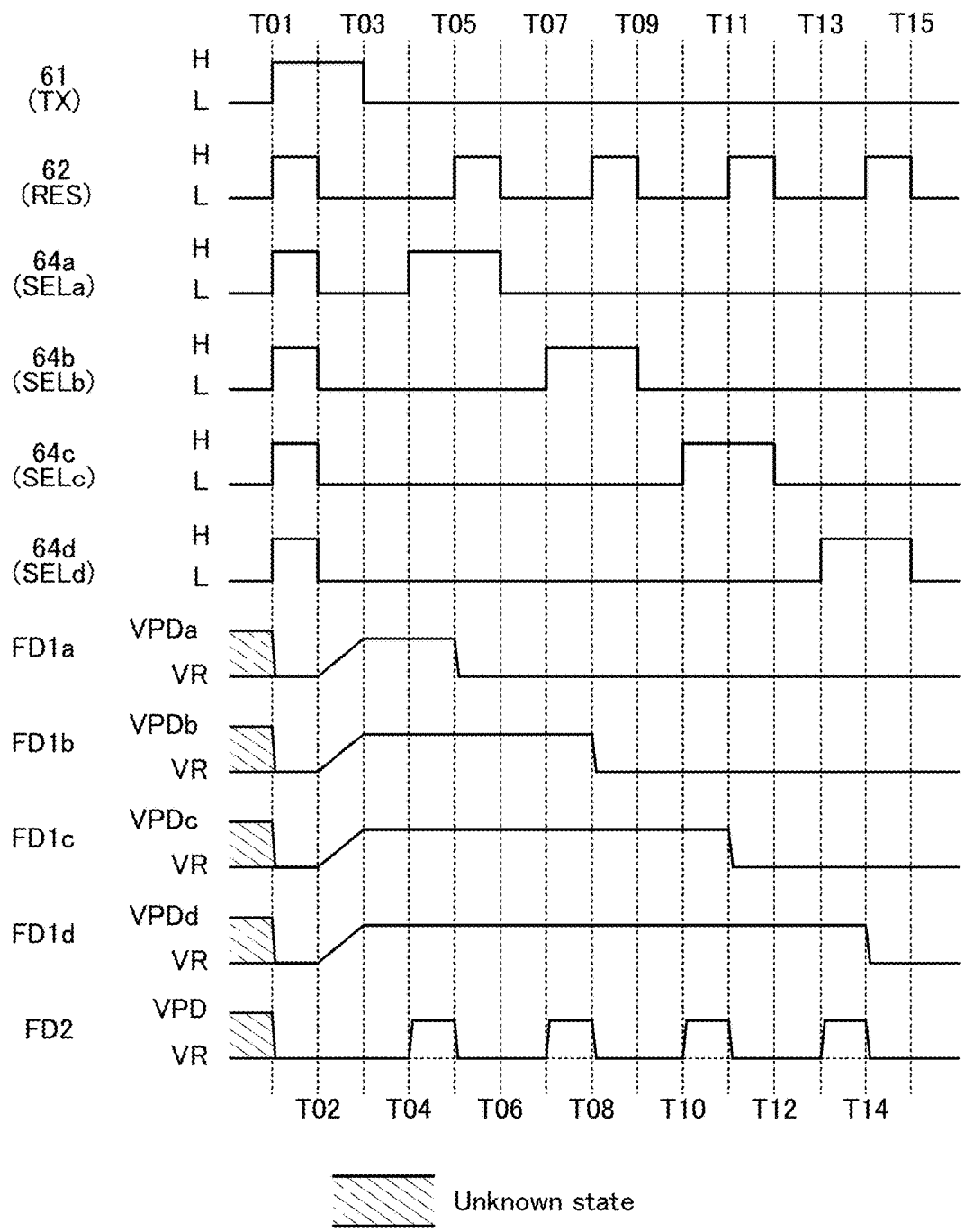

FIG. 33A1
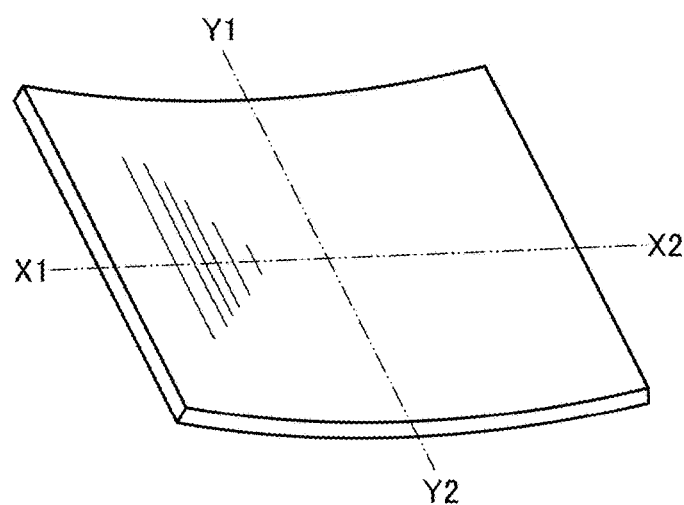
FIG. 33A2
FIG. 33A3
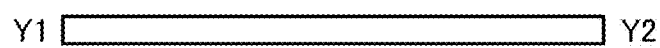
FIG. 33B1
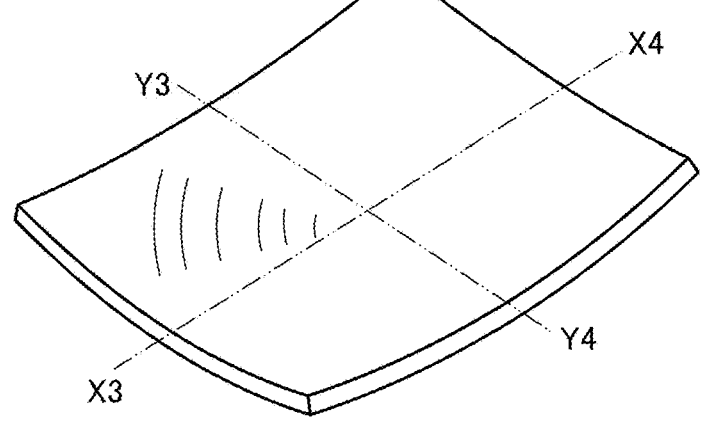
FIG. 33B2
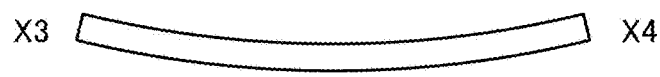
FIG. 33B3
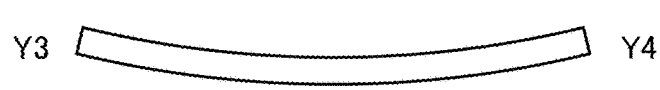

FIG. 45A
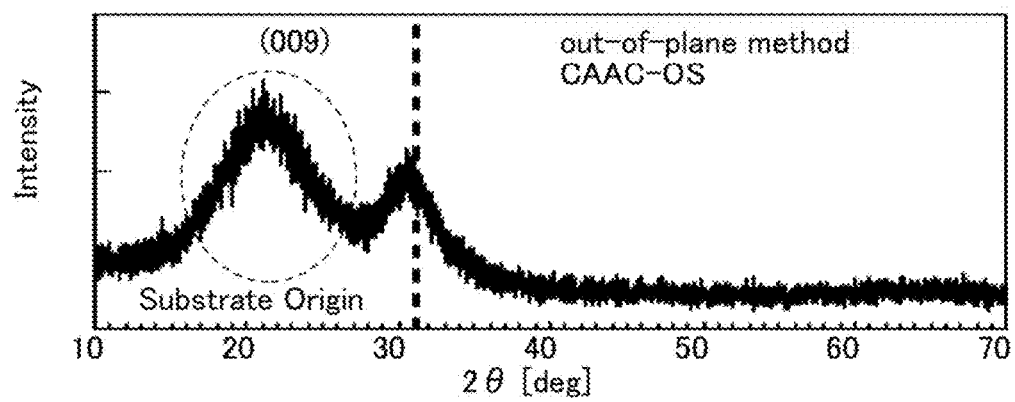
FIG. 45B          FIG. 45C
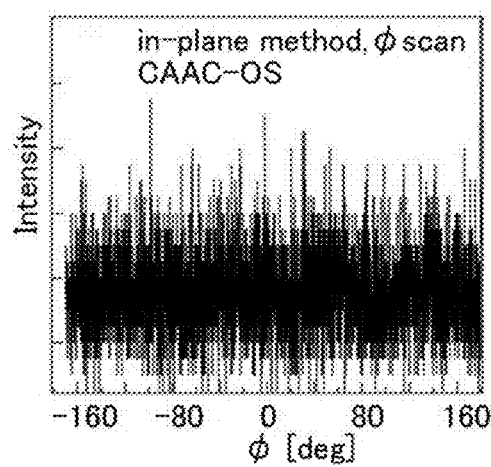   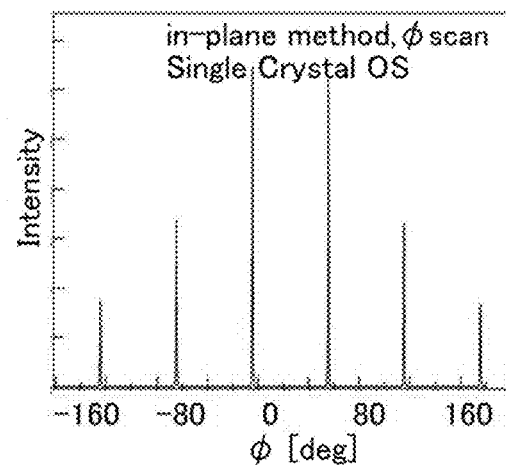
FIG. 45D          FIG. 45E
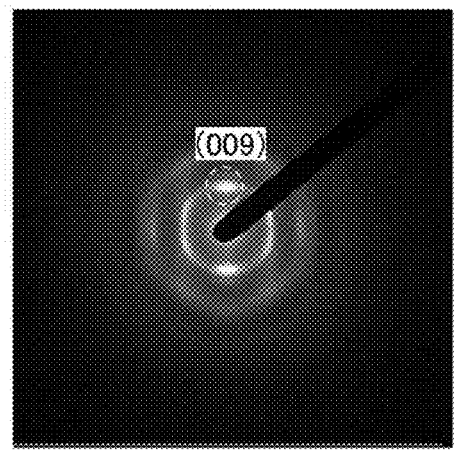   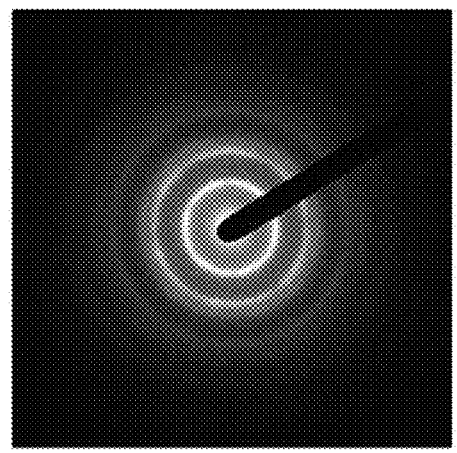

FIG. 48A
FIG. 48B
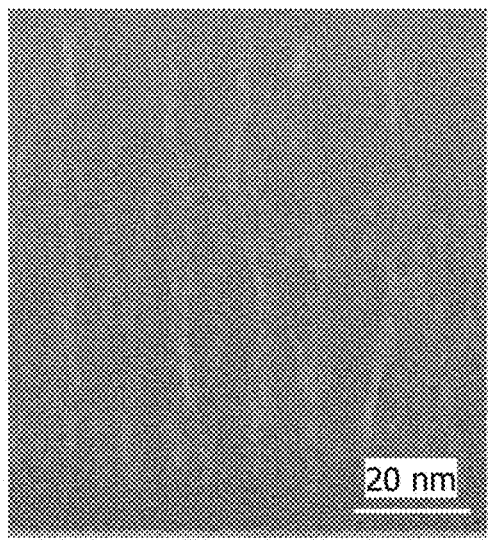
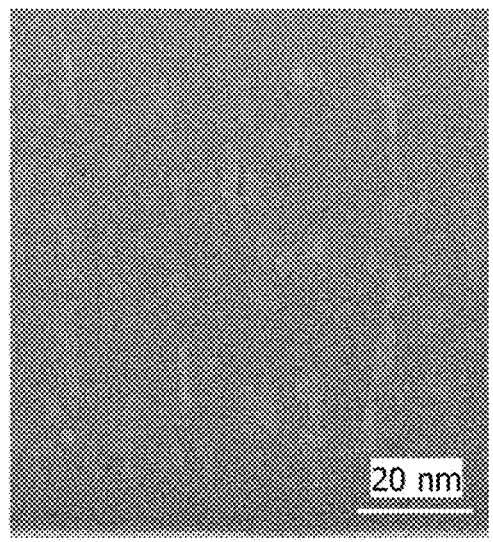

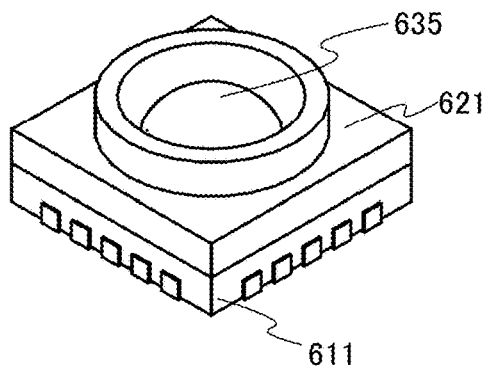
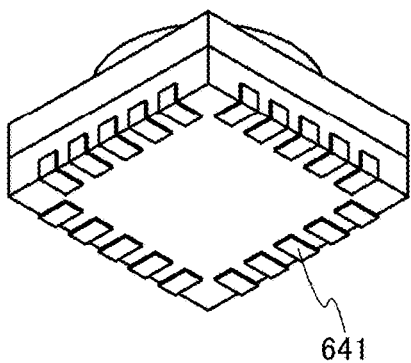
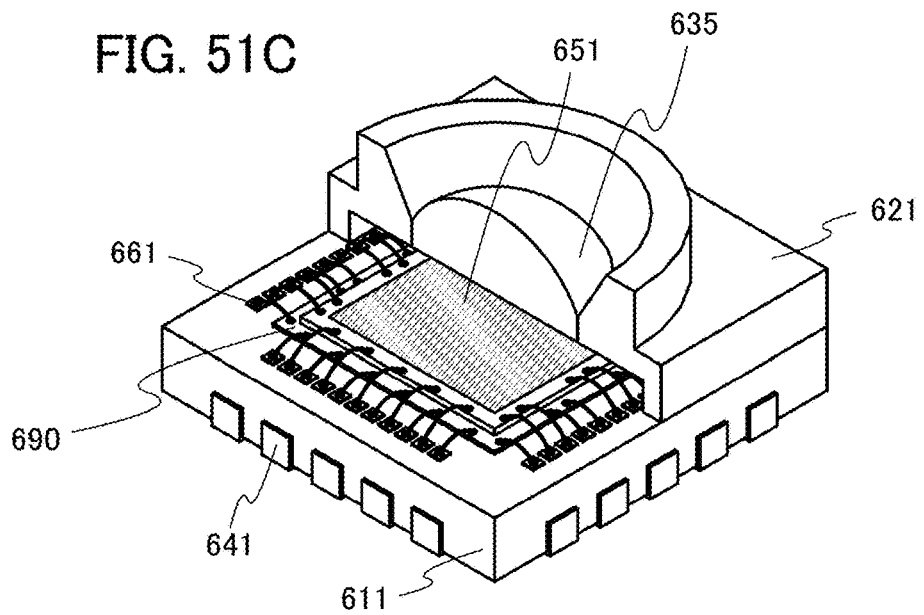
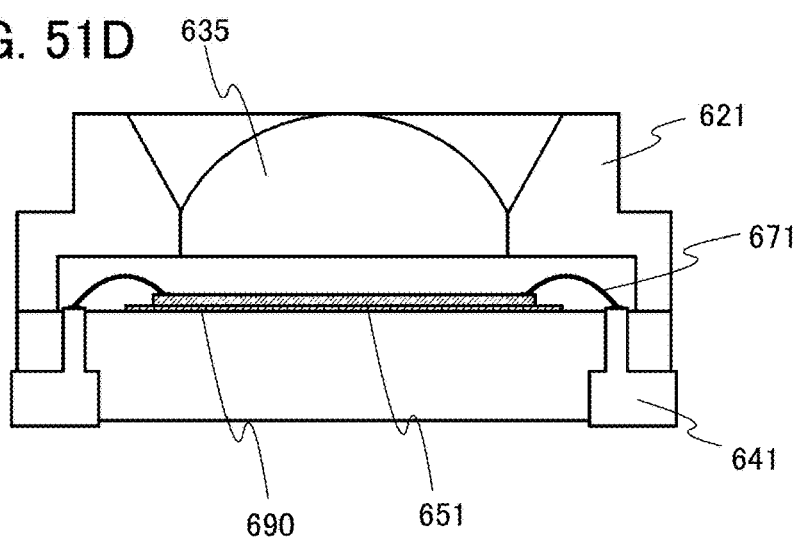

IMAGING DEVICE, METHOD FOR OPERATING THE SAME, MODULE, AND ELECTRONIC DEVICE

BACKGROUND OF THE INVENTION

1. Field of the Invention

One embodiment of the present invention relates to an imaging device and an operation method thereof.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a method for operating any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a storage device, a display device, an imaging device, or an electronic device includes a semiconductor device.

2. Description of the Related Art

As a semiconductor material that can be used for a transistor, an oxide semiconductor has been attracting attention. For example, a technique for forming a transistor using zinc oxide or an In—Ga—Zn-based oxide semiconductor as an oxide semiconductor is disclosed (see Patent Documents 1 and 2).

Patent Document 3 discloses an imaging device in which a transistor including an oxide semiconductor is used in part of a pixel circuit.

Non-Patent Document 1 discloses a technique relating to a complementary metal oxide semiconductor (CMOS) image sensor with one hundred and thirty-three million pixels corresponding to 8K4K imaging.

REFERENCE

Patent Documents

[Patent Document 1] Japanese Published Patent Application No. 2007-123861
[Patent Document 2] Japanese Published Patent Application No. 2007-096055
[Patent Document 3] Japanese Published Patent Application No. 2011-119711

Non-Patent Document

[Non-Patent Document 1] R. Funatsu, et al., 133*M pixel 60 fps CMOS Image Sensor with 32-Column Shared High-Speed Column-Parallel SAR ADCs*, IEEE ISSCC Dig. Tech. Papers, 2015

SUMMARY OF THE INVENTION

As a method for reducing the sizes of pixels included in an imaging device, a method in which transistors are shared by pixels is given.

By imaging with a global shutter system, simultaneousness of imaging in all the pixels in the imaging device can be secured, and an image with little distortion can be easily obtained even when the object moves.

Meanwhile, in the case where transistors are shared by a plurality of pixels in a conventional imaging device, it is difficult to store the obtained imaging data in all the pixels. Accordingly, imaging with a global shutter system is difficult.

An object of one embodiment of the present invention is to provide an imaging device which can perform imaging with a global shutter system even when transistors are shared by pixels. Another object of one embodiment of the present invention is to provide an imaging device which can capture an image with little distortion even when the object moves.

Another object of one embodiment of the present invention is to provide an imaging device which can take a high-resolution image. Another object of one embodiment of the present invention is to provide a small-sized imaging device. Another object of one embodiment of the present invention is to provide an imaging device with reduced power consumption. Another object of one embodiment of the present invention is to provide an imaging device that is suitable for high-speed operation. Another object of one embodiment of the present invention is to provide an imaging device including a transistor with a high on-state current. Another object of one embodiment of the present invention is to provide an imaging device including a transistor with a low off-state current. Another object of one embodiment of the present invention is to provide an imaging device including a transistor to which a high potential can be applied. Another object of one embodiment of the present invention is to provide an imaging device with a large dynamic range. Another object of one embodiment of the present invention is to provide an imaging device with a long retention period for imaging data. Another object of one embodiment of the present invention is to provide an imaging device which can be used at a wide range of temperatures. Another object of one embodiment of the present invention is to provide an imaging device which can obtain imaging data with less noise. Another object of one embodiment of the present invention is to provide an imaging device with high optical sensitivity. Another object of one embodiment of the present invention is to provide an inexpensive imaging device. Another object of one embodiment of the present invention is to provide an imaging device with high reliability.

Alternatively, an object of one embodiment of the present invention is to provide a novel imaging device, a method for operating the novel imaging device, a novel module, a novel electronic device, or the like.

Note that the objects of one embodiment of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention solves at least one of the above objects and the other objects.

One embodiment of the present invention is an imaging device including a first photoelectric conversion element, a second photoelectric conversion element, a first transistor, a second transistor, a third transistor, a fourth transistor, a fifth transistor, and a sixth transistor. Active layers of the first to fifth transistors each include an oxide semiconductor. One of terminals of the first photoelectric conversion element is electrically connected to one of a source and a drain of the first transistor, one of terminals of the second photoelectric conversion element is electrically connected to one of a source and a drain of the second transistor, the other of the source and the drain of the first transistor is electrically connected to one of a source and a drain of the third transistor, the other of the source and the drain of the second transistor is electrically connected to one of a source and a drain of the fourth transistor, the other of the source and the drain of the third transistor is electrically connected to the other of the source and the drain of the fourth transistor, the other of the source and the drain of the fourth transistor is electrically connected to one of a source and a drain of the fifth transistor, the one of the source and the drain of the fifth transistor is electrically connected to a gate of the sixth transistor.

A high potential may be applied to the other of the terminals of the first photoelectric conversion element and the other of the terminals of the second photoelectric conversion element.

The first and second photoelectric conversion elements and the first to sixth transistors may be stacked.

The oxide semiconductor may include In, Zn, and M (M is Al, Ti, Ga, Sn, Y, Zr, La, Ce, Nd, or Hf).

The imaging device may further include a first capacitor and a second capacitor. One of terminals of the first capacitor may be electrically connected to the other of the source and the drain of the first transistor, and one of terminals of the second capacitor may be electrically connected to the other of the source and the drain of the second transistor.

the first photoelectric conversion element and the second photoelectric conversion element each may include a material containing selenium.

Another embodiment of the present invention is module including the imaging device one embodiment of the present invention and a lens.

Another embodiment of the present invention is an electronic device including the imaging device of one embodiment of the present invention and a display device.

According to one embodiment of the present invention, an imaging device which can perform imaging with a global shutter system even when transistors are shared by pixels can be provided. An imaging device which can capture an image with little distortion even when the object moves can be provided.

An imaging device which can take a high-resolution image can be provided. A small-sized imaging device can be provided. An imaging device with reduced power consumption can be provided. An imaging device that is suitable for high-speed operation can be provided. An imaging device including a transistor with a high on-state current can be provided. An imaging device including a transistor with a low off-state current can be provided. An imaging device including a transistor to which a high potential can be applied can be provided. An imaging device with a large dynamic range can be provided. An imaging device with a long retention period for imaging data can be provided. An imaging device which can be used at a wide range of temperatures can be provided. An imaging device which can obtain imaging data with less noise can be provided. An imaging device with high optical sensitivity can be provided. An inexpensive imaging device can be provided. An imaging device with high reliability can be provided.

According to one embodiment of the present invention, a novel imaging device, a method for operating the novel imaging device, a novel module, a novel electronic device, or the like can be provided.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the aforementioned effects in some cases.

BRIEF DESCRIPTION OF THE DRAWINGS

FIG. 4 is a timing chart showing an example of the operation of an imaging device.

FIGS. 33A1, 33A2, 33A3, 33B1, 33B2, and 33B3 illustrate bent imaging devices.

FIGS. 45A to 45E show structural analysis of a CAAC-OS and a single crystal oxide semiconductor by XRD and selected-area electron diffraction patterns of a CAAC-OS.

FIGS. 48A and 48B are cross-sectional TEM images of an a-like OS.

FIGS. 51A to 51D are perspective views and a cross-sectional view of a package including an imaging device.

DETAILED DESCRIPTION OF THE INVENTION

Figure 1:
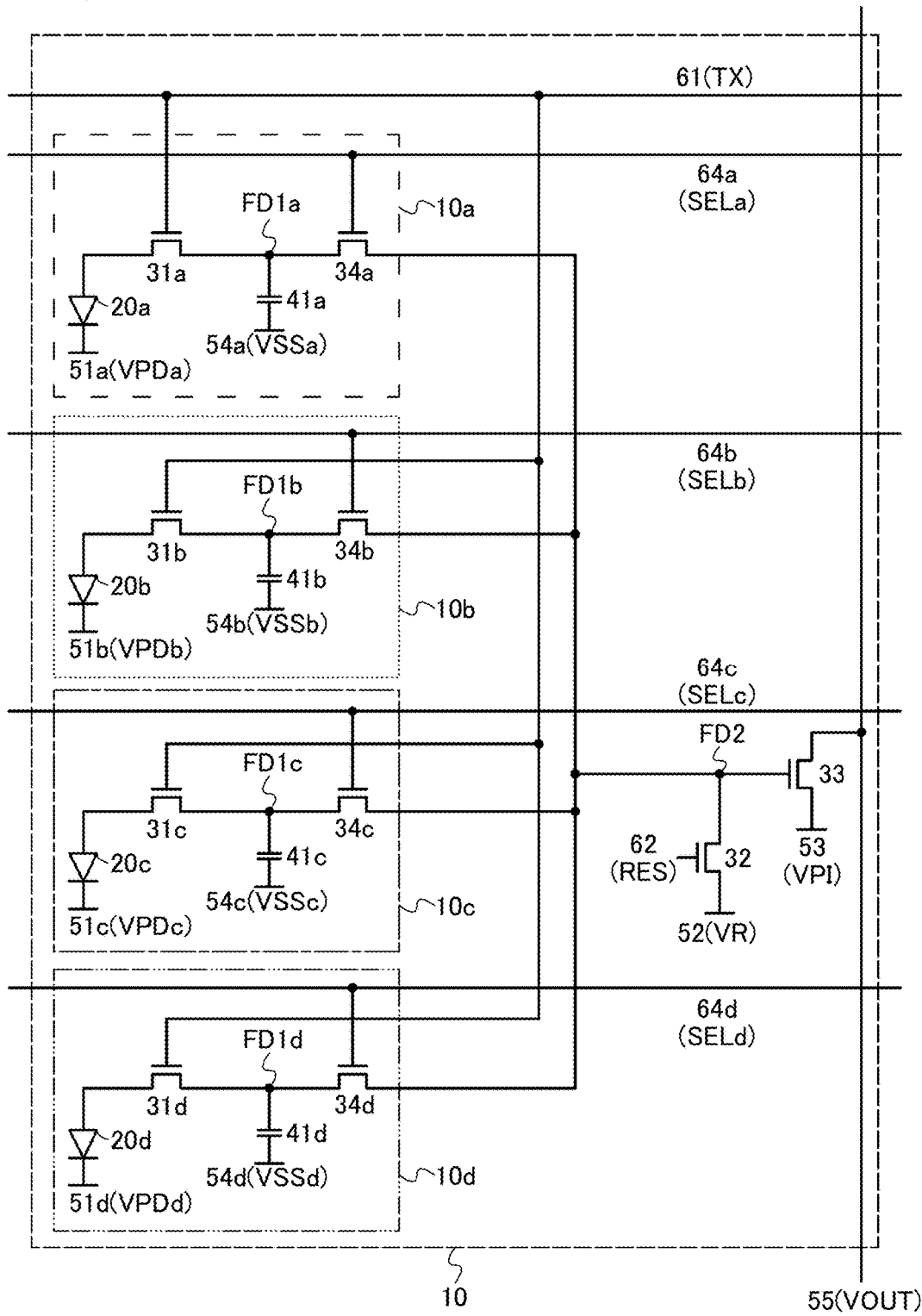
FIG. 1 is a circuit diagram illustrating pixels.

Embodiments are described in detail with reference to drawings. Note that the present invention is not limited to the following description and it is readily appreciated by those skilled in the art that modes and details can be modified in various ways without departing from the spirit and the scope of the present invention. Therefore, the present invention should not be construed as being limited to the description of the embodiments below. Note that in structures of the invention described below, the same portions or portions having similar functions are denoted by the same reference numerals in different drawings, and description thereof is not repeated in some cases. The same components are denoted by different hatching patterns in different drawings, or the hatching patterns are omitted in some cases.

Note that the ordinal numbers such as "first" and "second" in this specification are used for convenience and do not denote the order of steps or the stacking order of layers. Therefore, for example, the term "first" can be replaced with the term "second", "third", or the like as appropriate. In addition, the ordinal numbers in this specification and the like do not correspond to the ordinal numbers which specify one embodiment of the present invention in some cases.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. For example, variations in signal, voltage, or current due to noise or difference in timing can be included.

In this specification and the like, a transistor is an element having at least three terminals: a gate, a drain, and a source. The transistor includes a channel region between the drain (a drain terminal, a drain region, or a drain electrode) and the source (a source terminal, a source region, or a source electrode) and current can flow through the drain, the channel region, and the source.

Since the source and the drain of the transistor change depending on the structure, operating conditions, and the like of the transistor, it is difficult to define which is a source or a drain. Thus, the terms "source" and "drain" can be interchanged with each other depending on the case or circumstances.

In this specification and the like, an explicit description "X and Y are connected" means that X and Y are electrically connected, X and Y are functionally connected, and X and Y are directly connected. Accordingly, without limitation to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive layer, and a layer).

Examples of the case where X and Y are directly connected include the case where an element that enables electrical connection between X and Y (e.g., a switch, a transistor, a capacitor, an inductor, a resistor, a diode, a display element, a light-emitting element, and a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, and a load) can be connected between X and Y. Note that the switch is controlled to be turned on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, in the case where a signal output from X is transmitted to Y even when another circuit is placed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected."

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." Another example of the expression is "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive layer, and a layer).

Even when independent components are electrically connected to each other in a circuit diagram, one component has functions of a plurality of components in some cases. For example, when part of a wiring functions as an electrode, one conductive layer functions as the wiring and the electrode. Thus, "electrical connection" in this specification includes in its category such a case where one conductive layer has functions of a plurality of components.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Note that in general, a potential (voltage) is relative and is determined depending on the amount relative to a certain potential. Therefore, even when the expression "ground", "GND", or the like is used, the potential is not necessarily 0 V. For example, the "ground potential" or "GND" may be defined using the lowest potential in a circuit as a reference. Alternatively, the "ground potential" or "GND" may be defined using an intermediate potential in a circuit as a reference. In those cases, a positive potential and a negative potential are set using the potential as a reference.

Note that in this specification, terms for explaining arrangement, such as "over" and "under," are used for convenience to describe the positional relationship between components with reference to drawings. The positional relationship between components is changed as appropriate in accordance with a direction in which each component is described. Thus, there is no limitation on terms used in this specification, and description can be made appropriately depending on the situation.

Embodiment 1

An imaging device of one embodiment of the present invention is described with reference to drawings. Note that in this specification and the like, an imaging device refers to any device that has an imaging function. The imaging device also indicates a circuit having a function of imaging or an entire system including such a circuit.

One embodiment of the present invention relates to an imaging device which can perform imaging with a global shutter system and in which transistors are shared by a plurality of pixels. As described in Embodiment 3 later, a photoelectric conversion element included in the imaging device of one embodiment of the present invention is stacked over another element, whereby it becomes unnecessary to electrically connect a source or a drain of a transistor having a function of selecting a pixel to a source or a drain of an amplifier transistor. As a result, the number of transistors per pixel can be reduced. In this manner, an imaging device which can capture a high-resolution image with little distortion even when the object moves can be provided.

FIG. 1 shows a circuit diagram of a pixel 10a, a pixel 10b, a pixel 10c, and a pixel 10d of the imaging device that is one embodiment of the present invention.

The pixel 10a includes a photoelectric conversion element 20a, a transistor 31a, a transistor 34a, and a capacitor 41a. The pixel 10b includes a photoelectric conversion element 20b, a transistor 31b, a transistor 34b, and a capacitor 41b. The pixel 10c includes a photoelectric conversion element 20c, a transistor 31c, a transistor 34c, and a capacitor 41c. The pixel 10d includes a photoelectric conversion element 20d, a transistor 31d, a transistor 34d, and a capacitor 41d. The pixels 10a to 10d share a transistor 32 and a transistor 33. Note that the transistors 31a to 31d, the transistor 32, the transistor 33, and the transistors 34a to 34d in FIG. 1 are all n-channel transistors.

In this specification, in some cases, an n-channel transistor is referred to as an n-ch transistor and a p-channel transistor is referred to as a p-ch transistor.

The pixels 10a to 10d may be collectively referred to as a pixel 10.

Although the four pixels, i.e., the pixels 10a to 10d share the transistor 32 and the transistor 33 in FIG. 1, two or three pixels may share them. Alternatively, five or more pixels may share the transistor 32 and the transistor 33. Further alternatively, all the pixels of the same column may share the transistor 32 and the transistor 33.

In the pixel 10 with the configuration shown in FIG. 1, one terminal of the photoelectric conversion element 20a is electrically connected to one of a source and a drain of the transistor 31a. One terminal of the photoelectric conversion element 20b is electrically connected to one of a source and a drain of the transistor 31b. One terminal of the photoelectric conversion element 20c is electrically connected to one of a source and a drain of the transistor 31c. One terminal of the photoelectric conversion element 20d is electrically connected to one of a source and a drain of the transistor 31d.

The other of the source and the drain of the transistor 31a is electrically connected to one of a source and a drain of the transistor 34a and one terminal of the capacitor 41a. The other of the source and the drain of the transistor 31b is electrically connected to one of a source and a drain of the transistor 34b and one terminal of the capacitor 41b. The other of the source and the drain of the transistor 31c is electrically connected to one of a source and a drain of the transistor 34c and one terminal of the capacitor 41c. The other of the source and the drain of the transistor 31d is electrically connected to one of a source and a drain of the transistor 34d and one terminal of the capacitor 41d.

The other of the source and the drain of the transistor 34a, the other of the source and the drain of the transistor 34b, the other of the source and the drain of the transistor 34c, and the other of the source and the drain of the transistor 34d are electrically connected to one of a source and a drain of the transistor 32 and a gate of the transistor 33.

Although details are described later, it is unnecessary to electrically connect a source or a drain of a transistor having a function of selecting the pixel 10 to a source or a drain of the transistor 33. In other words, it is not necessary to provide a transistor having a function of selecting the pixel 10 in the imaging device of one embodiment of the present invention. Accordingly, an area occupied by each pixel in the imaging device of one embodiment of the present invention can be smaller than that in the case where a transistor having a function of selecting the pixel 10 is provided, and a high-resolution image can be obtained.

The other terminal of the photoelectric conversion element 20a is electrically connected to a wiring 51a (VPDa). The other terminal of the photoelectric conversion element 20b is electrically connected to a wiring 51b (VPDb). The other terminal of the photoelectric conversion element 20c is electrically connected to a wiring 51c (VPDc). The other terminal of the photoelectric conversion element 20d is electrically connected to a wiring 51d (VPDd).

The other of the source and the drain of the transistor 32 is electrically connected to a wiring 52 (VR). One of the source and the drain of the transistor 33 is electrically connected to a wiring 53 (VPI). The other of the source and the drain of the transistor 33 is electrically connected to a wiring 55 (VOUT).

The other terminal of the capacitor 41a is electrically connected to a wiring 54a (VSSa). The other terminal of the capacitor 41b is electrically connected to a wiring 54b (VSSb). The other terminal of the capacitor 41c is electrically connected to a wiring 54c (VSSc). The other terminal of the capacitor 41d is electrically connected to a wiring 54d (VSSd).

A gate of the transistor 31a, a gate of the transistor 31b, a gate of the transistor 31c, and a gate of the transistor 31d are electrically connected to a wiring 61 (TX). A gate of the transistor 32 is electrically connected to a wiring 62 (RES).

A gate of the transistor 34a is electrically connected to a wiring 64a (SELa). A gate of the transistor 34b is electrically connected to a wiring 64b (SELb). A gate of the transistor 34c is electrically connected to a wiring 64c (SELc). A gate of the transistor 34d is electrically connected to a wiring 64d (SELd).

Here, the wirings 51a (VPDa) to 51d (VPDd), the wiring 52 (VR), the wiring 53 (VPI), and the wirings 54a (VSSa) to 54d (VSSd) can function as power supply lines. The wiring 61 (TX), the wiring 62 (RES), and the wirings 64a (SELa) to 64d (SELd) can function as signal lines.

In the above-described configuration, a node to which the other of the source and the drain of the transistor 31a, the one of the source and the drain of the transistor 34a, and the one terminal of the capacitor 41a are connected is denoted by FD1a. A node to which the other of the source and the drain of the transistor 31b, the one of the source and the drain of the transistor 34b, and the one terminal of the capacitor 41b are connected is denoted by FD1b. A node to which the other of the source and the drain of the transistor 31c, the one of the source and the drain of the transistor 34c, and the one terminal of the capacitor 41c are connected is denoted by FD1c. A node to which the other of the source and the drain of the transistor 31d, the one of the source and the drain of the transistor 34d, and the one terminal of the capacitor 41d are connected is denoted by FD1d.

A node to which the one of the source and the drain of the transistor 32, the gate of the transistor 33, the other of the source and the drain of the transistor 34a, the other of the source and the drain of the transistor 34b, the other of the source and the drain of the transistor 34c, and the other of the source and the drain of the transistor 34d are connected is denoted by FD2. Note that the potential of the node FD2 is equivalent to the gate potential of the transistor 33.

In the pixel 10, the photoelectric conversion elements 20a, 20b, 20c, and 20d are light-receiving elements and respectively have functions of generating currents in response to lights with which the pixels 10a, 10b, 10c, and 10d are irradiated. The transistor 31a has a function of controlling accumulation/release of charge to/from the node FD1a by the photoelectric conversion element 20a, the transistor 31b has a function of controlling accumulation/release of charge to/from the node FD1b by the photoelectric conversion element 20b, the transistor 31c has a function of controlling accumulation/release of charge to/from the node FD1c by the photoelectric conversion element 20c, and the transistor 31d has a function of controlling accumulation/release of charge to/from the node FD1d by the photoelectric conversion element 20d.

The transistor 32 functions as a reset transistor configured to reset the potentials of the nodes FD1a to FD1d and the potential of the node FD2. The transistor 33 functions as an amplifier transistor configured to output a signal based on the potential of the node FD2. The transistors 34a, 34b, 34c, and 34d respectively have functions of selecting the pixels 10a, 10b, 10c, and 10d. In addition, the transistors 34a, 34b, 34c, and 34d each have a function of selecting a pixel in which reset is executed in a reset operation.

Imaging data obtained by the pixel 10 can be output as a signal through the wiring 55 (VOUT).

The transistors 31a to 31d, the transistor 32, the transistor 33, and the transistors 34a to 34d in the pixel 10 with the configuration shown in FIG. 1 may be each a transistor whose active layer or active region is formed using an oxide semiconductor (hereinafter referred to as an OS transistor). One of features of an OS transistor is an extremely low off-state current.

Unless otherwise specified, the off-state current in this specification refers to a drain current of a transistor in the off state (also referred to as non-conduction state or cutoff state). Unless otherwise specified, the off state of an n-channel transistor means that the voltage between its gate and source ($V_{gs}$: gate-source voltage) is lower than the threshold voltage $V_{th}$, and the off state of a p-channel transistor means that the gate-source voltage $V_{gs}$ is higher than the threshold voltage Vth. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. Thus, the off-state current of a transistor is lower than or equal to a current I means that there is a voltage $V_{gs}$ with which the off-state current of the transistor becomes lower than or equal to the current I in some cases. Furthermore, the off-state current of a transistor means the off-state current in an off state at predetermined voltage $V_{gs}$, the off-state current in an off state at a voltage $V_{gs}$ in a predetermined range, the off-state current in an off state at a voltage $V_{gs}$ with which sufficiently reduced off-state current is obtained, or the like, in some cases.

As an example, the assumption is made of an n-channel transistor where the threshold voltage $V_{th}$ is 0.5 V and the drain current is $1\times10^{-9}$ A at a voltage $V_{gs}$ of 0.5 V, $1\times10^{-13}$ A at a voltage $V_{gs}$ of 0.1 V, $1\times10^{-19}$ A at a voltage $V_{gs}$ of -0.5 V, and $1\times10^{-22}$ A at a voltage $V_{gs}$ of -0.8 V. The drain current of the transistor is $1\times10^{-19}$ A or lower at a voltage $V_{gs}$ of -0.5 V or at a voltage $V_{gs}$ in the range of -0.8 V to -0.5 V; therefore, the off-state current of the transistor is $1\times10^{-19}$ A or lower in some cases. Since there is a voltage $V_{gs}$ at which the drain current of the transistor is $1\times10^{-22}$ A or lower, the off-state current of the transistor is $1\times10^{-22}$ A or lower in some cases.

In this specification, the off-state current of a transistor with a channel width W is sometimes represented by a current value per channel width or by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability required in a semiconductor device or the like including the transistor is ensured or a temperature at which the semiconductor device or the like including the transistor is used (e.g., temperature in the range of 5° C. to 35° C.). The description "an off-state current of a transistor is lower than or equal to a current I" may refer to a situation where there is a voltage $V_{gs}$ at which the off-state current of the transistor is lower than or equal to the current I at room temperature, 60° C., 85° C., 95° C., 125° C., a temperature at which the reliability of a semiconductor device or the like including the transistor is ensured, or a temperature at which the semiconductor device or the like including the transistor is used (e.g., temperature in the range of 5° C. to 35° C.).

The off-state current of a transistor depends on a voltage $V_{ds}$ between its drain and source in some cases. Unless otherwise specified, the off-state current in this specification may be an off-state current at a voltage $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at a voltage $V_{ds}$ at which the reliability of a semiconductor device or the like including the transistor is ensured or at a voltage $V_{ds}$ used in the semiconductor device or the like. The description "an off-state current of a transistor is lower than or equal to a current I" may mean that there is $V_{gs}$ at which the off-state current of the transistor is lower than or equal to the current I at a voltage $V_{ds}$ of 0.1 V, 0.8 V, 1 V, 1.2 V, 1.8 V, 2.5 V, 3 V, 3.3 V, 10 V, 12 V, 16 V, or 20 V, at a voltage $V_{ds}$ at which the reliability of a semiconductor device or the like including the transistor is ensured, or at a voltage $V_{ds}$ at which in the semiconductor device or the like including the transistor is used.

In this specification, the term "leakage current" sometimes expresses the same meaning as an off-state current.

In this specification, an off-state current sometimes refers to a current that flows between a source and a drain when a transistor is off, for example.

Since the OS transistor has an extremely low off-state current, a period during which charge can be retained in each of the nodes FD1a to FD1d can be extremely long. Therefore, the imaging device including the pixel 10 with the configuration shown in FIG. 1 can employ a global shutter system, in which all the pixels obtain imaging data simultaneously.

Figure 2A:
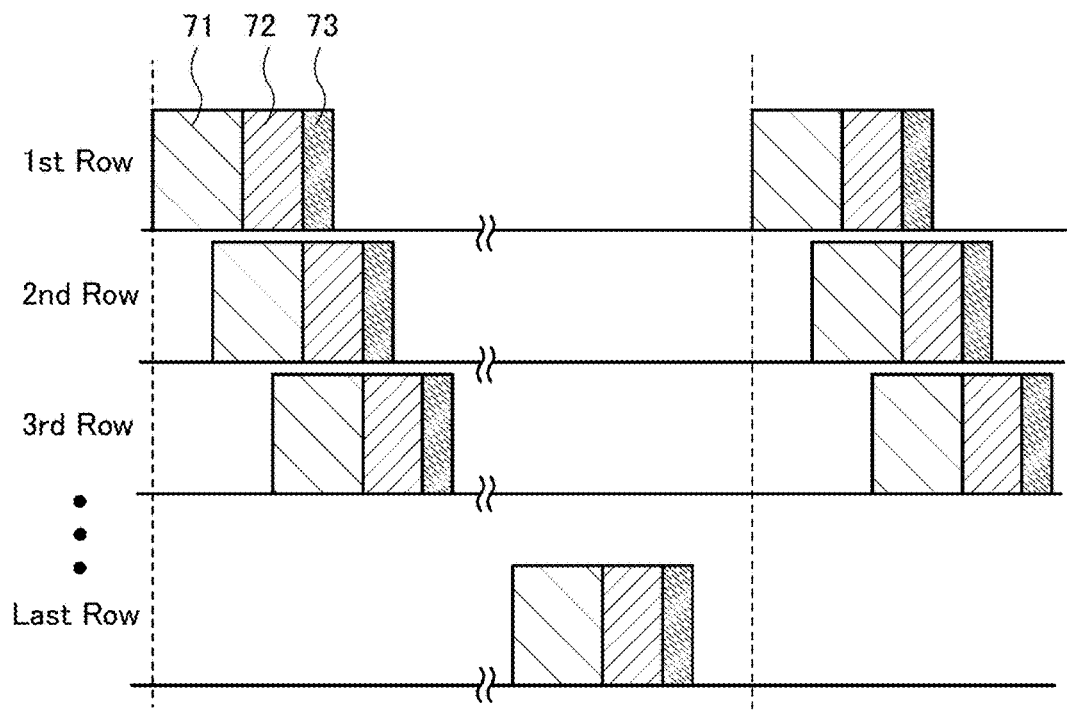
FIGS. 2A and 2B show operations of a rolling shutter system and a global shutter system, respectively.
Figure 2B:
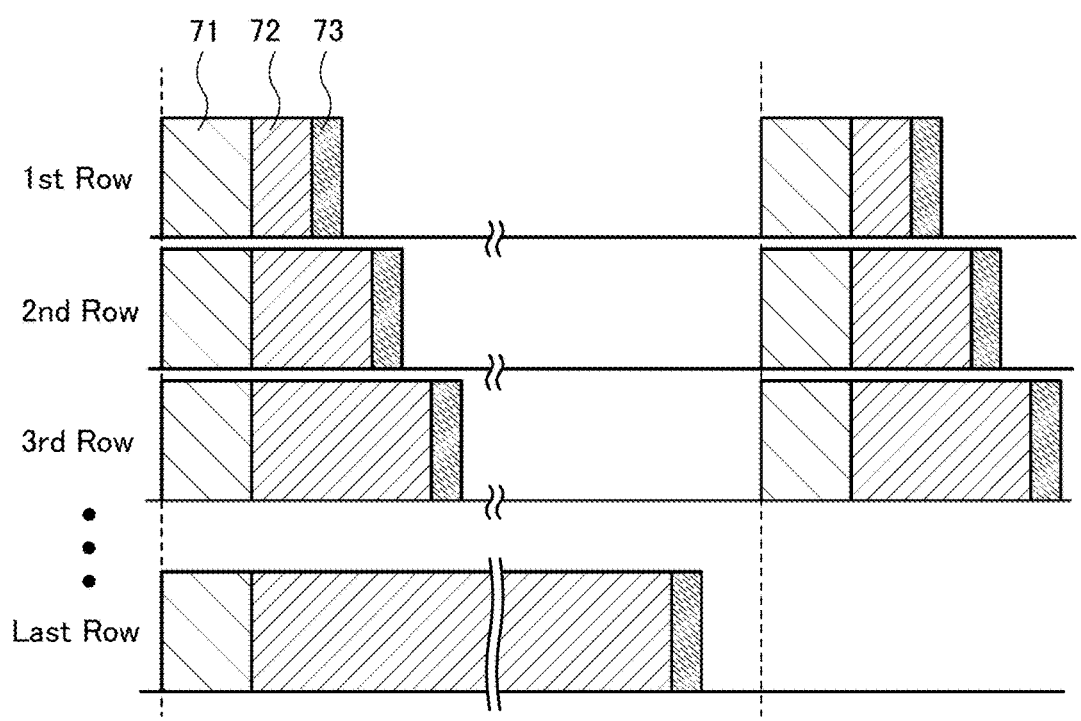

In general, in an imaging device where pixels are arranged in a matrix, a rolling shutter system is employed in which an imaging operation 71, a retention operation 72, and a read operation 73 are performed row by row as illustrated in FIG. 2A. In the case of employing the rolling shutter system, simultaneousness of imaging is lost. Therefore, when an object moves, an image is distorted. For this reason, it is preferable to employ a global shutter system in which the imaging operation 71 can be performed simultaneously in all the rows and the read operation 73 can be sequentially performed row by row as illustrated in FIG. 2B. By employing the global shutter system, simultaneousness of imaging in all the pixels in the imaging device can be secured, and an image with little distortion can be easily obtained even when an object moves.

The use of the OS transistors in the pixel 10 can broaden the dynamic range of imaging. For example, in the case of imaging performed by the pixel 10 with the configuration shown in FIG. 1, although details are described later, the potentials of the nodes FD1a to FD1d are low when the illuminance of light with which the pixel 10 is irradiated is low. Accordingly, the potential of the node FD2 is also low. In that case, if a transistor with a high off-state current is used as each of the transistors that are electrically connected to the nodes FD1a to FD1d, the potential of each of the nodes changes in a data retention period to also change the potential of the node FD2. Accordingly, imaging data obtained by an imaging operation cannot be output correctly. Meanwhile, since the OS transistor has extremely low off-state current, a current based on a gate potential can be accurately output even when the potential of the node FD2 (gate potential of the transistor 33) is extremely low. Thus, it is possible to widen the detection range of illuminance, i.e., the dynamic range.

In addition, the OS transistor has lower temperature dependence of change in electrical characteristics than a transistor whose active layer or active region contains silicon (hereinafter, such a transistor is referred to as a Si transistor), and thus can be used in an extremely wide range of temperatures. Therefore, an imaging device and a semiconductor device which include the OS transistors are suitable for use in automobiles, aircrafts, and spacecrafts.

The transistors connected to the nodes FD1a to FD1d need to have less noise. The channel of a transistor including two or three oxide semiconductor layers to be described later is a buried channel, which has significantly high resistance to noise. Thus, the use of the transistor leads to an image with low noise.

When the transistors 31a to 31d, the transistor 32, the transistor 33, and the transistors 34a to 34d are OS transistors, the pixel can be formed with photoelectric conversion elements using silicon and OS transistors. Such a configuration facilitates an increase in the effective area of the photoelectric conversion element because a Si transistor need not be formed in the pixel. Thus, the optical sensitivity can be improved.

Alternatively, for example, the transistors 31a to 31d, the transistor 32, and the transistors 34a to 34d may be OS transistors and the transistor 33 may be an Si transistor. Further alternatively, for example, the transistors 31a to 31d and the transistors 34a to 34d may be OS transistors, and the transistors 32 and 33 may be Si transistors.

The Si transistor has a characteristic of excellent field-effect mobility as compared to the OS transistor. Therefore, the amount of current flowing in a transistor functioning as an amplifier transistor can be increased. For example, in FIG. 1, the value of a current flowing in the transistor 33 can be increased depending on charges accumulated in the nodes FD1a to FD1d.

Figure 3A:
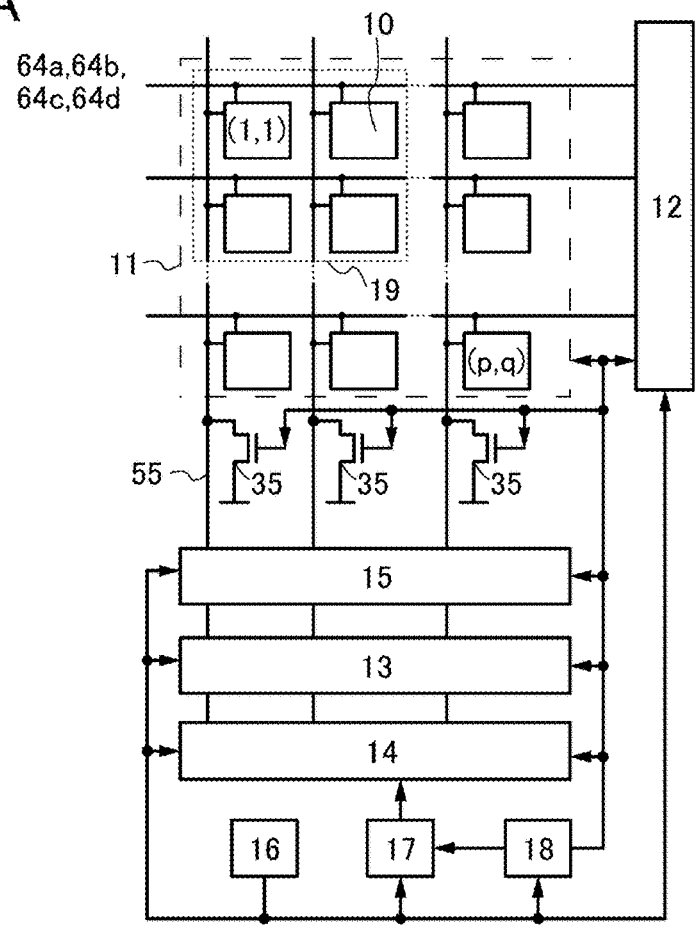
FIGS. 3A and 3B are block diagrams illustrating an imaging device.

FIG. 3A is a block diagram showing the configuration of the imaging device of one embodiment of the present invention. The imaging device includes the pixels 10, transistors 35, a circuit 12, a circuit 13, a circuit 14, a circuit 15, a circuit 16, a circuit 17, and a circuit 18.

The pixels 10 are arranged in a matrix with p rows and q columns (p and q are each a natural number) to form a pixel array 11. One transistor 35 is provided for each column of the pixel array 11.

Note that the layout of circuit blocks in a block diagram in a drawing specifies the positional relation for description. Thus, even when a drawing shows that different functions are achieved in different circuit blocks, an actual circuit block may be configured so that the different functions are achieved in the same circuit block. The functions of circuit blocks in diagrams are specified for description, and even in the case where one circuit block is illustrated, blocks might be provided in an actual circuit block so that processing performed by one circuit block is performed by a plurality of circuit blocks.

The pixels 10 are electrically connected to the circuit 12 via the wirings 64a (SELa) to 64d (SELd). In addition, the pixels 10 are each electrically connected to a source or a drain of the transistor 35, the circuit 13, the circuit 14, and the circuit 15 via the wiring 55 (VOUT). The circuit 16 is electrically connected to the circuit 12, the circuit 13, the circuit 14, the circuit 15, the circuit 17, and the circuit 18. The circuit 17 is electrically connected to the circuit 14. The circuit 18 is electrically connected to the pixels 10, the circuit 12, the circuit 13, the circuit 14, the circuit 15, and the circuit 17.

The transistors 35 function as constant current power supply sources that keep current flowing in the wirings 55 (VOUT) constant. Although the transistors 35 in FIG. 3A are n-ch transistors, they may be p-ch transistors. Furthermore, the transistors 35 each may have a back gate.

The circuit 12 functions as a row driver for selecting a row of the pixel array 11. The circuit 13 functions as a column driver for selecting a column of the pixel array 11. Note that a variety of circuits, such as a decoder and a shift register, are used for the circuit 12 and the circuit 13.

The circuit 14 functions as an A/D conversion circuit. Although details are described later, the circuit 15 functions as a correlated double sampling (CDS) circuit that removes noise included in imaging data that have been read out, for example.

The circuit 16 functions as a logic control circuit. In addition, the circuit 16 has a function of generating clock signals for synchronizing the circuits 12 to 15, the circuit 17, and the circuit 18. The circuit 17 functions as a slope generation circuit for supplying a slope signal to the circuit 14. Note that the range of a slope can be controlled by the circuit 16.

The circuit 18 functions as a power supply circuit which controls a potential applied to each wiring by supplying power to the pixels 10, the circuits 12 to 15, and the circuit 17. For example, the circuit 18 has a function of controlling a bias potential of a comparator included in the circuit 14 and a bias potential of the transistor 35. In addition, for example, the circuit 18 has a function of controlling the potentials of the wirings 51*a* (VPDa) to 51*d* (VPDd), the wiring 52 (VR), the wiring 53 (VPI), and the wirings 54*a* (VSSa) to 54*d* (VSSd) included in the pixels 10.

Note that the transistors 35 may be OS transistors and peripheral circuits such as the circuits 12 to 18 may be formed using OS transistors. When the peripheral circuits are formed using only OS transistors and all the transistors included in the pixels 10 are OS transistors, a process for forming a Si transistor is unnecessary, which effectively reduces the cost of the imaging device. A configuration in which the peripheral circuits are composed only of OS transistors and p-ch Si transistors requires no process of forming an n-ch Si transistor, and thus is effective in reducing cost of the imaging device. Furthermore, since the peripheral circuits can be CMOS circuits, such a configuration is effective in reducing the power consumption of the peripheral circuits, that is, reducing the power consumption of the imaging device.

Figure 3B:
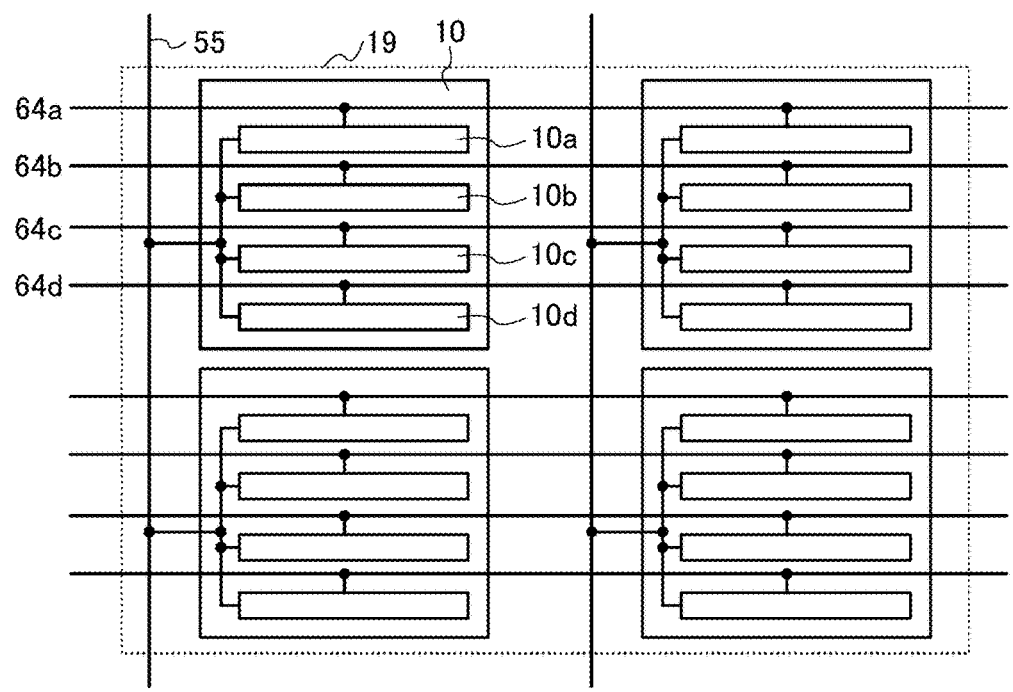

FIG. 3B illustrates an enlarged view of a region 19 shown in FIG. 3A. The region 19 includes the pixels 10 of two rows and two columns. As described above, each of the pixels 10 includes four pixels, the pixels 10*a* to 10*d*.

The wiring 55 (VOUT) can be provided for each column of the pixel array 11. Note that all the pixels 10*a* to 10*d* which are included in the pixels 10 arranged in the same column can be electrically connected to one another via one wiring 55.

The wirings 64*a* (SELa) to 64*d* (SELd) can be provided for individual rows of the pixel arrays 11.

Although the pixel 10 includes the four pixels, the pixels 10*a* to 10*d* in FIG. 3B, it may include only two or three pixels, or five or more pixels. Alternatively, one pixel 10 may serve as pixels of one column.

Next, an example of the operation of the pixel 10 with the configuration shown in FIG. 1 is described in detail using a timing chart shown in FIG. 4. The timing chart shows the potentials of the wiring 61 (TX), the wiring 62 (RES), the wirings 64*a* (SELa) to 64*d* (SELd), the nodes FD1*a* to FD1*d*, and the node FD2.

Note that in the case where the pixel 10 operates in accordance with the timing chart shown in FIG. 4, the potentials of the wirings 51*a* (VPDa) to 51*d* (VPDd) and the wiring 53 (VPI) are set to an H level, and the potentials of the wiring 52 (VR) and the wirings 54*a* (VSSa) to 54*d* (VSSd) are set to an L level.

In this specification, the H level and the L level refer to a high potential and a low potential, respectively. The L level can be a ground potential, for example.

A VPD refers to one of a potential VPDa of the wiring 51*a* (VPDa), a potential VPDb of the wiring 51*b* (VPDb), a potential VPDc of the wiring 51*c* (VPDc), and a potential VPDd of the wiring 51*d* (VPDd).

At Time T01, the potentials of the wiring 61 (TX), the wiring 62 (RES), and the wirings 64*a* (SELa) to 64*d* (SELd) are set to an H level to turn on the transistors 31*a* to 31*d*, the transistor 32, and the transistors 34*a* to 34*d*. Thus, the potentials of the nodes FD1*a* to FD1*d* and the node FD2 are reset to a potential VR that is the potential of the wiring 52 (VR).

At Time T02, the potentials of the wiring 62 (RES) and the wirings 64*a* (SELa) to 64*d* (SELd) are set to an L level to turn off the transistor 32 and the transistors 34*a* to 34*d*. Accordingly, the potentials of the nodes FD1*a* to FD1*d* begin to increase. As the illuminances of lights with which the pixels 10*a*, 10*b*, 10*c*, and 10*d* are irradiated are increased, increases in the potentials of the nodes FD1*a*, FD1*b*, FD1*c*, and FD1*d* become large, respectively.

At Time T03, the potential of the wiring 61 (TX) is set at an L level, whereby the transistors 31*a* to 31*d* are turned off. Accordingly, the potentials of the nodes FD1*a* to FD1*d* are retained.

In this manner, in a period from Time T02 to Time T03, imaging data can be obtained in the pixels 10*a* to 10*d* included in the pixel 10 simultaneously. Note that the operations in a period from Time T01 to Time T03 are concurrently performed in all the pixels 10 included in the imaging device of one embodiment of the present invention. In this manner, imaging data can be obtained with a global shutter system.

At Time T04, the potential of the wiring 64*a* (SELa) is set to an H level to turn on the transistor 34*a*. Thus, the potential of the node FD2 becomes equivalent to the potential of the node FD1*a*. In addition, a signal based on the potential of the node FD2 is output from the wiring 55 (VOUT). Note that the signal corresponds to the imaging data obtained by the pixel 10*a* in the period from Time T01 to Time T03. Note that the higher the potential of the node FD2 is, the higher the potential of the signal output from the wiring 55 (VOUT) becomes. In other words, the higher the illuminance of light with which the pixel 10*a* is irradiated is, the higher the potential of the signal output from the wiring 55 (VOUT) becomes.

At Time T05, the potential of the wiring 62 (RES) is set to an H level to turn on the transistor 32. Accordingly, the potentials of the nodes FD1*a* and FD2 are reset to the potential VR that is the potential of the wiring 52 (VR). In addition, a signal based on the potential is output from the wiring 55 (VOUT).

At Time T06, the potentials of the wiring 62 (RES) and the wiring 64*a* (SELa) are set to an L level to turn off the transistor 32 and the transistor 34*a*.

At Time T07, the potential of the wiring 64*b* (SELb) is set to an H level to turn on the transistor 34*b*. Accordingly, the potential of the node FD2 becomes equivalent to the potential of the node FD1*b*. In addition, a signal based on the imaging data obtained by the pixel 10*b* in the period from Time T01 to Time T03 is output from the wiring 55 (VOUT).

At Time T08, the potential of the wiring 62 (RES) is set to an H level to turn on the transistor 32. Accordingly, the potentials of the nodes FD1*b* and FD2 are reset to the potential VR that is the potential of the wiring 52 (VR). In addition, a signal based on the potential is output from the wiring 55 (VOUT).

At Time T09, the potentials of the wiring 62 (RES) and the wiring 64*b* (SELb) are set to an L level to turn off the transistor 32 and the transistor 34*b*.

At Time T10, the potential of the wiring 64*c* (SELc) is set to an H level to turn on the transistor 34*c*. Accordingly, the potential of the node FD2 becomes equivalent to the potential of the node FD1*c*. In addition, a signal based on the imaging data obtained by the pixel 10*c* in the period from Time T01 to Time T03 is output from the wiring 55 (VOUT).

At Time T11, the potential of the wiring 62 (RES) is set to an H level to turn on the transistor 32. Accordingly, the potentials of the nodes FD1*c* and FD2 are reset to the potential VR that is the potential of the wiring 52 (VR). In addition, a signal based on the potential is output from the wiring 55 (VOUT).

At Time T12, the potentials of the wiring 62 (RES) and the wiring 64*c* (SELc) are set to an L level to turn off the transistor 32 and the transistor 34*c*.

At Time T13, the potential of the wiring 64*d* (SELd) is set to an H level to turn on the transistor 34*d*. Accordingly, the potential of the node FD2 becomes equivalent to the potential of the node FD1*d*. In addition, a signal based on the imaging data obtained by the pixel 10*d* in the period from Time T01 to Time T03 is output from the wiring 55 (VOUT).

At Time T14, the potential of the wiring 62 (RES) is set to an H level to turn on the transistor 32. Accordingly, the potentials of the nodes FD1*d* and FD2 are reset to the potential VR that is the potential of the wiring 52 (VR). In addition, a signal based on the potential is output from the wiring 55 (VOUT).

At Time T15, the potentials of the wiring 62 (RES) and the wiring 64*d* (SELd) are set to an L level to turn off the transistor 32 and the transistor 34*d*

Note that the pixels 10 of one row perform the operations of the period from Time T04 to Time T15 concurrently. The operations of the period from Time T04 to Time T15 in the pixels 10 of one row are not performed at the same time as those in the pixels 10 of another or other rows. In other words, reading of the imaging data is performed on the pixels 10 row by row.

Note that even in the case where the illuminance of irradiation light is the same in all of the pixels 10, the potential of the signal output from the wiring 55 (VOUT) may vary between the pixels at the time of reading imaging data, because of noise caused by variation in characteristics of the photoelectric conversion elements, the transistors, and the capacitors in the pixels 10, or other factors. In that case, there is a possibility that the imaging data cannot be output correctly. Thus, after imaging data that have been obtained by the pixels 10*a* to 10*d* are read out in the periods from Time T04 to Time T05, from Time T07 to Time T08, from Time T10 to Time T11, and from Time T13 to Time T14, imaging data at the time of reset are read out in the periods from Time T05 to Time T06, from Time T08 to Time T09, from Time T11 to Time T12, and from Time T14 to Time T15. After the imaging data at the time of reset are read out, a differential signal between the imaging data obtained by the pixels 10*a* to 10*d* and the imaging data at the time of reset is obtained by the circuit 15 in FIG. 3A which is connected to the outside of the pixels 10. In this manner, the imaging data obtained by the pixels 10*a* to 10*d* are corrected to obtain accurate imaging data.

Note that in the case where imaging data are obtained by the pixels 10*a* to 10*d* again after the imaging data obtained by the pixels 10*a* to 10*d* are read out, a reset operation for the nodes FD1*a* to FD1*d* and the node FD2 can be omitted when the potentials of the nodes FD1*a* to FD1*d* and the node FD2 are reset (set to the potential VR). That is, after the operation at Time T15 is executed, the operation at Time T01 may be omitted and the potential of the wiring 61 (TX) may be set to an H level so that the transistors 31*a* to 31*d* can be turned on and the imaging data can be obtained by the pixels 10*a* to 10*d*.

Note that at Time T05, the potential of the wiring 64*a* (SELa) may be set to an L level to turn off the transistor 34*a*. At Time T08, the potential of the wiring 64*b* (SELb) may be set to an L level to turn off the transistor 34*b*. At Time T11, the potential of the wiring 64*c* (SELc) may be set to an L level to turn off the transistor 34*c*. At Time T14, the potential of the wiring 64*d* (SELd) may be set to an L level to turn off the transistor 34*d*.

As described above, the imaging device of one embodiment of the present invention can perform imaging with a global shutter system even when transistors are shared by a plurality of pixels. Accordingly, imaging with a global shutter system can be achieved while an area occupied by each pixel is reduced. That is, a high-resolution image with little distortion can be captured even when the object moves.

In addition, the potentials of the wirings 51*a* (VPDa) to 51*d* (VPDd) are set to an H level, whereby the potential of the node FD2 at the time of reset can be set to an L level. In addition, the potential of the node FD2 can be increased to a potential corresponding to the obtained imaging data at the time of reading the imaging data. Accordingly, it becomes unnecessary to electrically connect the source or drain of the transistor having a function of selecting the pixel 10 to the source or the drain of the transistor 33, as described above. That is, it is unnecessary to provide a transistor having a function of selecting the pixel 10 in the imaging device of one embodiment of the present invention. Thus, the area occupied by each pixel in the imaging device of one embodiment of the present invention can be smaller than that in an imaging device provided with a transistor having a function of selecting the pixel 10; as a result, a high-resolution image can be captured.

Figure 5:
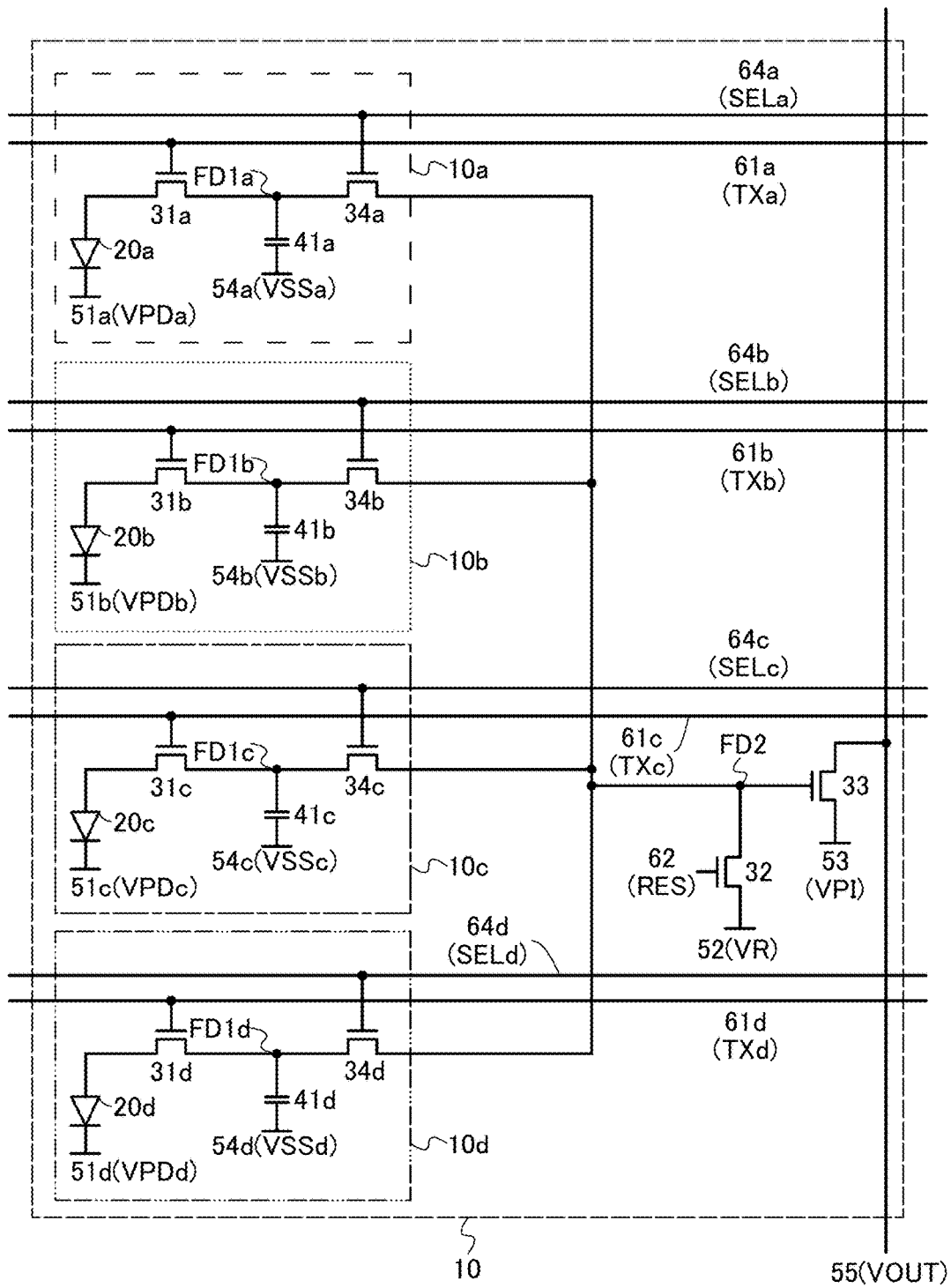
FIG. 5 is a circuit diagram illustrating pixels.

Although one wiring 61 (TX) connects the gates of the transistors 31*a* to 31*d* in the pixel 10 with the configuration shown in FIG. 1, individual wirings may be provided for the transistors 31*a* to 31*d* as shown in FIG. 5. In FIG. 5, a wiring 61*a* (TXa) is electrically connected to the gate of the transistor 31*a*. A wiring 61*b* (TXb) is electrically connected to the gate of the transistor 31*b*. A wiring 61*c* (TXc) is electrically connected to the gate of the transistor 31*c*. A wiring 61*d* (TXd) is electrically connected to the gate of the transistor 31*d*.

Figure 6:
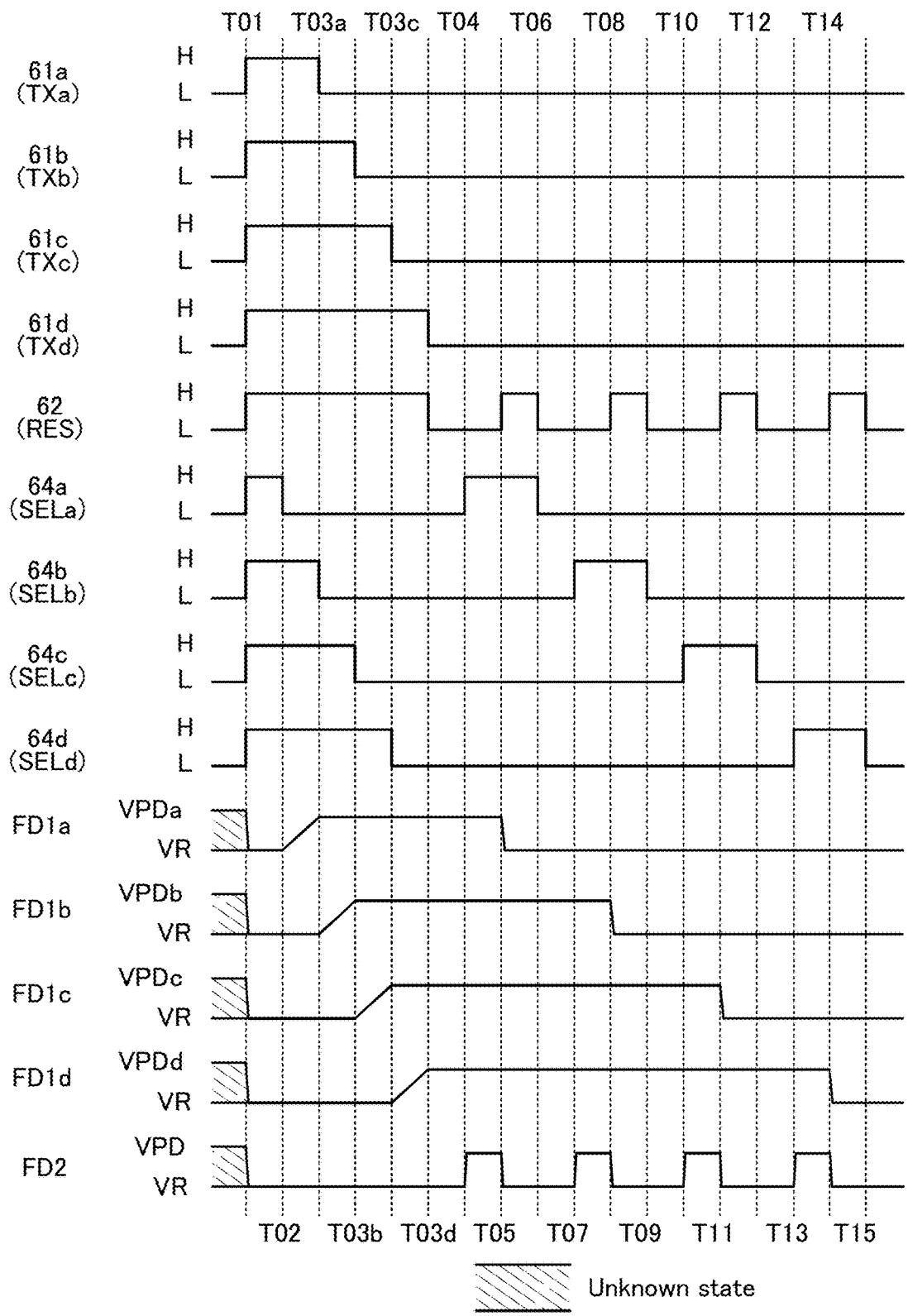
FIG. 6 is a timing chart showing an example of the operation of an imaging device.

An example of the operation of the pixel 10 with the configuration shown in FIG. 5 is described using a timing chart shown in FIG. 6. The operation shown in FIG. 6 enables the imaging device including the pixel 10 with the configuration shown in FIG. 5 to function as a high-speed camera.

FIG. 6 shows the potentials of the wiring 61*a* (TXa), the wiring 61*b* (TXb), the wiring 61*c* (TXc), the wiring 61*d* (TXd), the wiring 62 (RES), the wirings 64*a* (SELa) to 64*d* (SELd), the nodes FD1*a* to FD1*d*, and the node FD2.

Note that as in the timing chart shown in FIG. 4, the potentials of the wirings 51*a* (VPDa) to 51*d* (VPDd) and the wiring 53 (VPI) are set to an H level, and the potentials of the wiring 52 (VR) and the wirings 54*a* (VSSa) to 54*d* (VSSd) are set to an L level.

The operation at Time T01 is the same as the operation at Time T01 in the timing chart shown in FIG. 4. After the operation, the potential of the wiring 64*a* (SELa) is set at an L level at Time T02 to turn off the transistor 34*a*. Accordingly, the potential of the node FD1*a* begins to increase.

At Time T03*a*, the potentials of the wirings 61*a* (TXa) and 64*b* (SELb) are set to an L level to turn off the transistors 31*a* and 34*b*. As a result, the potential of the node FD1*a* is retained and the potential of the node FD1*b* begins to increase.

The potentials of the wirings 61*b* (TXb) and 64*c* (SELc) are set to an L level at Time T03*b* to turn off the transistors 31*b* and 34*c*. As a result, the potential of the node FD1*b* is retained and the potential of the node FD1*c* begins to increase.

At Time T03c, the potentials of the wiring 61c (TXc) and 64d (SELd) are set to an L level to turn off the transistors 31c and 34d. As a result, the potential of the node FD1c is retained and the potential of the node FD1d begins to increase.

At Time T03d, the potentials of the wirings 61d (TXd) and 62 (RES) are set to an L level to turn off the transistors 31d and 32. Accordingly, the potential of the node FD1d is retained.

Although the transistor 32 is turned off by setting the potential of the wiring 62 (RES) to the L level at Time T03d in FIG. 6, the transistor 32 may be turned off by setting the potential of the wiring 62 (RES) to the L level at Time T03c.

Imaging data are obtained by the pixel 10a in the period from Time T02 to Time T03a, by the pixel 10b in the period from Time T03a to Time T03b, by the pixel 10c in the period from Time T03b to Time T03c, and by the pixel 10d in the period from Time T03c to Time T03d. That is, without reading just after the imaging data are obtained, next-frame imaging data are obtained. Thus, imaging data can be obtained at shorter intervals than in the case where imaging data are read out every frame period as shown in FIG. 4, whereby a high-speed camera can be obtained. Meanwhile, imaging data for one frame period are obtained by any one of the pixels 10a, 10b, 10c, and 10d. Therefore, the resolution is reduced as compared that in the case where imaging data for one frame period are obtained by all the pixels 10a to 10d as shown in FIG. 4.

Note that the operations in the period from Time T01 to Time T03d are performed in all the pixels 10 included in the imaging device of one embodiment of the present invention concurrently. In other words, after imaging data are obtained by all the pixels 10a simultaneously, imaging data are obtained in all the pixels 10b, all the pixels 10c, and all the pixels 10d sequentially.

After the termination of the operation of Time T03d, operations similar to those in the period from Time T04 to Time T15 shown in the timing chart of FIG. 4 are performed. In the above manner, the pixel 10 with the configuration shown in FIG. 5 operates.

In Embodiment 1, one embodiment of the present invention has been described. Other embodiments of the present invention are described in Embodiments 2 to 8. Note that one embodiment of the present invention is not limited to the above examples. In other words, various embodiments of the invention are described in this embodiment and the other embodiments, and one embodiment of the present invention is not limited to a particular embodiment. Although an example in which a channel formation region, a source region, a drain region, or the like of a transistor includes an oxide semiconductor is described as one embodiment of the present invention, one embodiment of the present invention is not limited thereto. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor in one embodiment of the present invention does not necessarily include an oxide semiconductor.

Note that the configurations shown in FIG. 1, FIGS. 3A and 3B, FIG. 4, and FIG. 5 can be freely combined with one another.

This embodiment can be implemented in appropriate combinations with the configurations described in the other embodiments.

Embodiment 2

In this embodiment, a variation example of the pixel 10 of the imaging device of one embodiment is described with reference to drawings.

Figure 7:
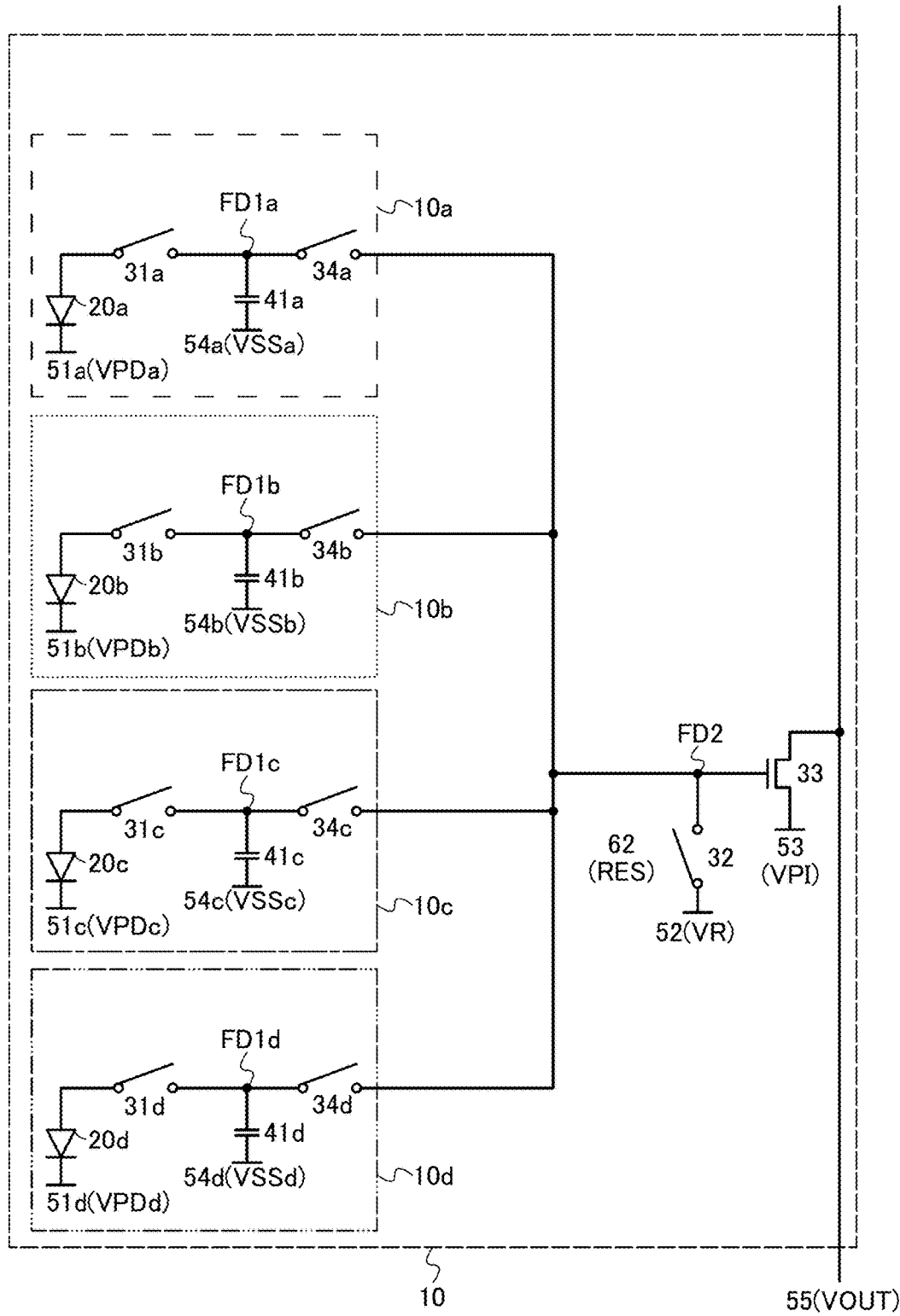
FIG. 7 is a circuit diagram illustrating pixels.

FIG. 7 shows a configuration in which the transistors 31a to 31d, the transistor 32, and the transistors 34a to 34d included in the pixel 10 shown in FIG. 1 are replaced with switches. Instead of the transistors, other elements can be used as long as they have a switching function. Note that some of the transistors 31a to 31d, the transistor 32, and the transistors 34a to 34d may be transistors and the other thereof may be other elements having a switching function.

Figure 8:
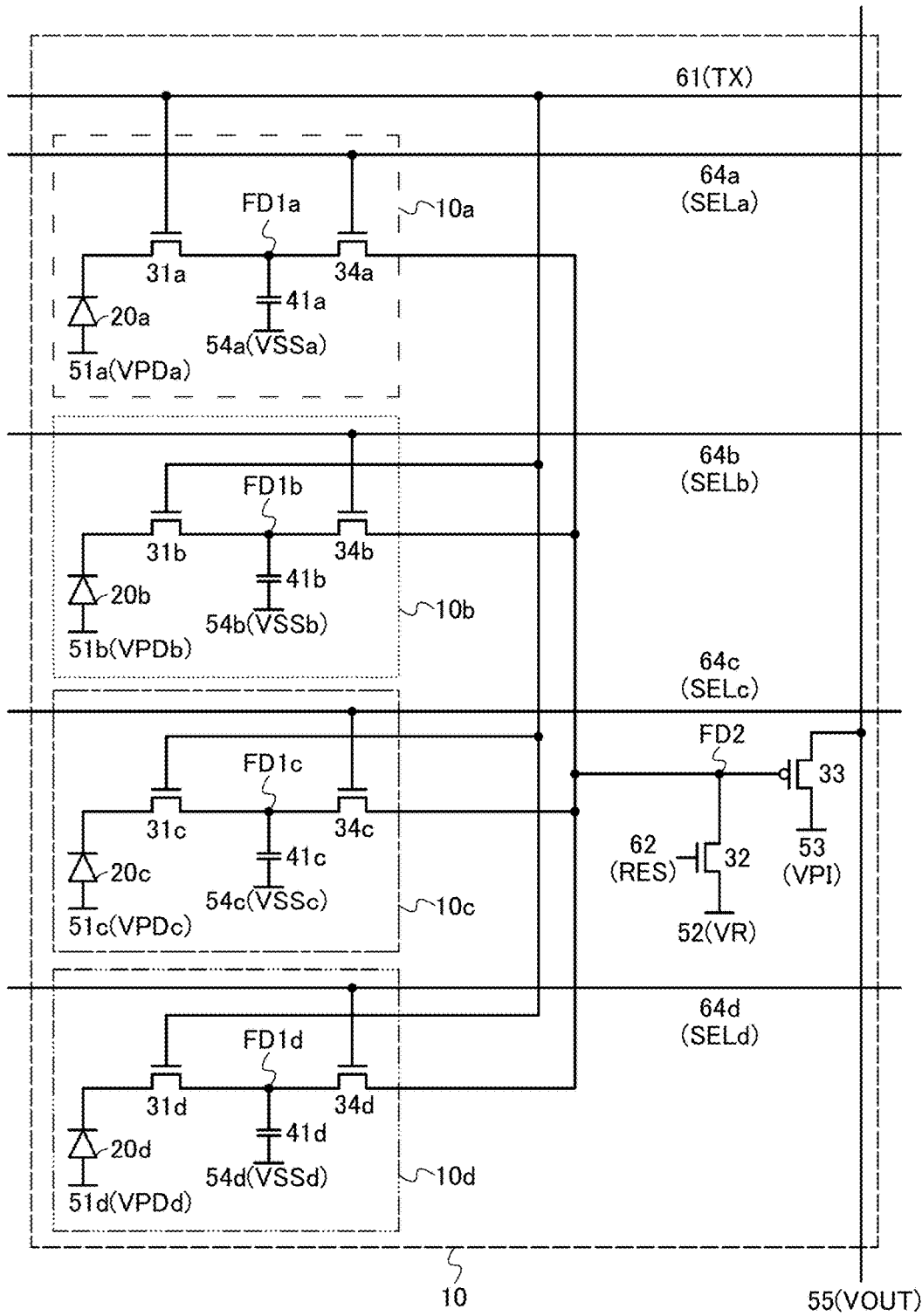
FIG. 8 is a circuit diagram illustrating pixels.

FIG. 8 shows a configuration in which the transistor 33 included in the pixel 10 with the configuration shown in FIG. 1 is a p-ch transistor. FIG. 4 can be referred to for the operation of the pixel 10 with this configuration. Note that the potentials of the wiring 52 (VR) and the wirings 54a (VSSa) to 54d (VSSd) are set to an H level, and the potentials of the wirings 51a (VPDa) to 51d (VPDd) and the wiring 53 (VPI) are set to an L level. When the transistor 33 is a p-ch transistor, it is unnecessary to electrically connect the source or the drain of the transistor having a function of selecting the pixel 10 to the source or drain of the transistor 33 even if high voltage is applied to the wirings 51a (VPDa) to 51d (VPDd). That is, the transistor having a function of selecting the pixel 10 can be omitted.

Note that in the pixel 10 with the configuration shown in FIG. 8, the potential of the node FD2 is at an H level at the time of reset, and the potential of the node FD2 is reduced to a potential corresponding to the obtained imaging data when imaging data are read. As the illuminance of light with which the pixel 10 is irradiated at the time of obtaining imaging data is increased, the potential of the node FD2 at the time of reading imaging data is reduced.

Figure 9:
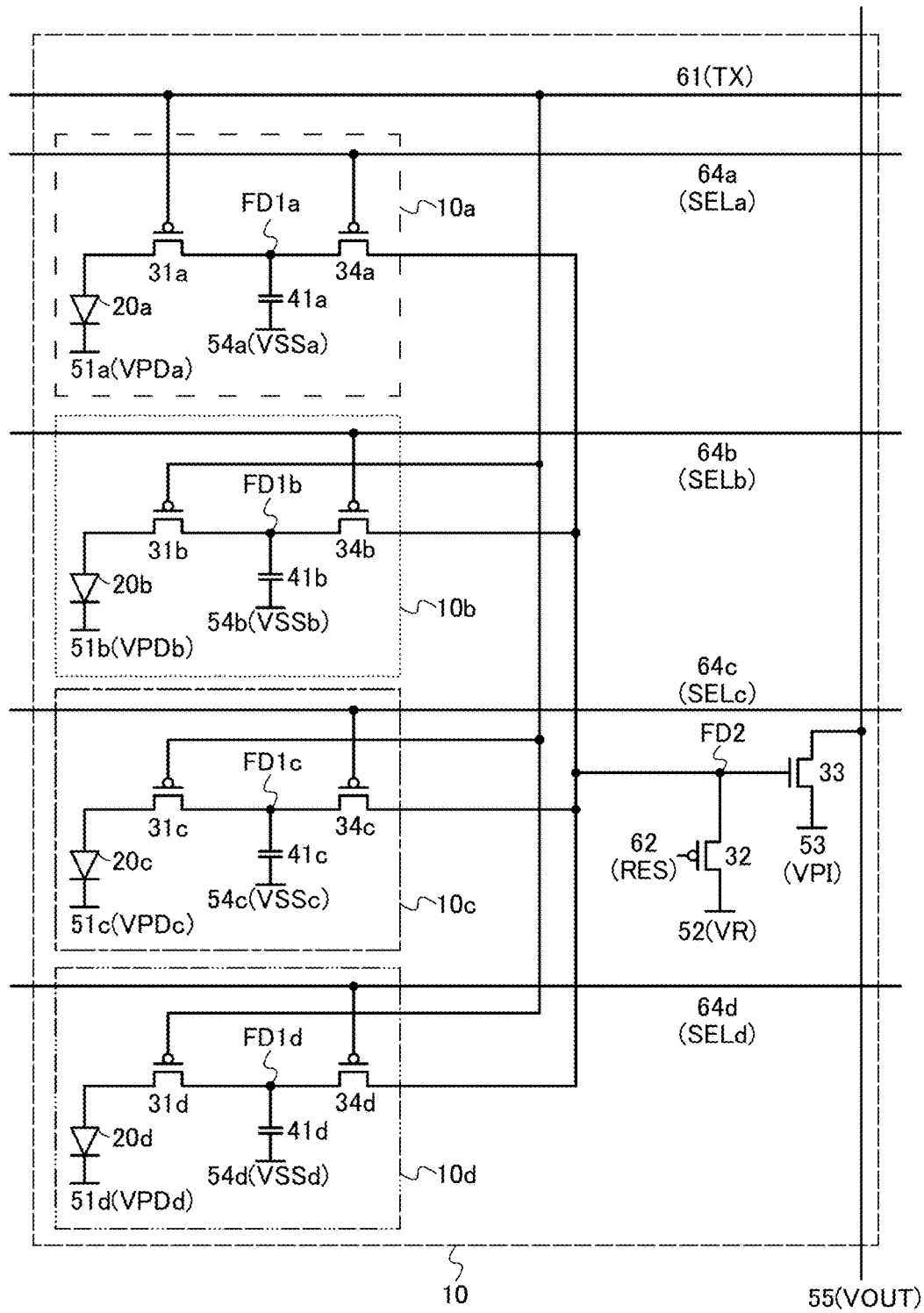
FIG. 9 is a circuit diagram illustrating pixels.

FIG. 9 shows a configuration in which the transistors 31a to 31d, the transistor 32, and the transistors 34a to 34d in FIG. 1 are p-ch transistors. FIG. 4 can be referred to for the operations when the levels of the potentials are inverted as needed. Note that some of the transistors 31a to 31d, the transistor 32, and the transistors 34a to 34d may be p-ch transistors. Alternatively, a CMOS structure may be employed.

Figure 10:
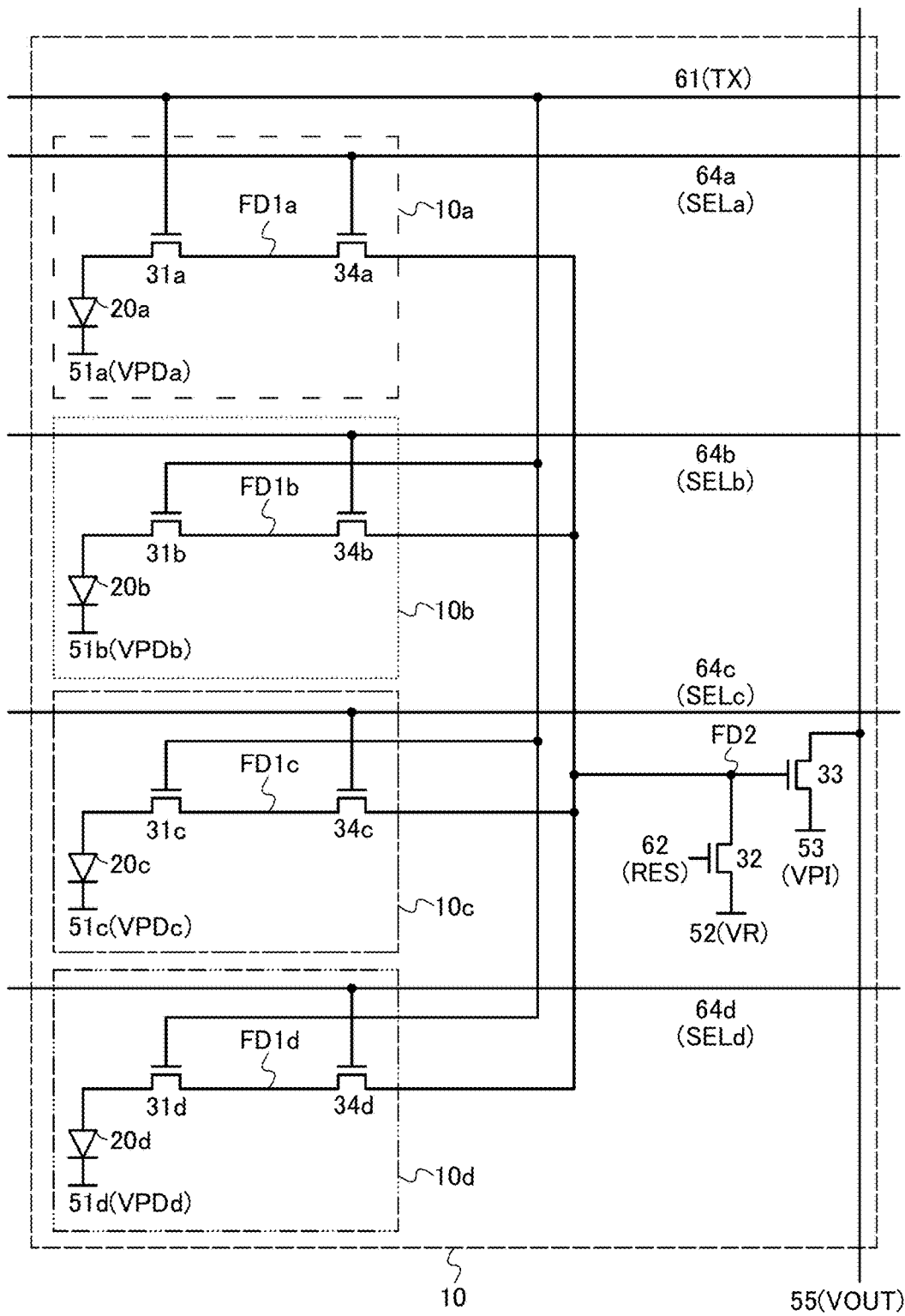
FIG. 10 is a circuit diagram illustrating pixels.

FIG. 10 shows a configuration in which the capacitors 41a to 41d are removed from the pixel 10 shown in FIG. 1. In that case, charges are accumulated in the nodes FD1a to FD1d owing to parasitic capacitances of wirings which are electrically connected to the nodes FD1a to FD1d.

With the configuration in FIG. 10, in the imaging device of one embodiment of the present invention, an area occupied by each pixel can be reduced. Thus, the resolution of the imaging device can be increased.

Figure 11:
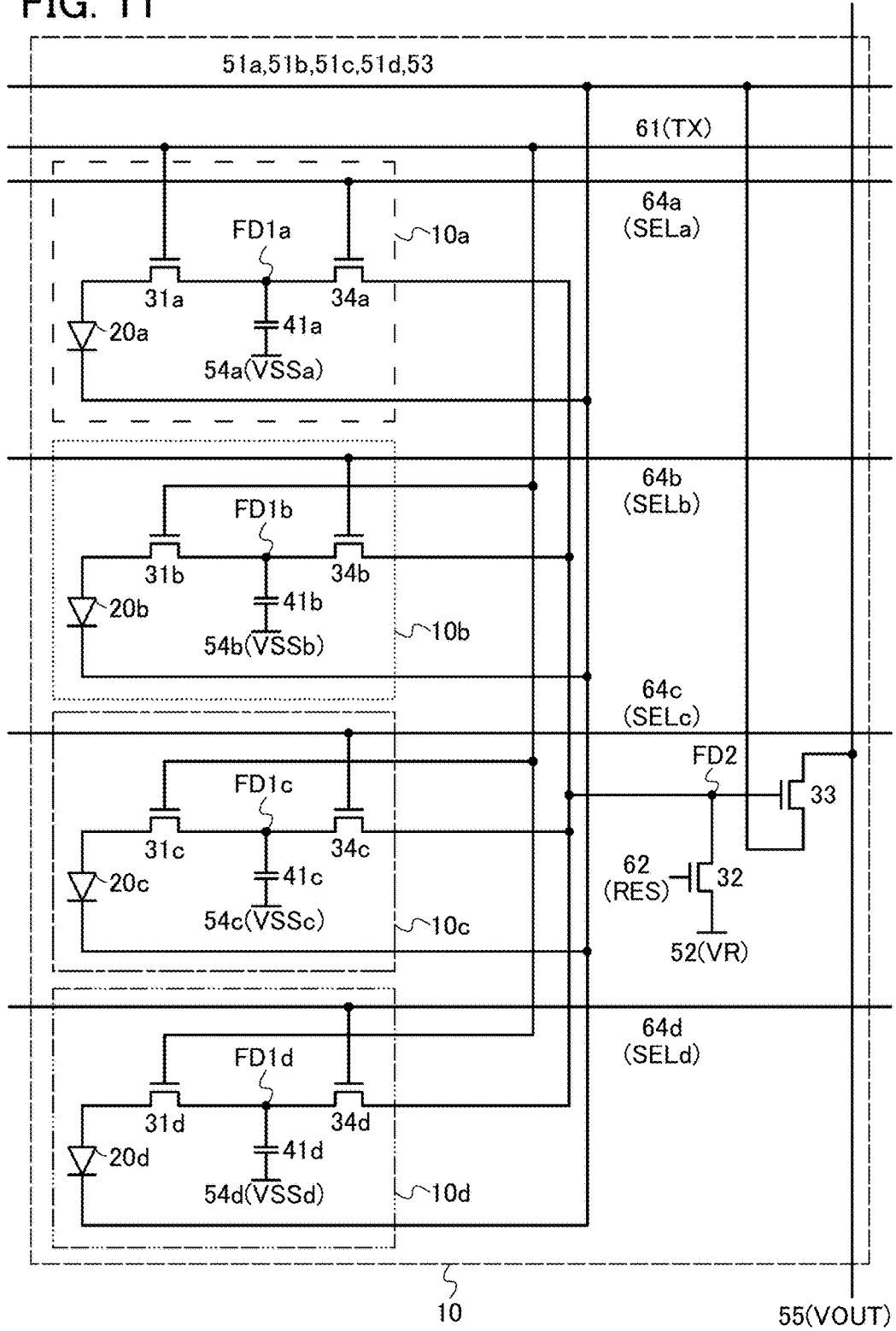
FIG. 11 is a circuit diagram illustrating pixels.

Although FIG. 1 illustrates wirings supplying the same potential as different wirings, one wiring may serve as those wirings. For example, as illustrated in FIG. 11, one wiring may serve as the wirings 51a (VPDa) to 51d (VPDd) and the wiring 53 (VPI) that apply an H-level potential. Alternatively, as illustrated in FIG. 12, one wiring may serve as the wiring 52 (VR) and the wirings 54a (VSSa) to 54d (VSSd) that apply an L-level potential.

Figure 12:
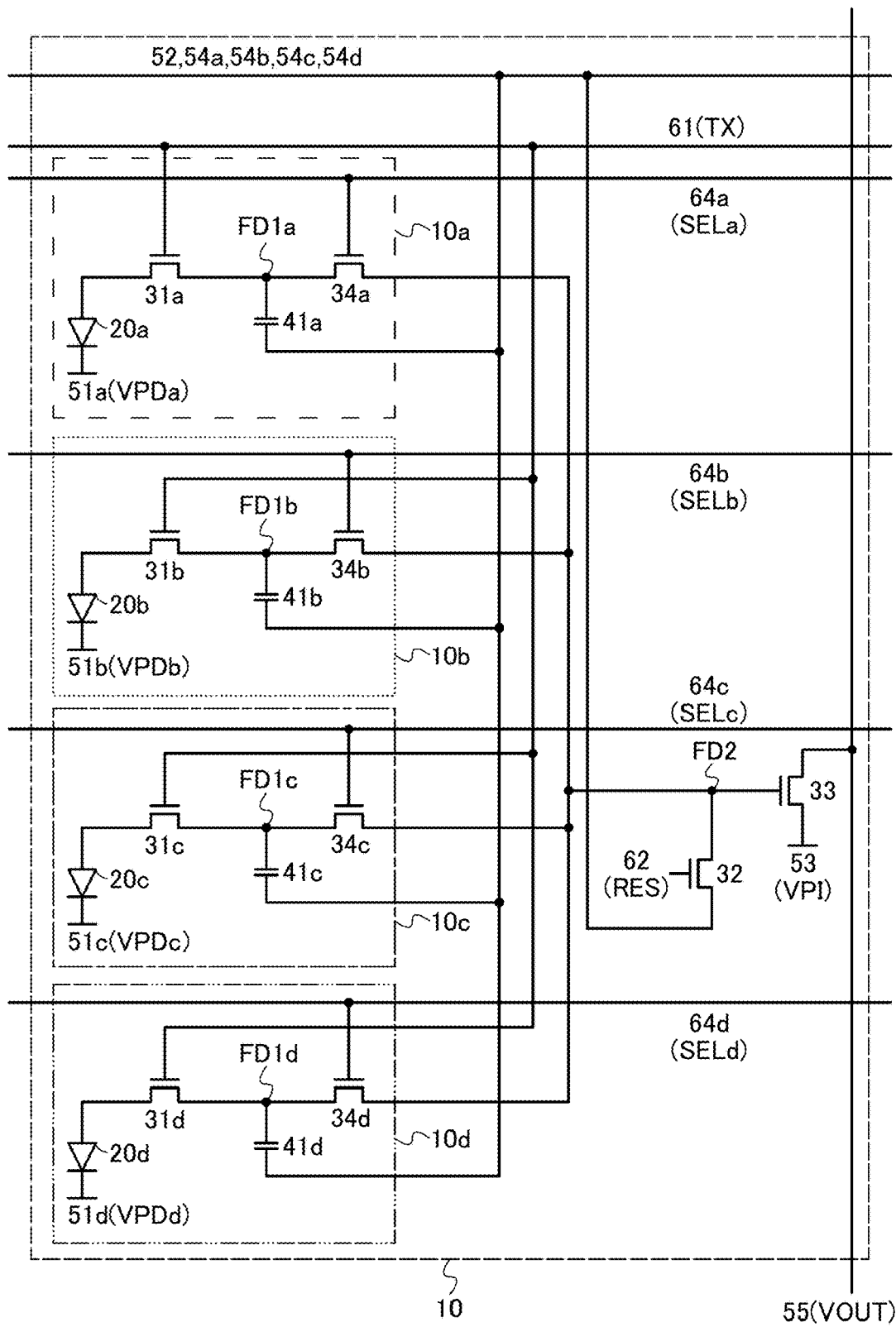
FIG. 12 is a circuit diagram illustrating pixels.

Employing the configuration in FIG. 11 and/or the configuration in FIG. 12 for the pixel 10 can reduce the number of wirings included in the imaging device of one embodiment of the present invention. As a result, the size of the imaging device can be reduced.

Figure 13A:
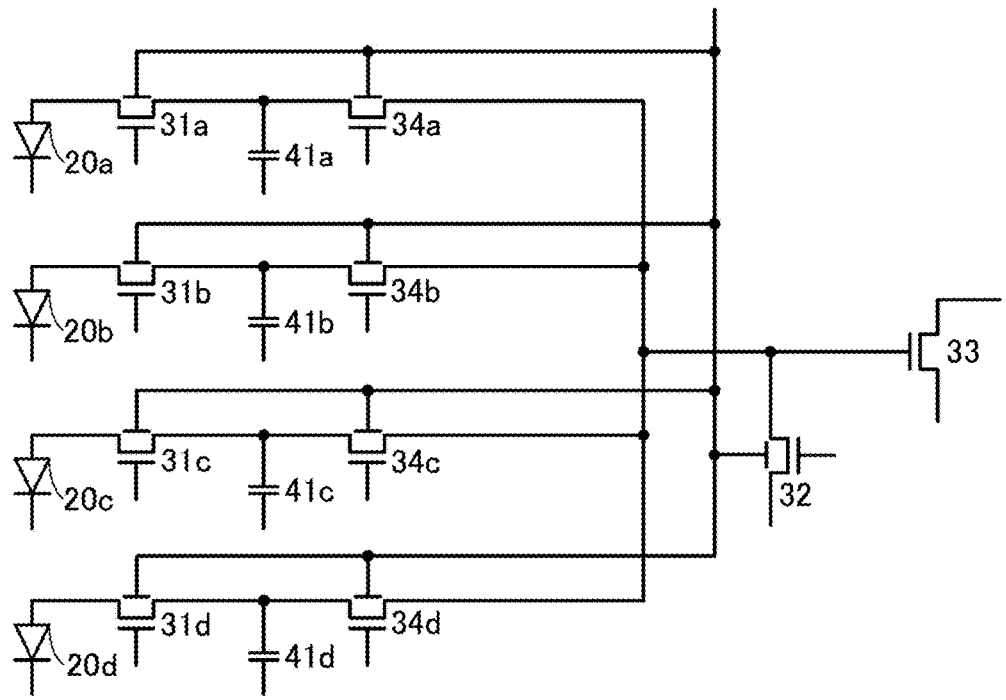
FIGS. 13A and 13B are circuit diagrams illustrating pixels.
Figure 13B:
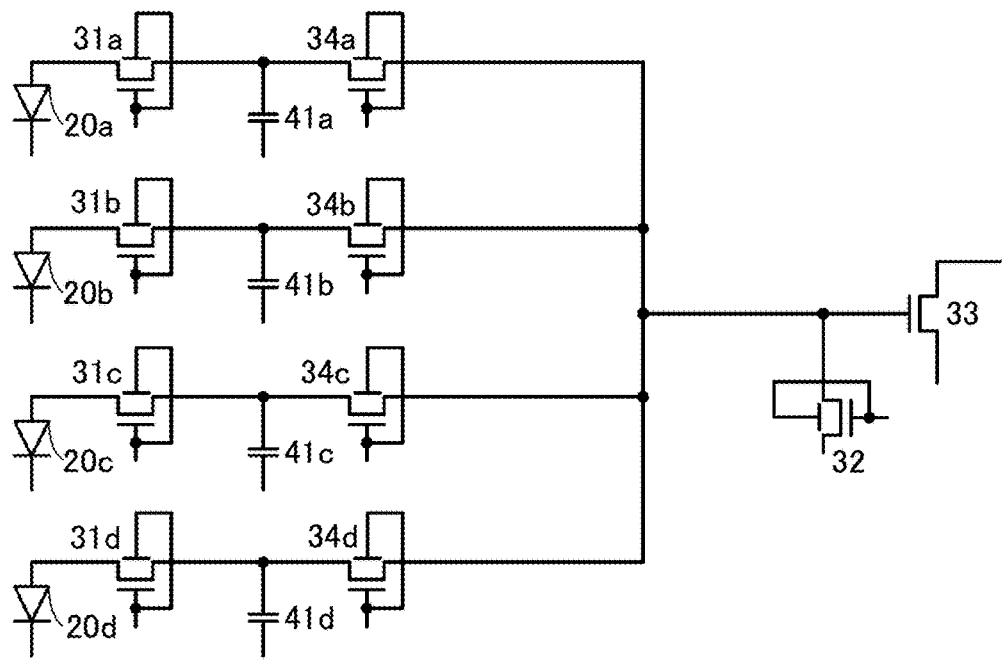
Figure 14A:
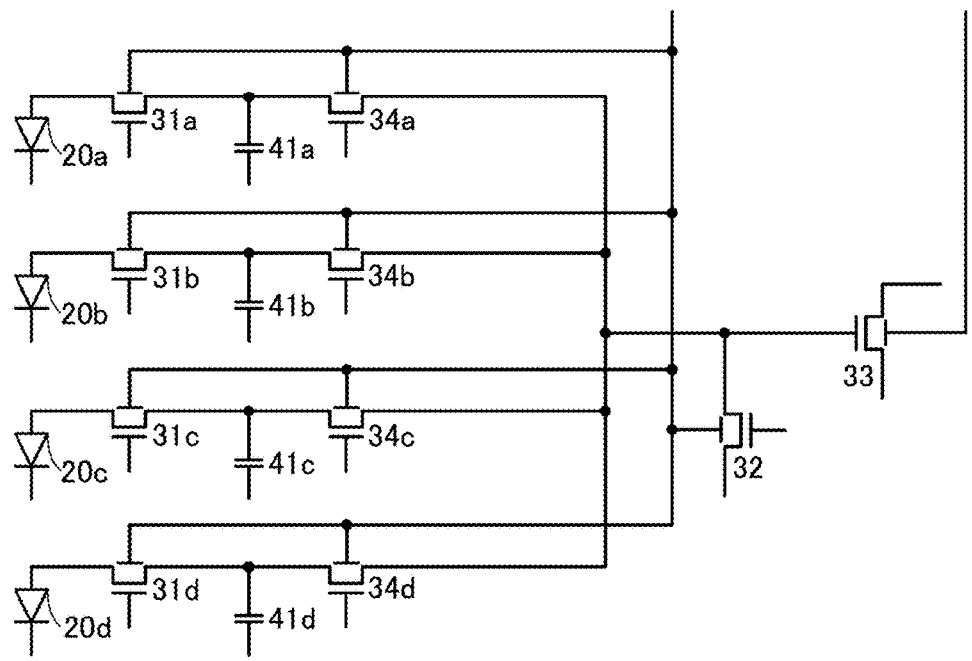
FIGS. 14A and 14B are circuit diagrams illustrating pixels.
Figure 14B:
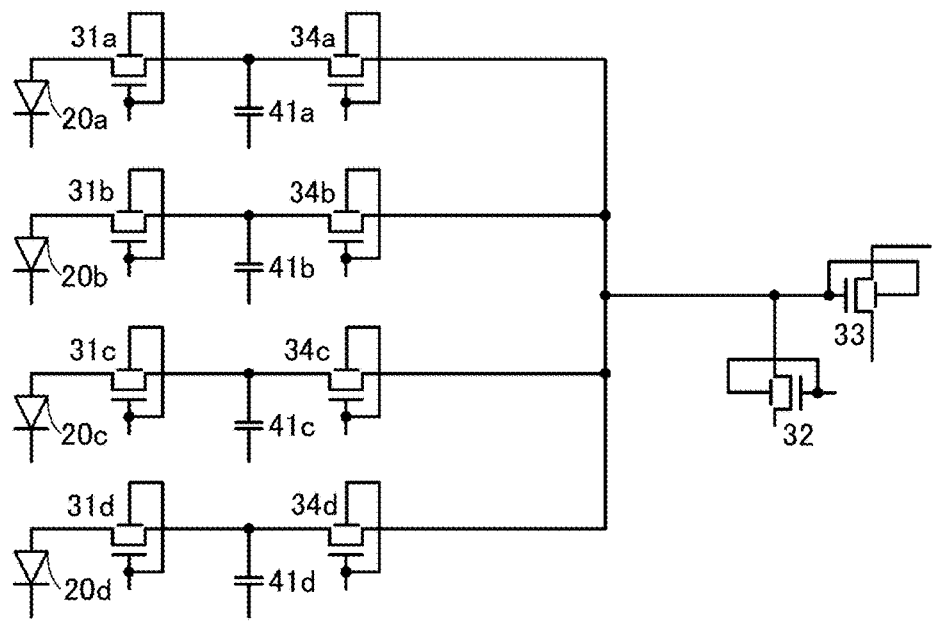

The transistors 31a to 31d, the transistor 32, the transistor 33, and the transistors 34a to 34d in the pixel 10 in FIG. 1 may each include a back gate as illustrated in FIGS. 13A and 13B. FIG. 13A illustrates a configuration in which a constant potential is applied to the back gates, which enables control of the threshold voltages. FIG. 13B illustrates a configuration in which the same potential is applied to the front gates and the back gates, which enables an increase in on-state current. The transistors 31a to 31d, the transistor 32, the transistor 33, and the transistor 34a to 34d may each have a back gate as illustrated in FIGS. 14A and 14B.

Figure 15A:
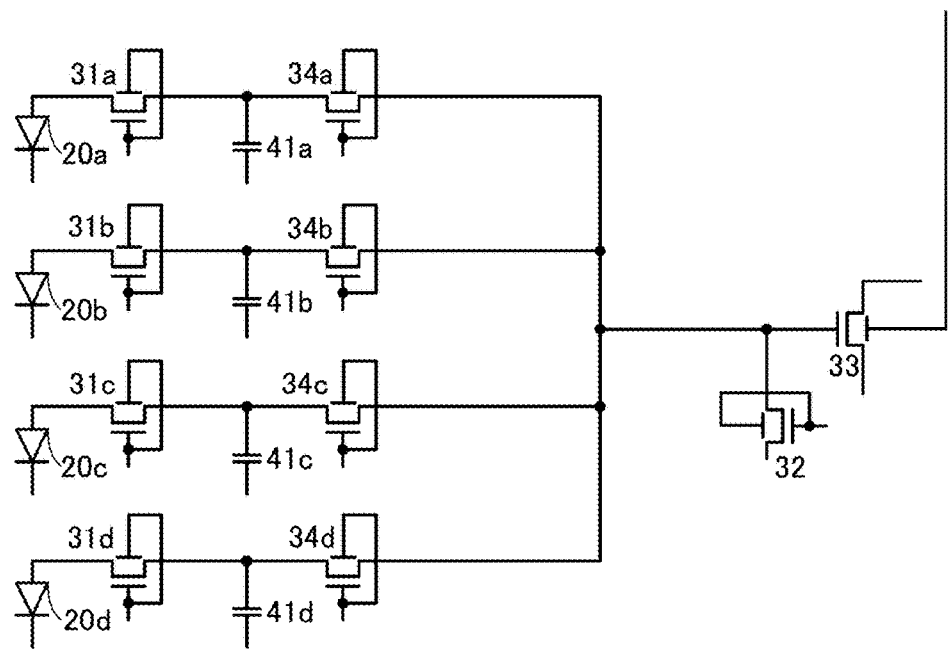
FIGS. 15A and 15B are circuit diagrams illustrating pixels.
Figure 15B:
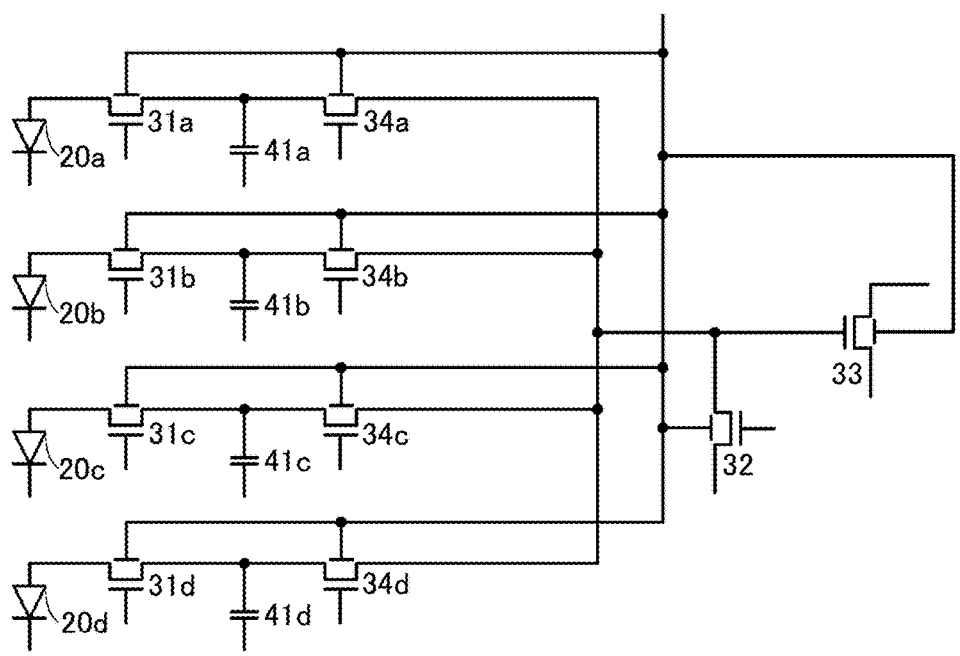

Moreover, as illustrated in FIG. 15A, a configuration in which the same potential is applied to the front gate and the back gate and a configuration in which a constant potential is applied to the back gate may be combined as necessary for the transistors in one pixel. Furthermore, a configuration in which no back gate is provided may be combined with any of the above configurations, as needed. As the configuration in which a constant potential is applied to the back gate, for example, a configuration in which the same potential is applied to all the back gates can be employed as illustrated in FIG. 15B, for example.

Note that some wirings are not illustrated in FIGS. 13A and 13B, FIGS. 14A and 14B, and FIGS. 15A and 15B.

Since an OS transistor has a lower on-state current than a Si transistor, it is particularly preferable that the OS transistor have a back gate. For example, in the case where OS transistors are provided as the transistors 31a to 31d, the transistor 32, and the transistors 34a to 34d, the transistors 31a to 31d, the transistor 32, and the transistors 34a to 34d are each preferably provided with a back gate. Alternatively, for example, in the case where OS transistors are used as the transistors 31a to 31d, the transistor 32, the transistor 33, and the transistors 34a to 34d, the transistors 31a to 31d, the transistor 32, the transistor 33, and the transistors 34a to 34d are each preferably provided with a back gate.

Note that the configurations shown in FIG. 1, FIG. 5, FIG. 7, FIG. 8, FIG. 9, FIG. 10, FIG. 11, FIG. 12, FIGS. 13A and 13B, FIGS. 14A and 14B, and FIGS. 15A and 15B can be optionally combined with each other.

This embodiment can be implemented in appropriate combinations with the configurations described in the other embodiments.

Embodiment 3

In this embodiment, specific configuration examples of the imaging device of one embodiment of the present invention are described below with reference to drawings.

Figure 16A:
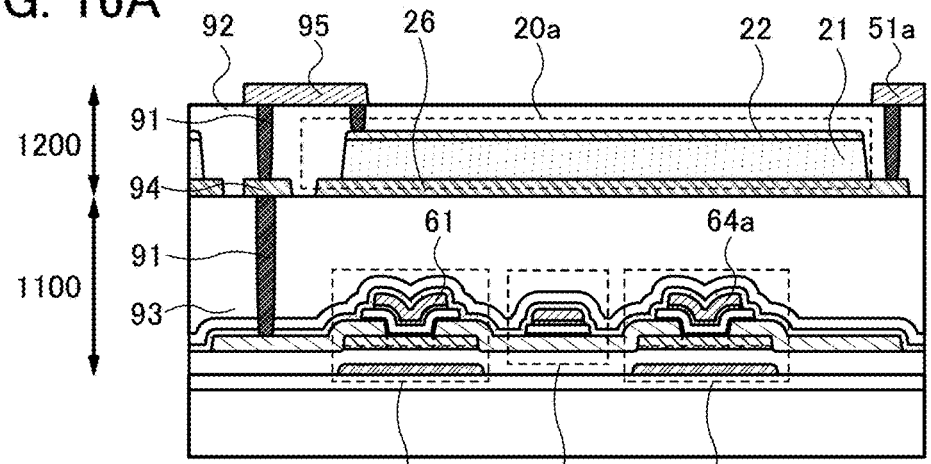
FIGS. 16A to 16C are cross-sectional views each illustrating the structure of an imaging device.

FIG. 16A illustrates an example of a cross-sectional view of the imaging device of one embodiment of the present invention to illustrate a specific connection between the photoelectric conversion element 20a, the transistor 31a, the transistor 32, and the capacitor 41a which are included in the pixel 10a in FIG. 1. Note that the transistors 32 and 33 are not illustrated in FIG. 16A. The transistors 31a, 32, 33, and 34a and the capacitor 41a can be provided in a layer 1100, and the photoelectric conversion element 20a can be provided in a layer 1200.

The photoelectric conversion element 20a includes a photoelectric conversion layer 21, a light-transmitting conductive layer 22, and an electrode 26. The light-transmitting conductive layer 22 is electrically connected to one of the source and the drain of the transistor 31a via conductors 91, a wiring 94, and a wiring 95. The electrode 26 is electrically connected to the wiring 51a, which is shown in FIG. 1, via the conductor 91.

Although the wirings, the electrodes, and contact plugs (conductors 91) are illustrated as independent components in cross-sectional views in this embodiment, some of them are provided as one component in some cases when they are electrically connected to each other. In addition, a configuration in which the wiring is connected to the electrode through the conductor 91 is only an example, and the wiring may be directly connected to the electrode.

In addition, insulating layers 92 and 93 and the like that function as protective films, interlayer insulating films, or planarization films are provided over the components. The insulating layer 92 and the insulating layer 93 can be provided in the layer 1200 and the layer 1100, respectively. For example, an inorganic insulating film such as a silicon oxide film or a silicon oxynitride film can be used as each of the insulating layers 92 and 93 and the like. Alternatively, an organic insulating film such as an acrylic resin film or a polyimide resin film may be used. Top surfaces of the insulating layers 92 and 93 and the like are preferably planarized by chemical mechanical polishing (CMP) or the like as necessary.

Stacking the photoelectric conversion element 20a over another element allows an H-level potential to be applied to the wiring 51a (VPDa). Therefore, as described in Embodiment 1, it is unnecessary to electrically connect the source or the drain of the transistor having a function of selecting the pixel 10 to the source or the drain of transistor 33. In other words, it is not necessary to provide the transistor having a function of selecting the pixel 10 in the imaging device of one embodiment of the present invention. Thus, the area occupied by each pixel in the imaging device of one embodiment of the present invention can be smaller than that with a transistor having a function of selecting the pixel 10, which makes it possible to obtain a high-resolution image.

In some cases, some of the wirings and the like illustrated in the drawing are not provided or a wiring, a transistor, or the like that is not illustrated in the drawing is included in each layer. In addition, a layer that is not illustrated in the drawing might be included. Furthermore, some of the layers illustrated in the drawing are not included in some cases.

Figure 16B:
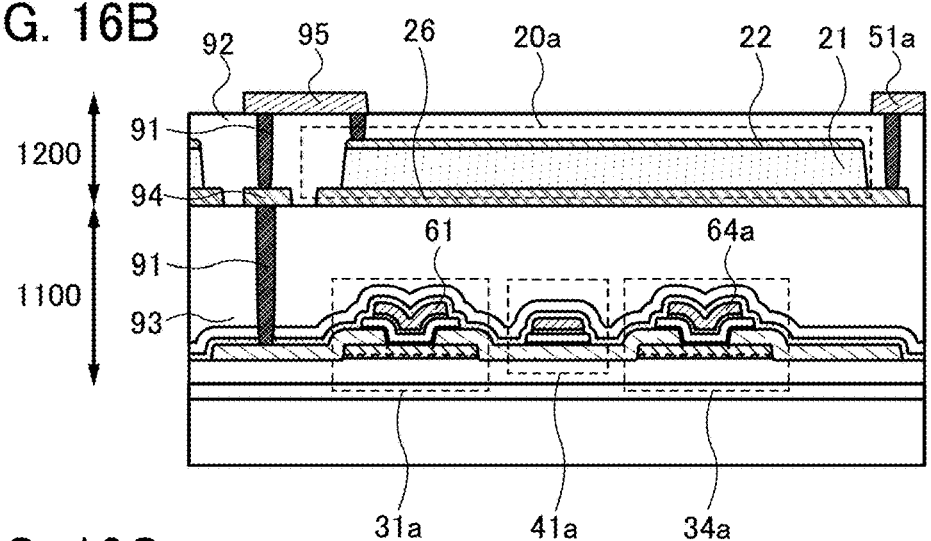
Figure 16C:
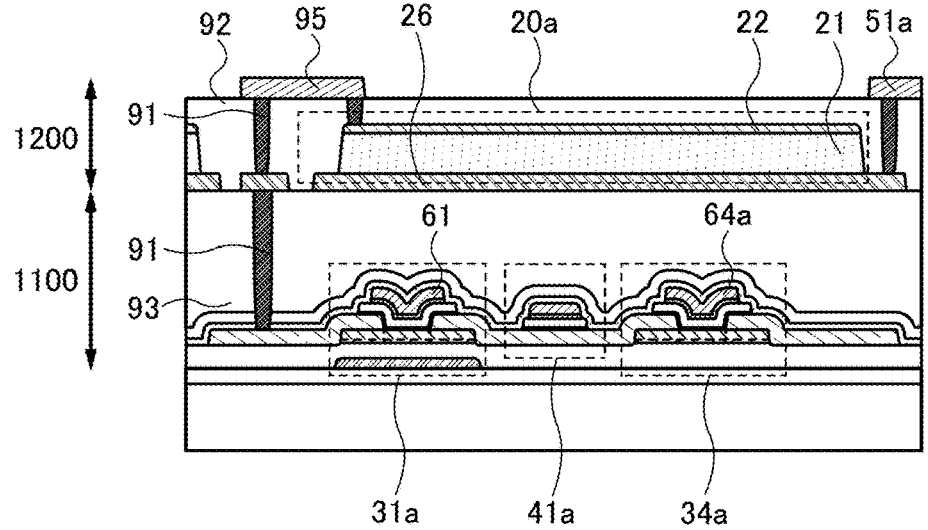

Note that although each transistor includes a back gate in FIG. 16A, each transistor does not necessarily include a back gate as illustrated in FIG. 16B. Alternatively, one or more transistors, for example, only the transistor 31a may include a back gate, as illustrated in FIG. 16C. The back gate might be electrically connected to a front gate of the transistor, which is provided to face the back gate. Alternatively, different fixed potentials might be supplied to the back gate and the front gate. The presence or absence of the back gate can also be applied to another pixel described in this embodiment.

Any of a variety of elements can be used as the photoelectric conversion element 20a provided in the layer 1200. FIG. 16A illustrates the photoelectric conversion element 20a including a selenium-based material in a photoelectric conversion layer 21. For example, the photoelectric conversion layer 21 can be provided between the light-transmitting conductive layer 22 and the electrode 26 formed using a metal material or the like. The photoelectric conversion element 20*a* including a selenium-based material has high external quantum efficiency with respect to visible light. Furthermore, the selenium-based material has a high light-absorption coefficient, making the photoelectric conversion layer 21 thin easily. The photoelectric conversion element 20*a* including a selenium-based material can be a highly sensitive sensor in which the amount of amplification of electrons with respect to the amount of incident light is large because of an avalanche phenomenon. In other words, the use of a selenium-based material for the photoelectric conversion layer 21 allows a sufficient amount of photocurrent to be obtained even when the pixel area is reduced. Thus, the photoelectric conversion element 20*a* including a selenium-based material is also suitable for imaging in a low-illuminance environment.

It is preferable to apply a relatively high voltage (e.g., 10 V or higher) to the photoelectric conversion element in order to cause the avalanche phenomenon. Since the OS transistor has higher drain breakdown voltage than the Si transistor, the application of a relatively high voltage to the photoelectric conversion element is easy. Thus, by combination of the OS transistor having high drain breakdown voltage and the photoelectric conversion element including the selenium-based material in the photoelectric conversion layer, a highly sensitive and highly reliable imaging device can be obtained.

Amorphous selenium or crystalline selenium can be used as a selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity to visible light and a higher absorption coefficient for visible light than amorphous selenium.

Figure 17A:
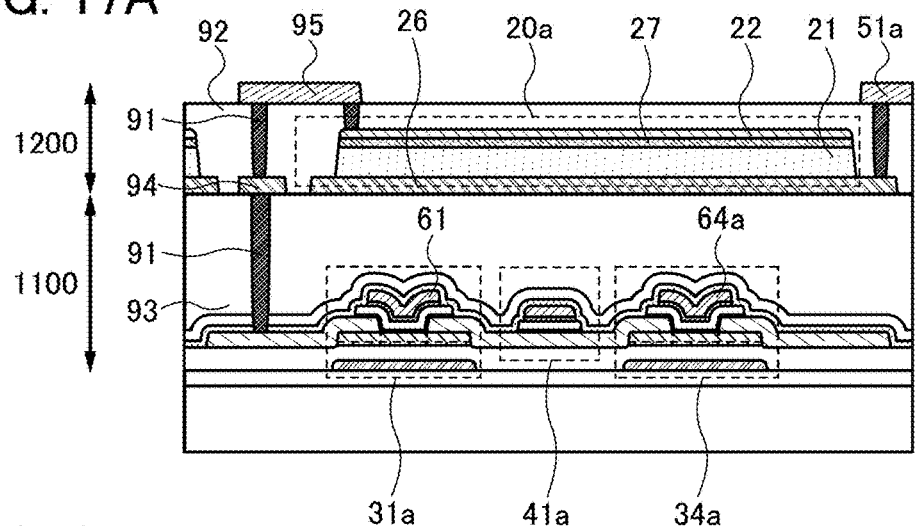
FIGS. 17A to 17C are cross-sectional views each illustrating the structure of an imaging device.
Figure 17B:
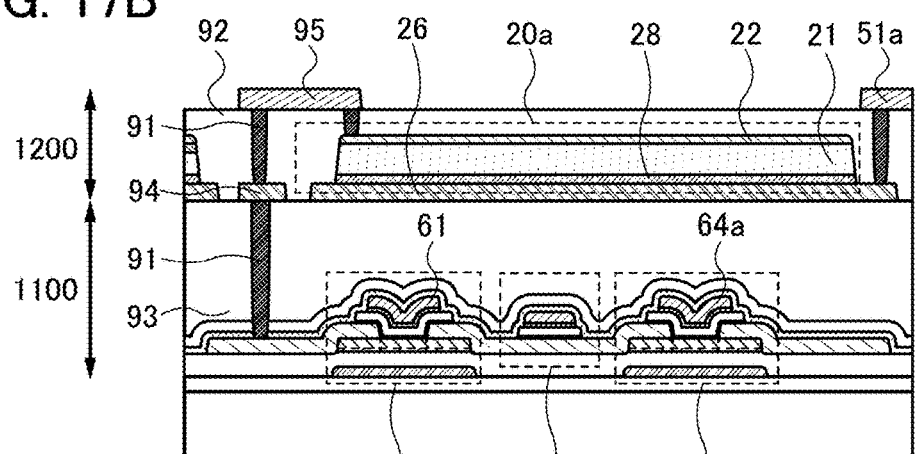
Figure 17C:
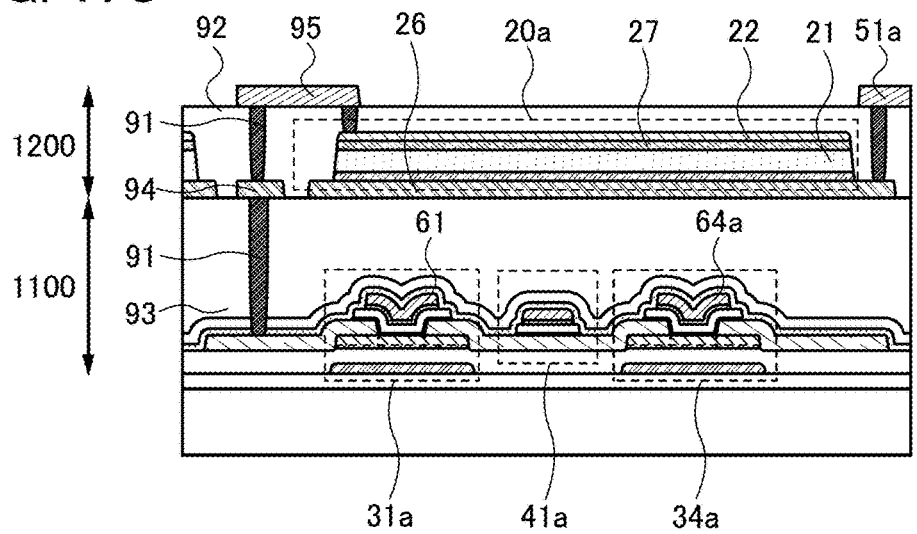

Although the photoelectric conversion layer 21 is a single layer in FIG. 16A, a layer of gallium oxide, cerium oxide, an In—Ga—Zn oxide, or the like may be provided as a hole injection blocking layer 27 on a light-receiving surface side as illustrated in FIG. 17A. Alternatively, as illustrated in FIG. 17B, a layer of nickel oxide, antimony sulfide, or the like may be provided as an electron injection blocking layer 28 on the electrode 26 side. Further alternatively, as illustrated in FIG. 17C, the hole injection blocking layer 27 and the electron injection blocking layer 28 may be provided. Note that as illustrated in FIG. 8, a configuration that differs in the direction of connection of the photoelectric conversion element 20*a* can be used in the pixel 10*a*. Thus, the hole injection blocking layer 27 and the electron injection blocking layer 28 in FIGS. 17A to 17C may be replaced with each other.

The photoelectric conversion layer 21 may be a layer including a compound of copper, indium, and selenium (CIS). Alternatively, a layer including a compound of copper, indium, gallium, and selenium (CIGS) may be used. A photoelectric conversion element including the CIS layer or the CIGS layer can also utilize avalanche multiplication like the photoelectric conversion element including a layer of selenium alone. CIS and CIGS are p-type semiconductors and may be formed in contact with an n-type semiconductor such as cadmium sulfide or zinc sulfide to form a junction.

Figure 18A:
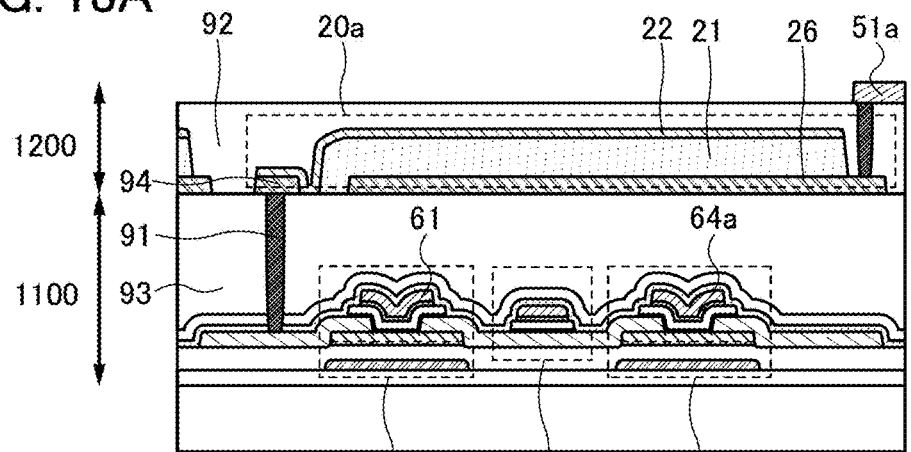
FIGS. 18A to 18C are cross-sectional views each illustrating the structure of an imaging device.
Figure 18B:
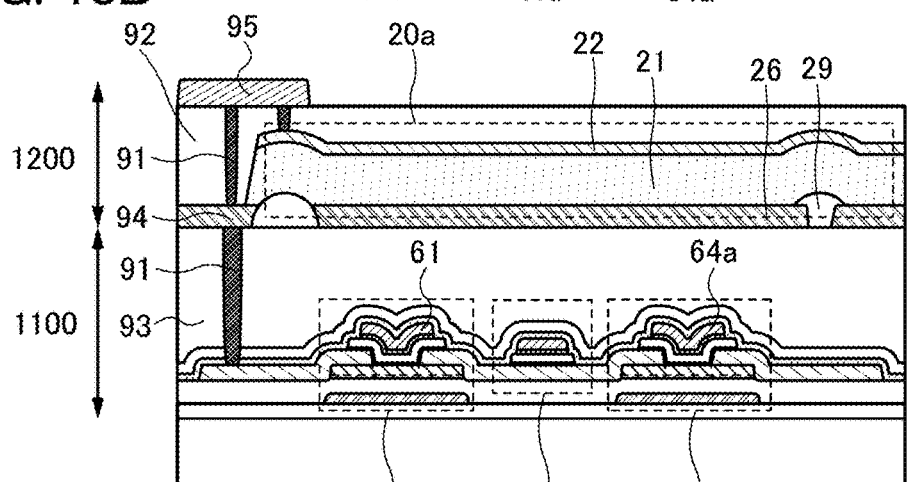

Although the light-transmitting conductive layer 22 and the wiring 94 are connected to each other via the wiring 95 and the conductor 91 in FIG. 16A, the light-transmitting conductive layer 22 and the wiring 94 may be in direct contact with each other as in FIG. 18A. Although the photoelectric conversion layer 21 and the light-transmitting conductive layer 22 are divided between pixels in FIG. 16A, a configuration in which they are not divided between pixels may be employed as illustrated in FIG. 18B. Although not illustrated in FIG. 18B, the electrode 26 is electrically connected to the wiring 51*a* (VPDa).

Figure 18C:
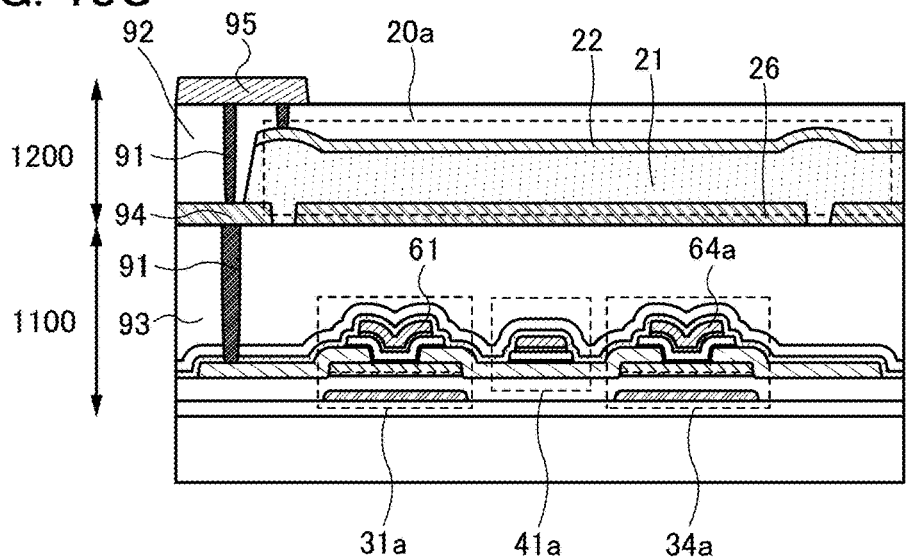

In the configuration illustrated in FIG. 18B, a partition wall 29 formed of an insulator is preferably provided in a region where the electrode 26 is not provided, thereby preventing generation of a crack in the photoelectric conversion layer 21 and the light-transmitting conductive layer 22. However, a configuration in which the partition wall 29 is not provided may be employed as illustrated in FIG. 18C.

Figure 19A:
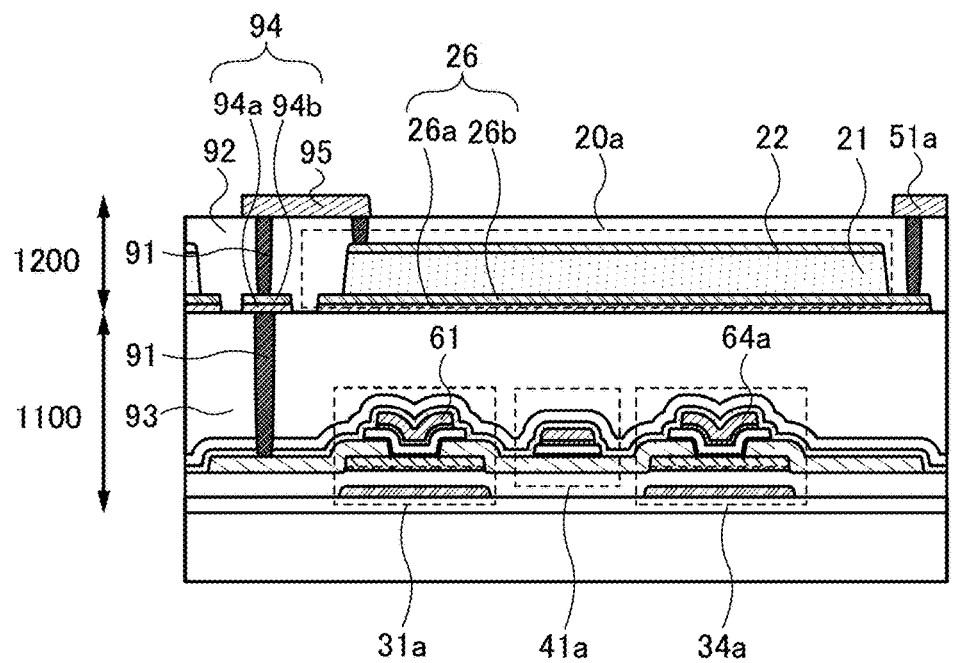
FIGS. 19A and 19B are cross-sectional views each illustrating the structure of an imaging device.

The electrode 26, the wiring 94, and the like may each be a multilayer. For example, as illustrated in FIG. 19A, the electrode 26 can include two conductive layers 26*a* and 26*b* and the wiring 94 can include two conductive layers 94*a* and 94*b*. In the structure in FIG. 19A, for example, the conductive layers 26*a* and 94*a* may be made of a low-resistance metal or the like, and the conductive layers 26*b* and 94*b* may be made of a metal or the like that exhibits an excellent contact property with the photoelectric conversion layer 21. Such a structure can improve the electrical characteristics of the photoelectric conversion element 20*a*.

The conductive layers 26*b* and 94*b* can be formed using molybdenum, tungsten, or the like, for example. The conductive layers 26*a* and 94*a* can be formed using, for example, aluminum, titanium, or a stack of titanium, aluminum, and titanium that are layered in that order.

Figure 19B:
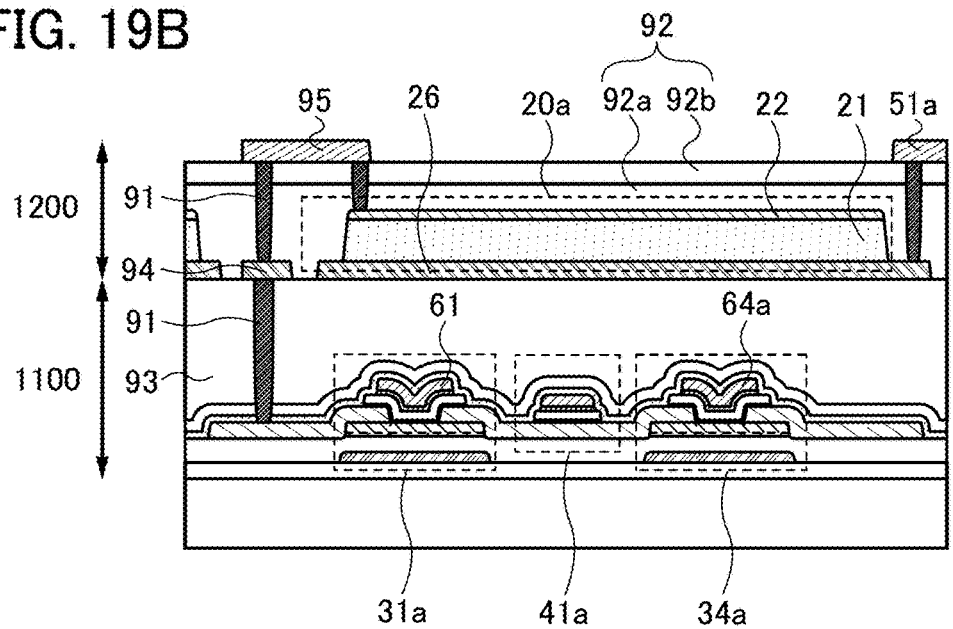

As illustrated in FIG. 19B, the insulating layer 92 and the like may each be a multilayer. As illustrated in FIG. 19B, the insulating layer 92 can include two insulating layers 92*a* and 92*b*. When the insulating layers 92*a* and 92*b* have different etching rates, the conductor 91 has a difference in level. In the case where another insulating layer used as an interlayer insulating film or a planarization film is a multilayer, the conductor 91 also has a difference in level. Although the insulating layer 92 is formed using two layers here, the insulating layer 92 and another insulating layer may each be formed using three or more layers.

As the photoelectric conversion element 20*a*, a PIN diode element formed using an amorphous silicon film, a microcrystalline silicon film, or the like may be used.

Figure 20:
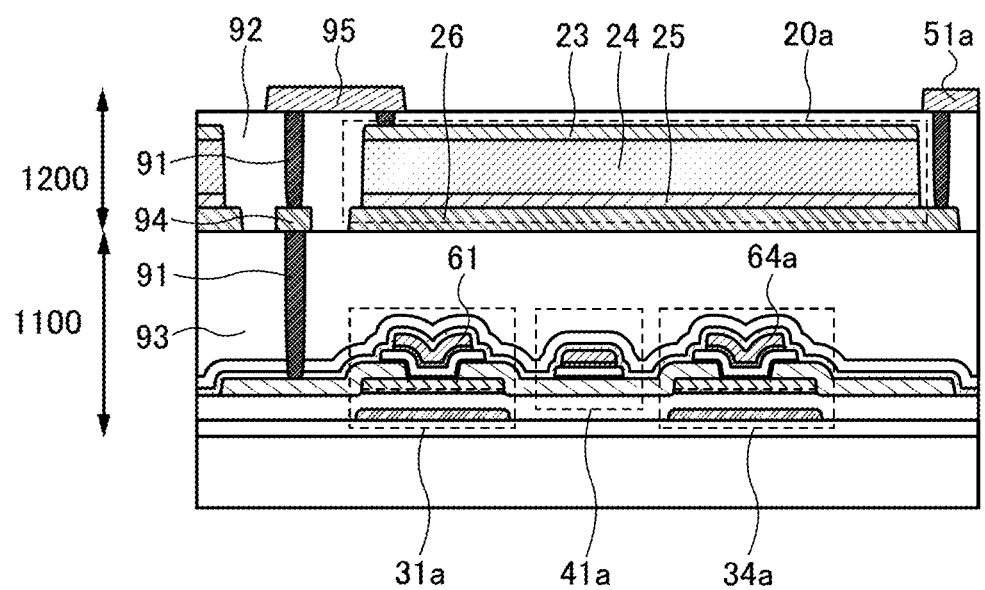
FIG. 20 is a cross-sectional view illustrating the structure of an imaging device.

FIG. 20 illustrates an example in which a thin film PIN photodiode is used as the photoelectric conversion element 20*a*. In the photodiode, an n-type semiconductor layer 25, an i-type semiconductor layer 24, and a p-type semiconductor layer 23 are stacked in this order. The i-type semiconductor layer 24 is preferably formed using amorphous silicon. The p-type semiconductor layer 23 and the n-type semiconductor layer 25 can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and thus can easily sense weak visible light.

In the photoelectric conversion element 20*a* in FIG. 20, the n-type semiconductor layer 25 functioning as a cathode is in contact with the electrode 26 that is electrically connected to the wiring 51*a* (VPDa). The p-type semiconductor layer 23 serving as an anode is electrically connected to one of the source and the drain of the transistor 31*a* via the wiring 95 and the conductor 91. That is, FIG. 20 is a structural example corresponding to the circuit diagram in FIG. 1.

Note that the photoelectric conversion element 20*a* is preferably formed such that the p-type semiconductor layer 23 serves as a light-receiving surface, which can increase the output current of the photoelectric conversion element 20*a*.

FIGS. 21A to 21F show other examples of the structure of the photoelectric conversion element 20*a* having a configuration of a PIN thin film photodiode and the connection between the wiring 94 and the photoelectric conversion element 20*a*. Note that the structure of the photoelectric conversion element 20*a* and the connection between the wiring 94 and the photoelectric conversion element 20*a* are not limited thereto, and other configurations may be applied.

Figure 21A:
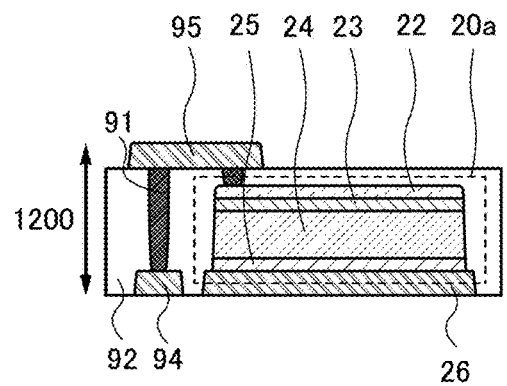
FIGS. 21A to 21F are cross-sectional views each illustrating a connection mode of a photoelectric conversion element.

FIG. 21A illustrates a structure of the photoelectric conversion element 20*a* that includes the light-transmitting conductive layer 22 in contact with the p-type semiconductor layer 23. The light-transmitting conductive layer 22 serves as an electrode and can increase the output current of the photoelectric conversion element 20*a*.

For the light-transmitting conductive layer 22, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; or the like. The light-transmitting conductive layer 22 is not limited to a single layer, and may be a stacked layer of different films.

Figure 21B:
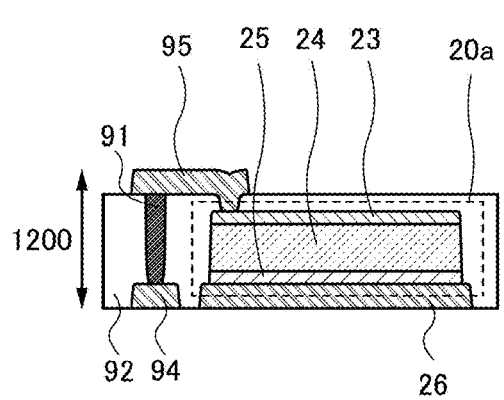

FIG. 21B illustrates a structure in which the p-type semiconductor layer 23 of the photoelectric conversion element 20*a* is directly connected to the wiring 95.

Figure 21C:
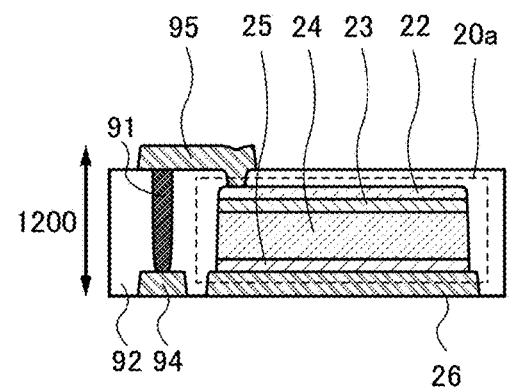

FIG. 21C illustrates a structure of the photoelectric conversion element 20*a* in which the light-transmitting conductive layer 22 is in contact with the p-type semiconductor layer 23 and the wiring 95 is electrically connected to the light-transmitting conductive layer 22.

Figure 21D:
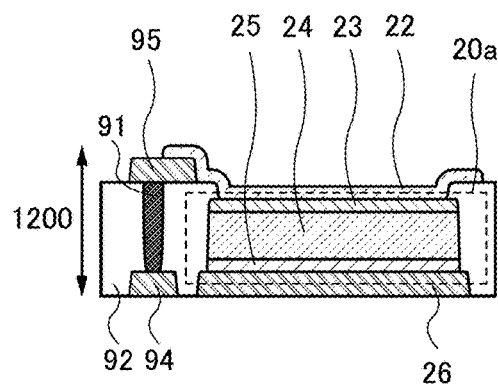

FIG. 21D illustrates a structure in which an opening exposing the p-type semiconductor layer 23 is provided in an insulating layer covering the photoelectric conversion element 20*a*, and the light-transmitting conductive layer 22 that covers the opening is electrically connected to the wiring 95.

Figure 21E:
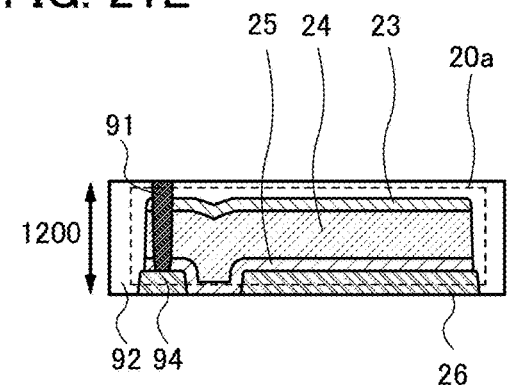

FIG. 21E illustrates a structure including the conductor 91 that penetrates the photoelectric conversion element 20*a*. In the structure, the wiring 94 is electrically connected to the p-type semiconductor layer 23 through the conductor 91. Note that in the drawing, the wiring 94 appears to be electrically connected to the electrode 26 through the n-type semiconductor layer 25. However, because of a high electric resistance in the lateral direction of the n-type semiconductor layer 25, the resistance between the wiring 94 and the electrode 26 is extremely high when there is an appropriate distance therebetween. Thus, the photoelectric conversion element 20*a* has diode characteristics without a short circuit between the anode and the cathode. Note that two or more conductors 91 that are electrically connected to the p-type semiconductor layer 23 may be provided.

Figure 21F:
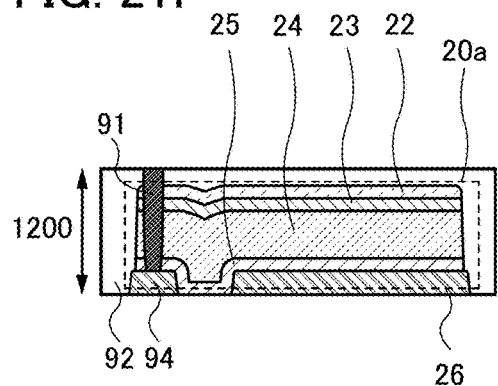

FIG. 21F illustrates a structure in which the photoelectric conversion element 20*a* in FIG. 21E is provided with the light-transmitting conductive layer 22 in contact with the p-type semiconductor layer 23.

Note that the photoelectric conversion element 20*a* illustrated in FIGS. 21D to 21F has an advantage of having a large light-receiving area because wirings and the like do not overlap with a light-receiving region.

Figure 22:
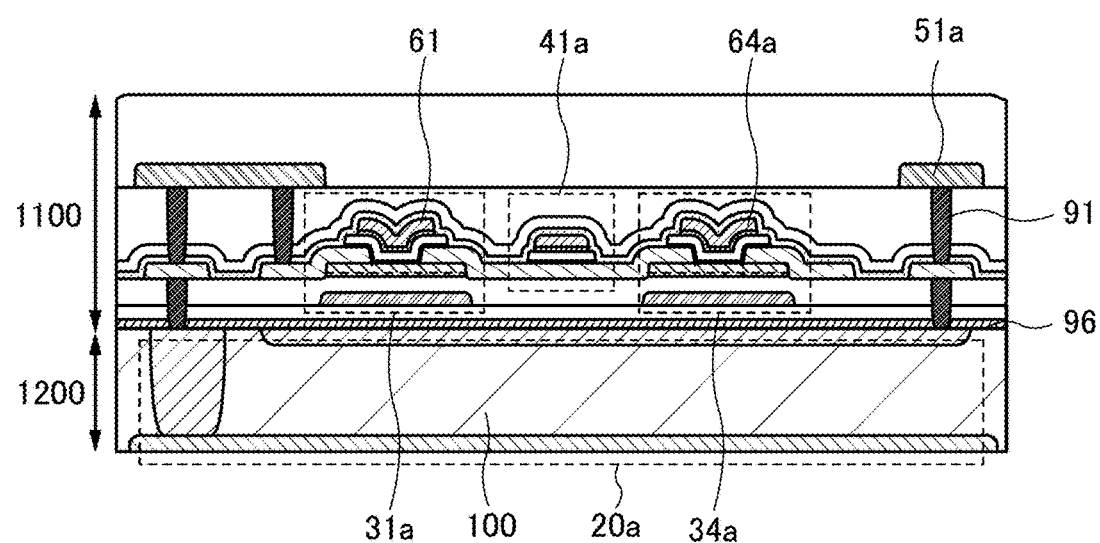
FIG. 22 is a cross-sectional view illustrating the structure of an imaging device.

Alternatively, as illustrated in FIG. 22, the photoelectric conversion element 20*a* may be a photodiode including a silicon substrate 100 as a photoelectric conversion layer.

The photoelectric conversion element 20*a* formed using the aforementioned selenium-based material, amorphous silicon, or the like can be formed through general semiconductor manufacturing processes such as a deposition process, a lithography process, and an etching process. Therefore, the imaging device of one embodiment of the present invention can be manufactured with a high yield at low cost. In contrast, a photodiode including the silicon substrate 100 as the photoelectric conversion layer requires difficult processes such as a polishing process and a bonding process.

Figure 23A:
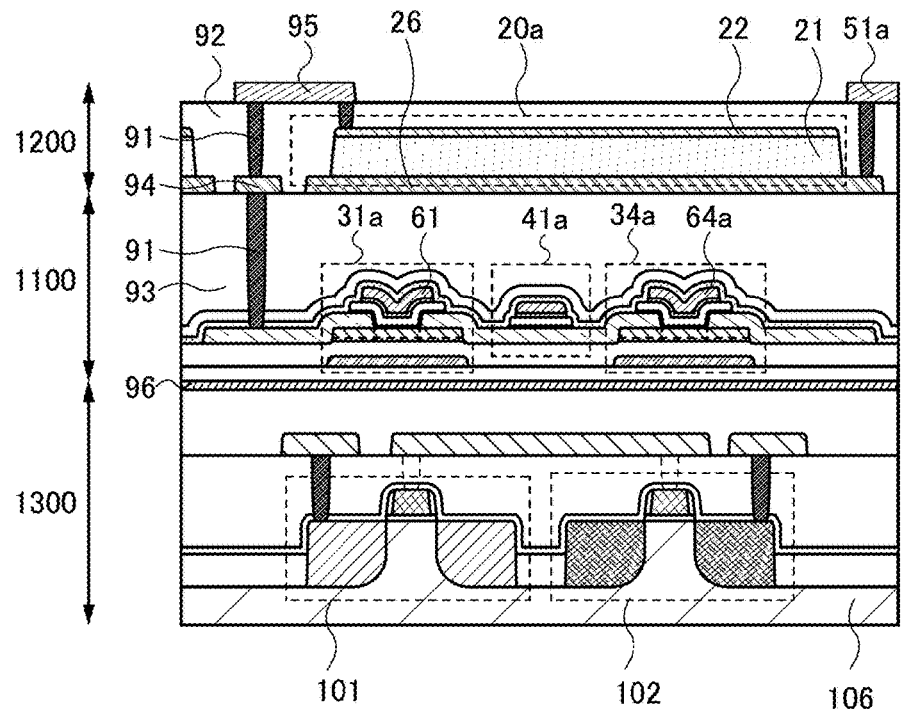
FIGS. 23A to 23C are cross-sectional views and a circuit diagram illustrating an imaging device.
Figure 23B:
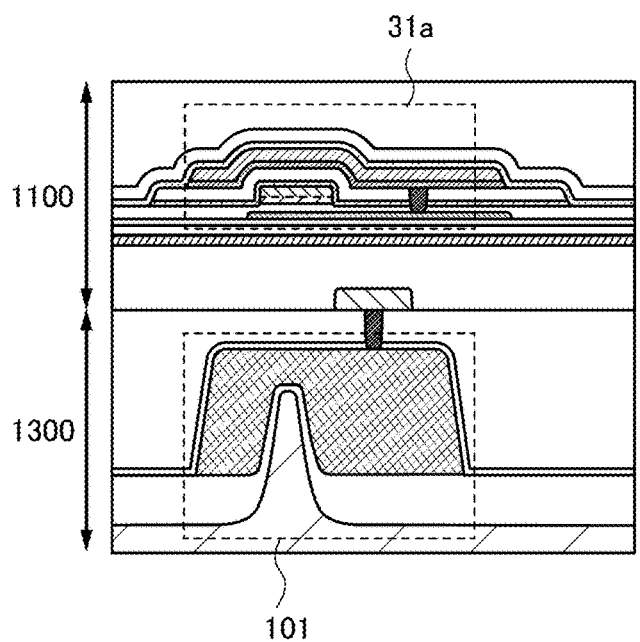

Furthermore, the imaging device of one embodiment of the present invention may have a multilayer structure including a silicon substrate 106 in which a circuit is formed. For example, as illustrated in FIG. 23A, the pixel circuit may overlap with a layer 1300 that includes a transistor 101 and a transistor 102 whose active regions are formed in the silicon substrate 106. FIG. 23B is a cross-sectional view illustrating the transistors in the channel width direction shown in FIG. 23A.

Figure 23C:
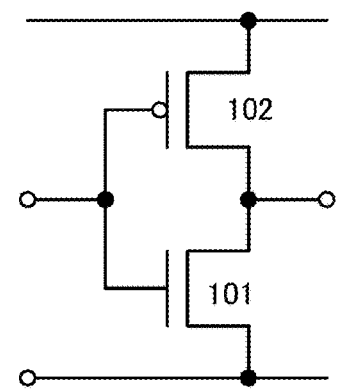

The circuit formed in the silicon substrate 106 can function as a driving circuit for reading a signal that is output from the pixel and converting the signal, for example. The circuit may include, for example, a CMOS inverter as illustrated in the circuit diagram in FIG. 23C. A gate of the transistor 101 (n-ch transistor) is electrically connected to a gate of the transistor 102 (p-ch transistor). One of a source and a drain of one of the transistors 101 and 102 is electrically connected to one of a source and a drain of the other transistor. The other of the source and the drain of the one transistor and the other of the source and the drain of the other transistor are electrically connected to different wirings.

Each of the silicon substrate 100 illustrated in FIG. 22 and the silicon substrate 106 illustrated in FIG. 23A is not limited to a bulk silicon substrate and can be a substrate made of germanium, silicon germanium, silicon carbide, gallium arsenide, aluminum gallium arsenide, indium phosphide, gallium nitride, or an organic semiconductor.

Here, as illustrated in FIG. 22 and FIG. 23A, an insulating layer 96 is provided between a region including an oxide semiconductor transistor and a region including a Si device (a Si transistor or a Si photodiode).

Dangling bonds of silicon are terminated with hydrogen in insulating layers provided in the vicinities of the active regions of the transistors 101 and 102. Therefore, the hydrogen has an effect of improving the reliability of the transistors 101 and 102. Meanwhile, hydrogen in insulating layers provided in the vicinity of the oxide semiconductor layer that is the active layer of the transistor 31*a* or the like causes generation of carriers in the oxide semiconductor layer, and thus may reduce the reliability of the transistor 31*a* or the like. For this reason, the insulating layer 96 that has a function of preventing diffusion of hydrogen is preferably provided between one layer including the Si transistor and another layer stacked thereover that includes the OS transistor. Hydrogen is confined in the one layer by the insulating layer 96, so that the reliability of the transistors 101 and 102 can be improved. Furthermore, diffusion of hydrogen from the one layer to the other layer is inhibited, leading to an improvement in the reliability of the transistor 31*a*, which is an OS transistor, or the like.

The insulating layer 96 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Note that as illustrated in FIG. 23A, a circuit (e.g., a driver circuit) formed in the silicon substrate 106, the transistor 31a or the like, and the photoelectric conversion element 20a or the like can overlap with each other; thus, the integration degree of pixels can be increased. In other words, the resolution of the imaging device can be increased. Such a structure is suitable for an imaging device with, for example, 4K2K, 8K4K, or 16K8K pixels. Note that since the 8K4K imaging device includes thirty-three million pixels, it can also be referred to as "33M." For example, the transistor 33 included in the pixel 10 can be a Si transistor, and the photoelectric conversion element 20a, the transistors 31a, 32, and 34a, and the capacitor 41a can overlap with the transistor 33. In that case, the transistors 31a, 32, and 34a are OS transistors.

In the imaging device in FIG. 23A, the photoelectric conversion element 20a is not provided on the silicon substrate 106. Therefore, an optical paths for the photoelectric conversion element 20a can be ensured without being influenced by the transistors or wirings, and a pixel with a high aperture ratio can be formed.

Figure 24A:
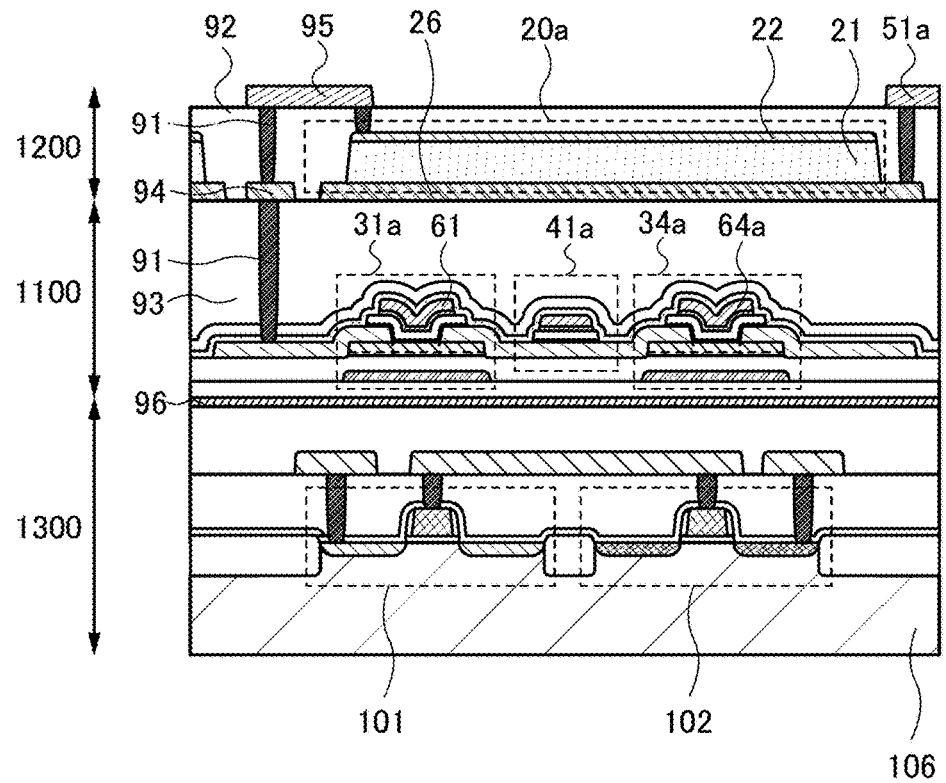
FIGS. 24A and 24B are cross-sectional views each illustrating an imaging device.
Figure 24B:
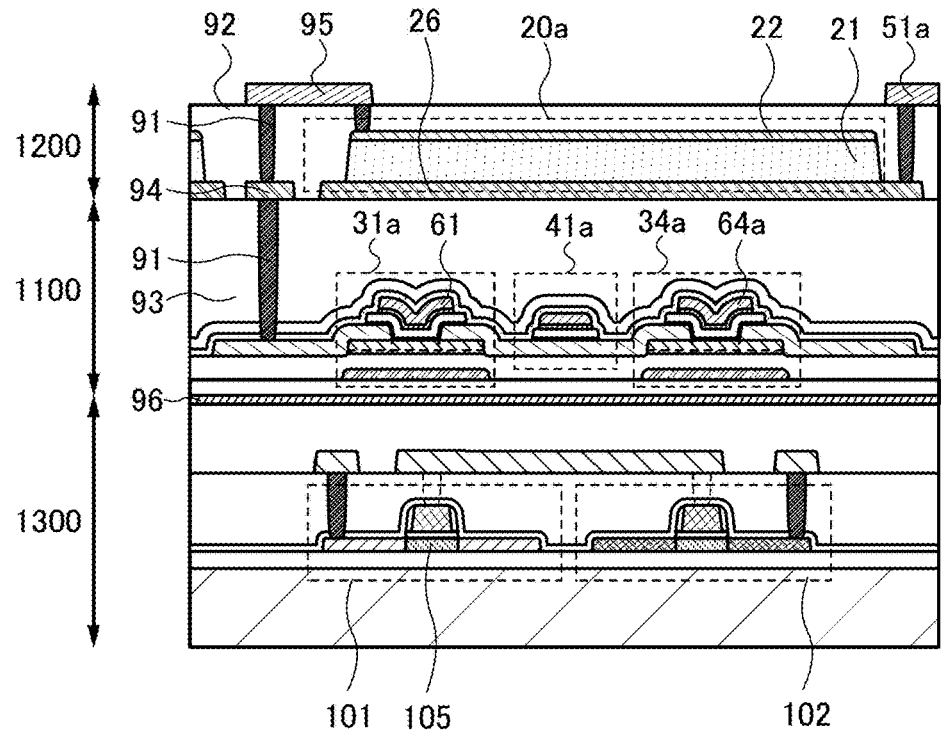

Although FIGS. 23A and 23B show fin type Si transistors, planar type transistors may be used as illustrated in FIG. 24A. Alternatively, as illustrated in FIG. 24B, transistors each including an active layer 105 formed using a silicon thin film may be used. The active layer 105 can be formed using polycrystalline silicon or single crystal silicon of a silicon-on-insulator (SOI) structure.

Figure 25:
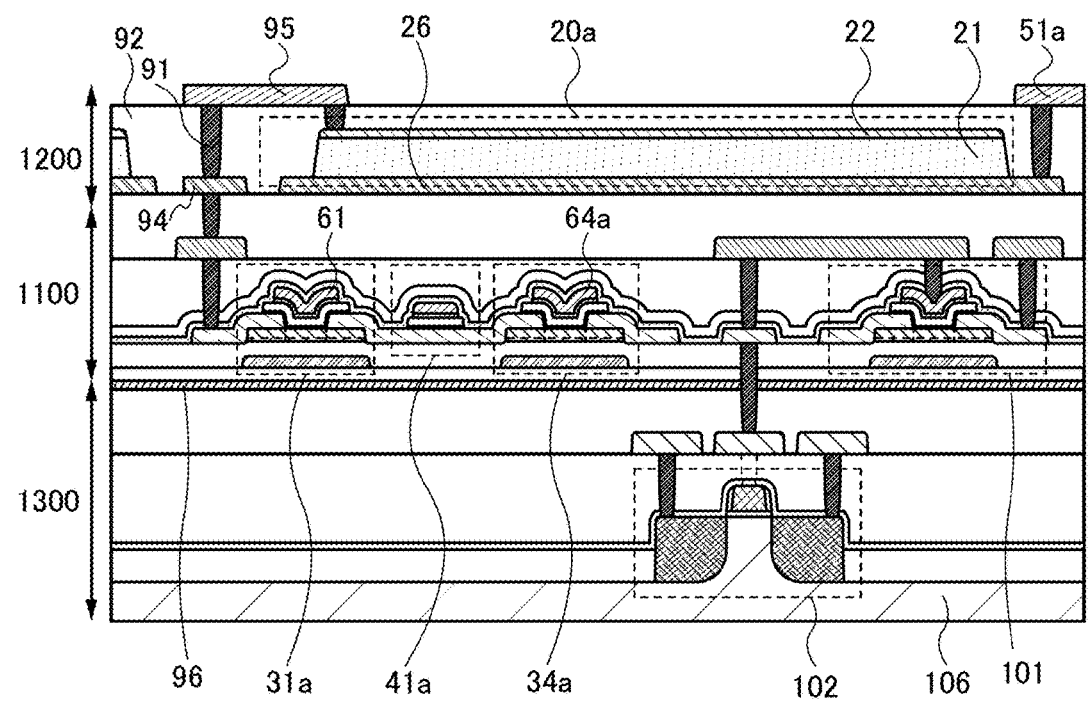
FIG. 25 is a cross-sectional view illustrating an imaging device.

The imaging device of one embodiment of the present invention can also have a structure in FIG. 25. An imaging device in FIG. 25 is a modification example of the imaging device in FIG. 23A. A CMOS inverter is formed using an OS transistor and a Si transistor.

Here, the transistor 102 provided in the layer 1300 is a p-ch Si transistor, and the transistor 101 provided in the layer 1100 is an n-ch OS transistor. When only the p-ch transistor is provided in the silicon substrate 106, a step of forming a well, an n-type impurity layer, or the like can be omitted.

Although selenium or the like is used for the photoelectric conversion element 20a in the imaging device in FIG. 25, a thin film PIN photodiode may be used as in FIG. 20.

In the imaging device in FIG. 25, the transistor 101 can be formed through the same process as the transistors 31a and 34a formed in the layer 1100. Thus, the manufacturing process of the imaging device can be simplified.

Figure 26A:
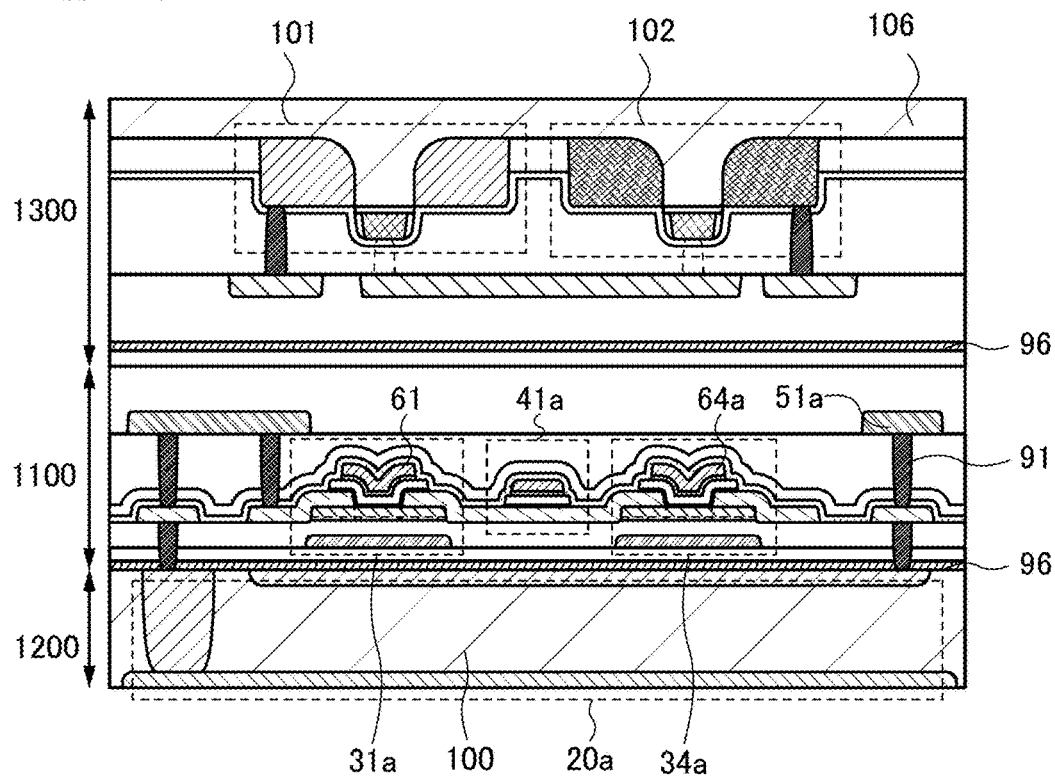
FIGS. 26A and 26B are cross-sectional views each illustrating an imaging device.
Figure 26B:
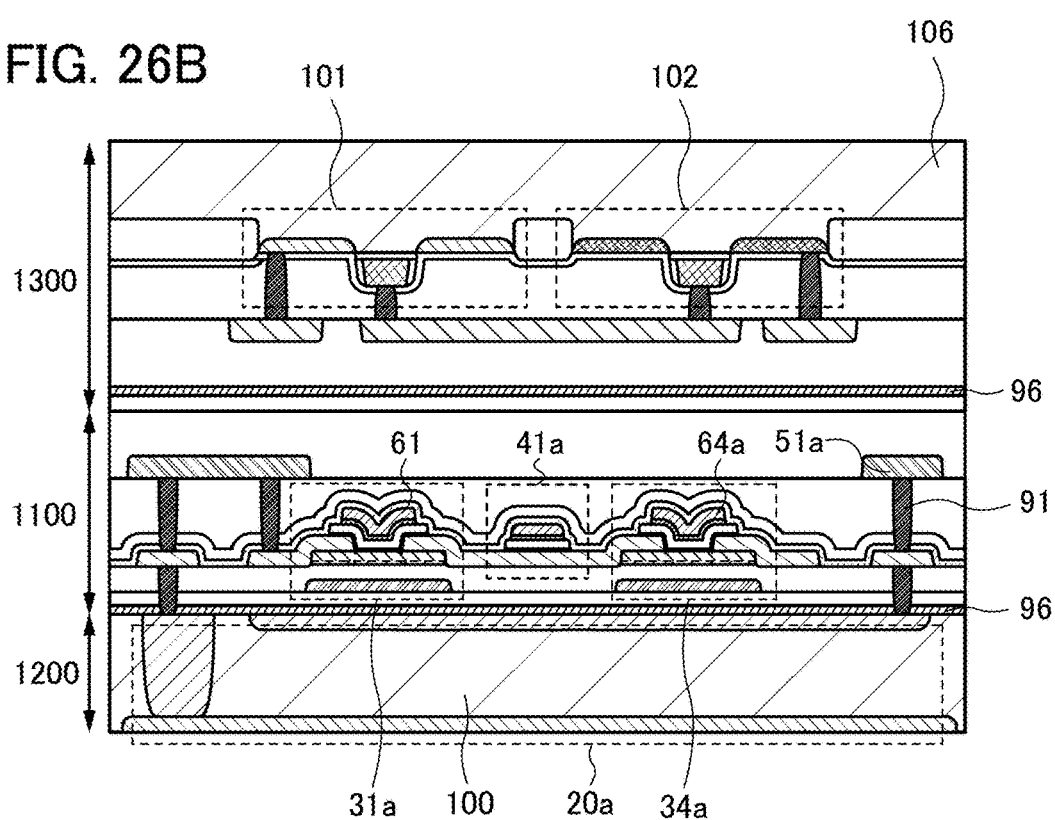

As illustrated in FIGS. 26A and 26B, the imaging device of one embodiment of the present invention may have a structure where a pixel includes the photoelectric conversion element 20a formed on a silicon substrate 100 and OS transistors formed over the photoelectric conversion element 20a and the pixel and the silicon substrate 106 on which the circuit is formed are attached to each other. The layer 1300 in FIG. 26A has a structure similar to that of the layer 1300 in FIG. 23A, and the layer 1300 in FIG. 26B has a structure similar to that of the layer 1300 in FIG. 24A. Such a structure facilitates increase in the effective area of the photoelectric conversion element 20a formed on the silicon substrate 100. Furthermore, when the integration degree of the circuit formed in the silicon substrate 106 is improved using miniaturized Si transistors, a high-performance semiconductor device can be provided.

Figure 27:
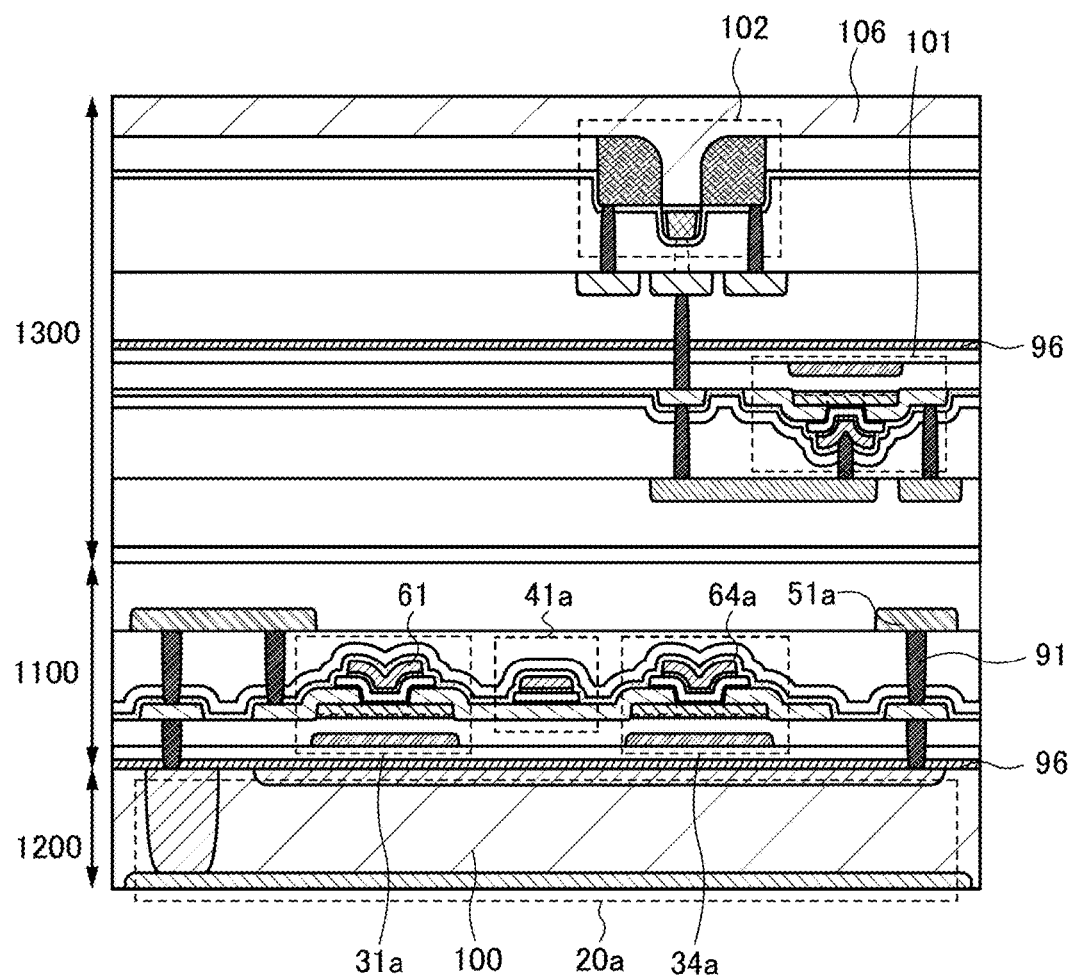
FIG. 27 is a cross-sectional view illustrating an imaging device.

FIG. 27 shows a modification example of FIGS. 26A and 26B, in which the circuit includes an OS transistor and a Si transistor. Such a structure facilitates increase in the effective area of the photoelectric conversion element 20a formed on the silicon substrate 100. Furthermore, when the integration degree of the circuit formed in the silicon substrate 106 is improved using miniaturized Si transistors, a high-performance semiconductor device can be provided.

In the case of the structure illustrated in FIG. 27, a CMOS circuit can be formed using the Si transistor on the silicon substrate 106 and the OS transistor thereon. Since the off-state current of the OS transistor is extremely low, the static leakage current of the CMOS circuit can be extremely low.

Note that the structure of the transistor and the photoelectric conversion element included in the imaging device described in this embodiment is only an example. Therefore, for example, one or more of the transistors 31a, 32, 33, and 34a can be Si transistors. Alternatively, one of or both the transistors 101 and 102 may be OS transistors.

Figure 28A:
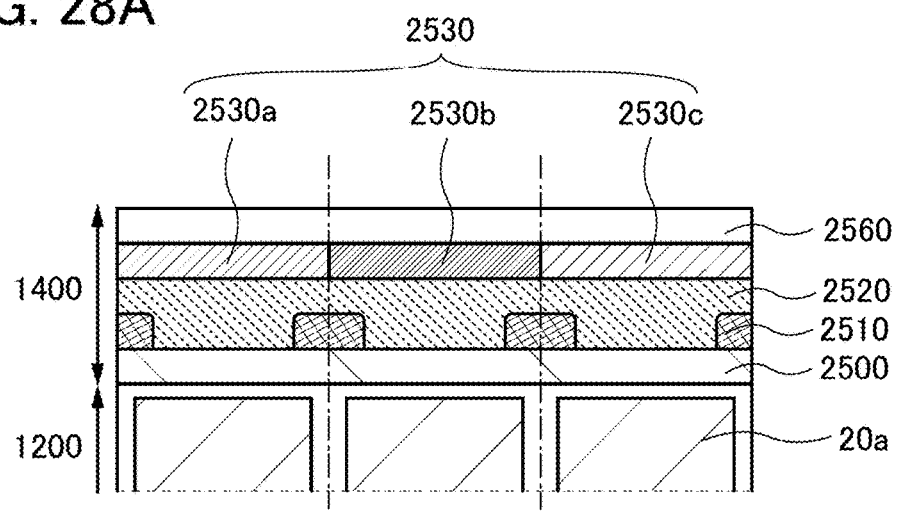
FIGS. 28A to 28C are cross-sectional views each illustrating the structure of an imaging device.

FIG. 28A is a cross-sectional view of an example of a mode in which a color filter and the like are added to the imaging device. The cross-sectional view illustrates part of a region for three pixels. An insulating layer 2500 is formed over the layer 1200 where the photoelectric conversion element 20a is formed. As the insulating layer 2500, for example, a silicon oxide film with a high visible-light transmitting property can be used. In addition, a silicon nitride film may be stacked as a passivation film. In addition, a dielectric film of hafnium oxide or the like may be stacked as an anti-reflection film.

A light-blocking layer 2510 may be formed over the insulating layer 2500. The light-blocking layer 2510 has a function of inhibiting color mixing of light passing through the upper color filter. The light-blocking layer 2510 can be formed of a metal layer of aluminum, tungsten, or the like, or a stack including the metal layer and a dielectric film functioning as an anti-reflection film.

An organic resin layer 2520 can be formed as a planarization film over the insulating layer 2500 and the light-blocking layer 2510. A color filter 2530 (color filters 2530a, 2530b, and 2530c) is formed in each pixel. For example, the color filters 2530a, 2530b, and 2530c each have a color of red (R), green (G), blue (B), yellow (Y), cyan (C), magenta (M), or the like, so that a color image can be obtained.

A light-transmitting insulating layer 2560 or the like can be provided over the color filter 2530.

Figure 28B:
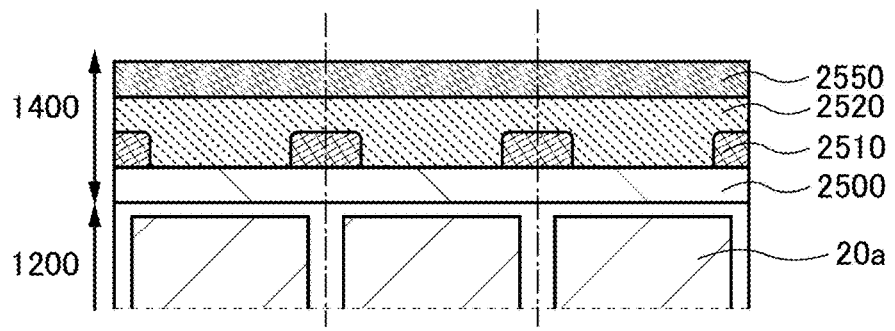

As illustrated in FIG. 28B, an optical conversion layer 2550 may be used instead of the color filter 2530. Such a structure enables the imaging device to take images in various wavelength regions.

For example, when a filter that blocks light having a wavelength shorter than or equal to that of visible light is used as the optical conversion layer 2550, an infrared imaging device can be obtained. When a filter that blocks light having a wavelength shorter than or equal to that of near infrared light is used as the optical conversion layer 2550, a far infrared imaging device can be obtained. When a filter that blocks light having a wavelength longer than or equal to that of visible light is used as the optical conversion layer 2550, an ultraviolet imaging device can be obtained.

Furthermore, when a scintillator is used as the optical conversion layer 2550, an imaging device that takes an image visualizing the intensity of radiations and is used for an X-ray imaging device or the like can be obtained. Radiation such as X-rays passes through a subject to enter a scintillator, and then is converted into light (fluorescence) such as visible light or ultraviolet light owing to a phenomenon known as photoluminescence. Then, the photoelectric conversion element 20a detects the light to obtain image data. Furthermore, the imaging device having the structure may be used in a radiation detector or the like.

A scintillator is formed of a substance that, when irradiated with radiation such as X-rays or gamma-rays, absorbs energy of the radiation to emit visible light or ultraviolet light. For example, a resin or ceramics in which any of $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, and ZnO is dispersed can be used.

In the photoelectric conversion element 20a including a selenium-based material, radiation such as X-rays can be directly converted into charge; thus, the scintillator is unnecessary.

Figure 28C:
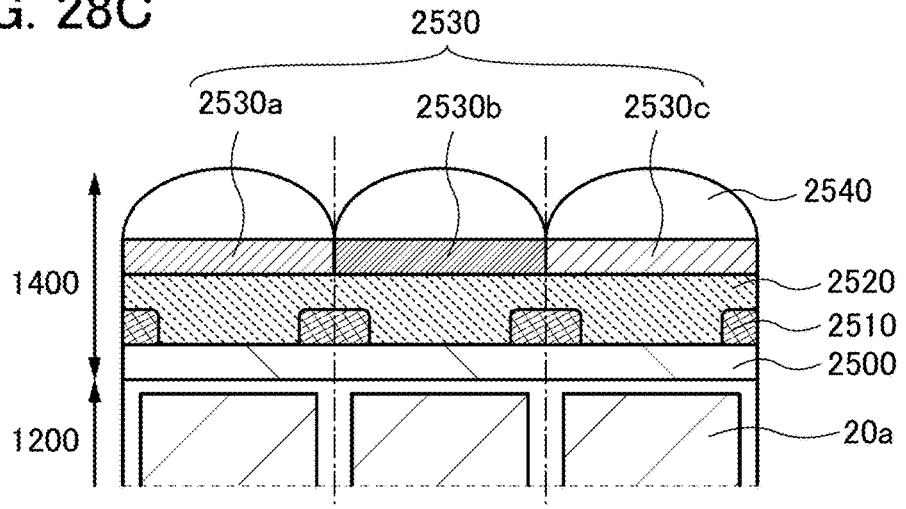

Alternatively, as illustrated in FIG. 28C, a microlens array 2540 may be provided over the color filters 2530a, 2530b, and 2530c. Light transmitting lenses included in the microlens array 2540 passes through the color filters positioned thereunder and enters the photoelectric conversion element 20a. Note that a region other than the layer 1200 in FIGS. 28A to 28C is referred to as a layer 1400.

Figure 29:
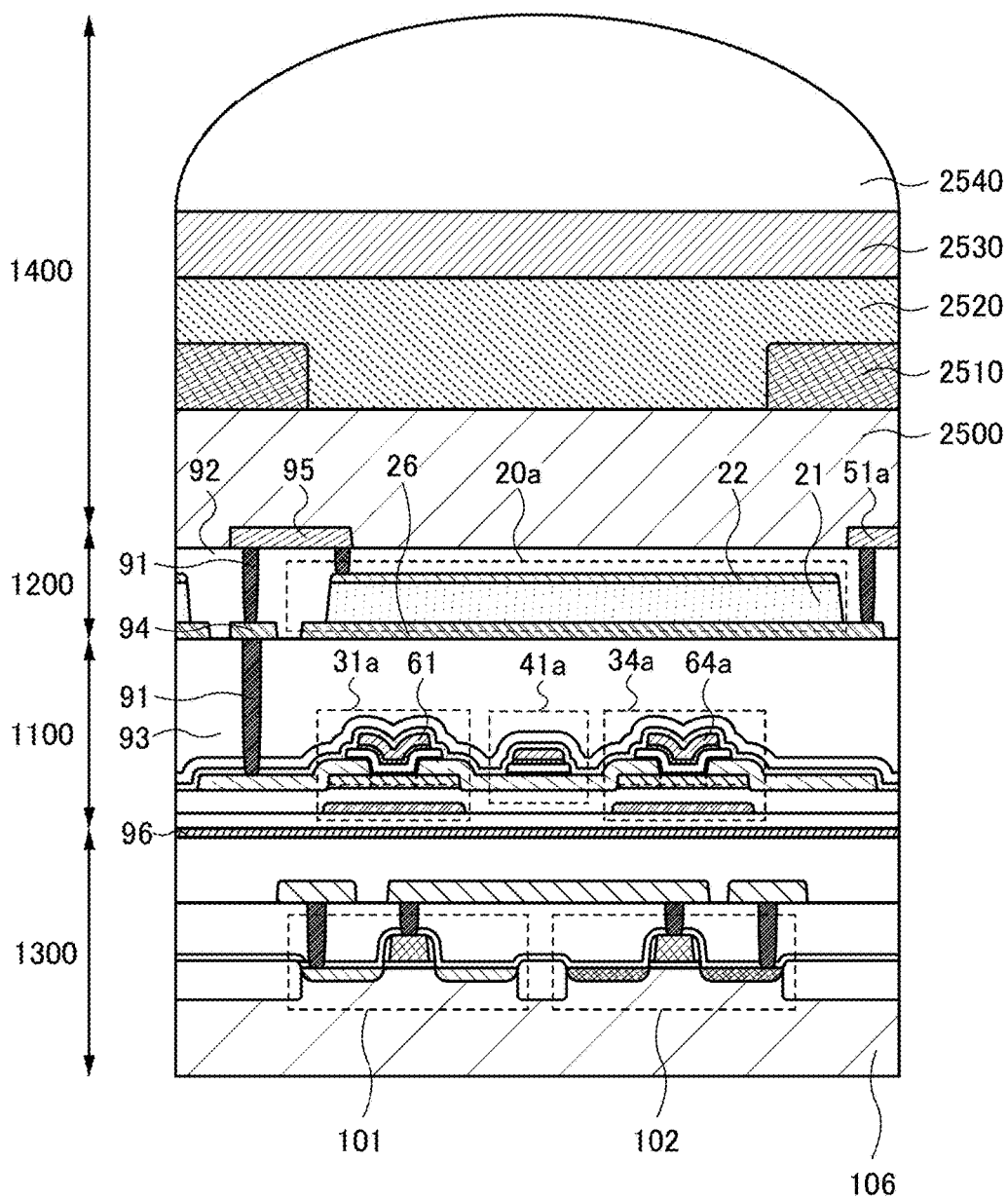
FIG. 29 is a cross-sectional view illustrating the structure of an imaging device.
Figure 30:
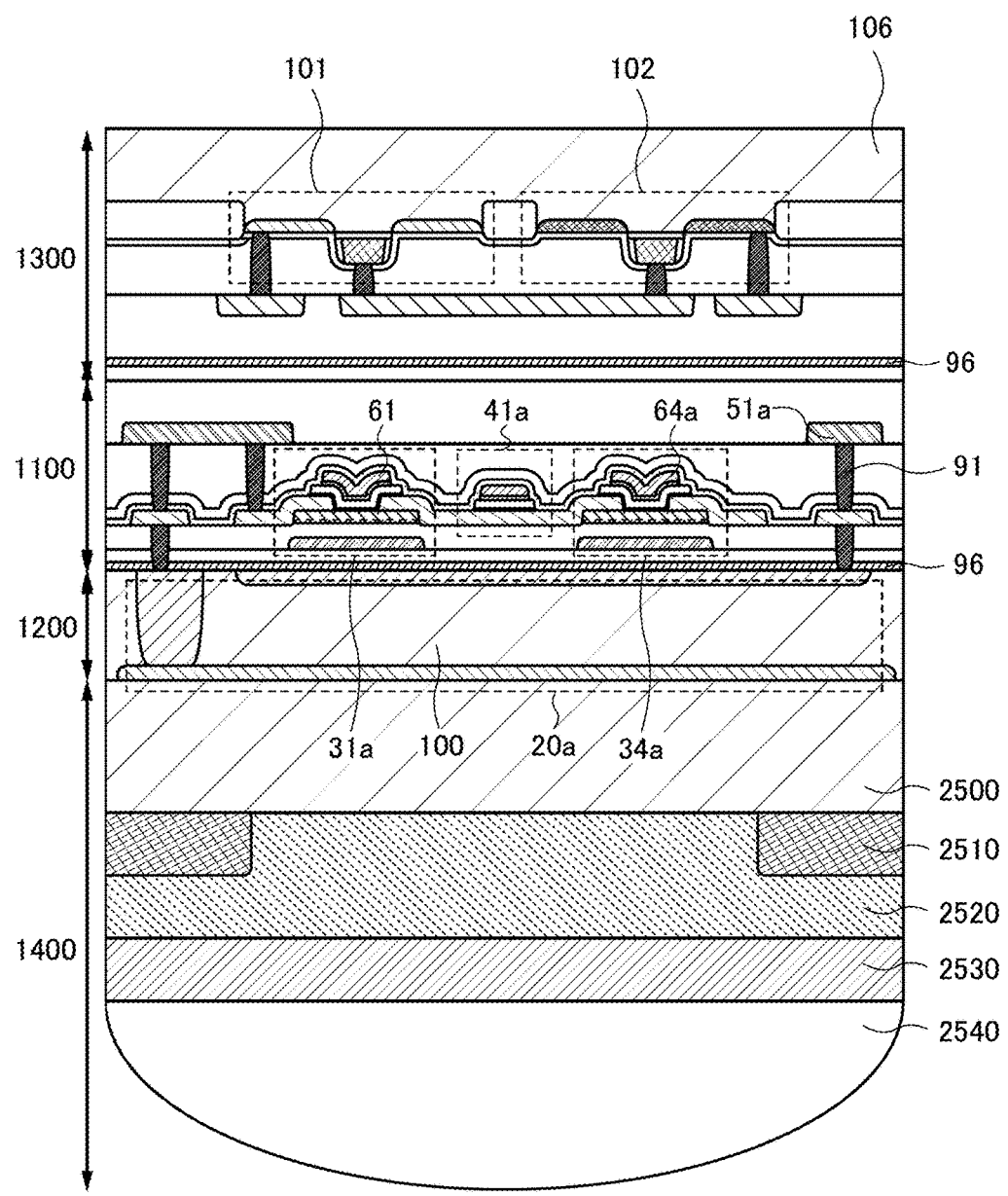
FIG. 30 is a cross-sectional view illustrating the structure of an imaging device.

FIG. 29 and FIG. 30 illustrate a specific layered structure including the pixel 10a of one embodiment of the present invention, the microlens array 2540 illustrated in FIG. 28C, and the like. In the example illustrated in FIG. 29, the structure of the pixel illustrated in FIG. 24A is used. In the case of using the pixel illustrated in FIG. 26B, a structure illustrated in FIG. 30 is employed.

The photoelectric conversion element 20a, the pixel 10a, and the driver circuit can be positioned so as to overlap with each other in this manner, leading to a reduction in the size of the imaging device.

Figure 31:
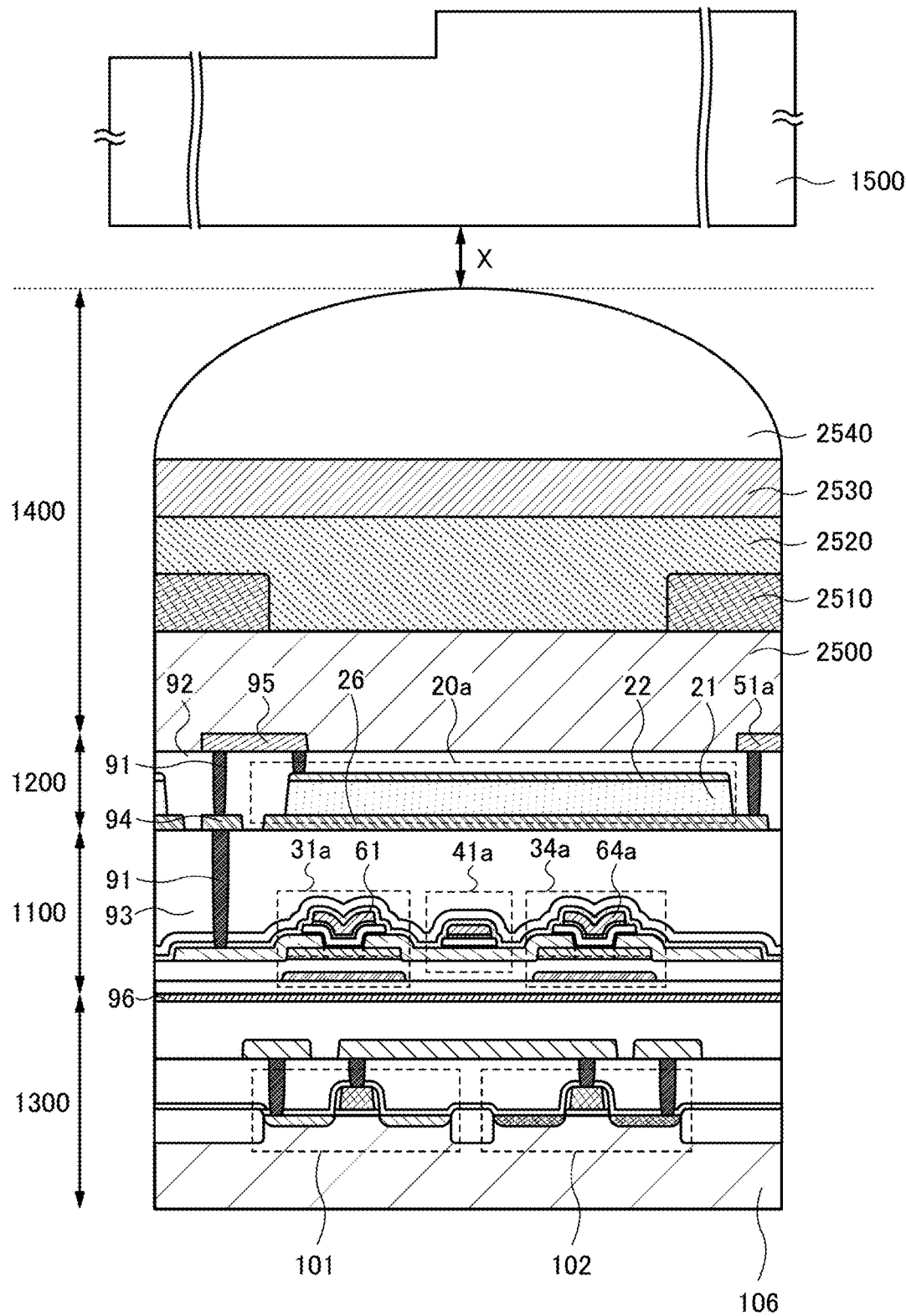
FIG. 31 is a cross-sectional view illustrating the structure of an imaging device.
Figure 32:
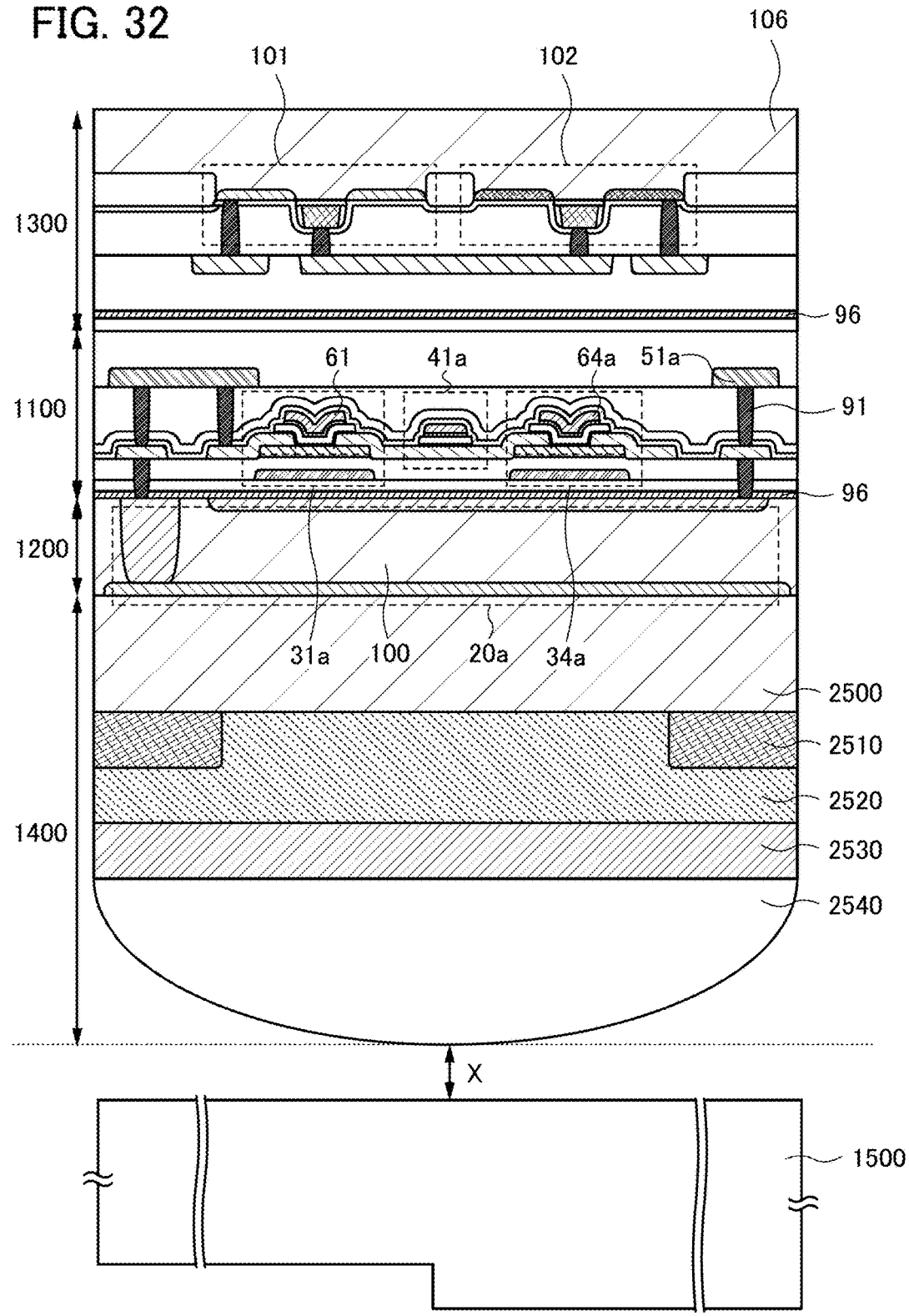
FIG. 32 is a cross-sectional view illustrating the structure of an imaging device.

As illustrated in FIG. 31 and FIG. 32, a diffraction grating 1500 may be provided above the microlens array 2540. An image of an object through the diffraction grating 1500 (i.e., a diffraction pattern) can be scanned into a pixel, and an input image (an object image) can be formed from a captured image in the pixel by arithmetic processing. In addition, the use of the diffraction grating 1500 instead of a lens can reduce the cost of the imaging device.

The diffraction grating 1500 can be formed using a light-transmitting material An inorganic insulating film such as a silicon oxide film or a silicon oxynitride film can be used, for example. Alternatively, an organic insulating film such as an acrylic resin film or a polyimide resin film may be used. Alternatively, a stack of the inorganic insulating film and the organic insulating film may be used.

In addition, the diffraction grating 1500 can be formed by a lithography process using a photosensitive resin or the like. Alternatively, the diffraction grating 1500 can be formed by a lithography process and an etching process. Alternatively, the diffraction grating 1500 can be formed by nanoimprint lithography, laser scribing, or the like.

A space X may be provided between the diffraction grating 1500 and the microlens array 2540. The space X can be less than or equal to 1 mm, preferably less than or equal to 100 mm. The space may be an empty space or may be a sealing layer or an adhesion layer formed using a light-transmitting material. For example, an inert gas such as nitrogen or a rare gas can be sealed in the space. Alternatively, an acrylic resin, an epoxy resin, a polyimide resin, or the like may be provided in the space. Alternatively, a liquid such as silicone oil may be provided. Even in the case where the microlens array 2540 is not provided, the space X may be provided between the color filter 2530 and the diffraction grating 1500.

Note that in FIGS. 16A to 16C, FIGS. 17A to 17C, FIGS. 18A to 18C, FIGS. 19A and 19B, FIG. 20, FIGS. 21A to 21F, FIG. 22, FIGS. 23A to 23C, FIGS. 24A to 24B, FIG. 25, FIGS. 26A and 26B, FIG. 27, FIGS. 28A to 28C, FIG. 29, FIG. 30, FIG. 31, and FIG. 32, the structures and connections of the photoelectric conversion elements, the transistors, and the capacitors, which are included in the pixels 10b, 10c, and 10d shown in FIG. 1, are similar to those in the pixel 10a.

As illustrated in FIGS. 33A1 and 33B1, the imaging device may be bent. FIG. 33A1 illustrates a state in which the imaging device is bent in the direction of dashed-two dotted line X1-X2. FIG. 33A2 is a cross-sectional view illustrating a portion indicated by dashed-two dotted line X1-X2 in FIG. 33A1. FIG. 33A3 is a cross-sectional view illustrating a portion indicated by dashed-two dotted line Y1-Y2 in FIG. 33A1.

FIG. 33B1 illustrates a state where the imaging device is bent in the direction of dashed-two dotted line X3-X4 and the direction of dashed-two dotted line Y3-Y4. FIG. 33B2 is a cross-sectional view illustrating a portion indicated by two-dotted chain line X3-X4 in FIG. 33B1. FIG. 33B3 is a cross-sectional view illustrating a portion indicated by two-dot chain line Y3-Y4 in FIG. 33B1.

Bending the imaging device can reduce field curvature and astigmatism. Thus, the optical design of lens and the like, which is used in combination with the imaging device, can be facilitated. For example, the number of lenses used for aberration correction can be reduced; accordingly, the size or weight of semiconductor devices including the imaging device can be easily reduced. In addition, the quality of a captured image can be improved.

This embodiment can be implemented in appropriate combinations with the configurations described in the other embodiments.

Embodiment 4

In this embodiment, a transistor containing an oxide semiconductor that can be used in one embodiment of the present invention is described with reference to drawings. In the drawings in this embodiment, some components are enlarged, reduced in size, or omitted for easy understanding.

Figure 34A:
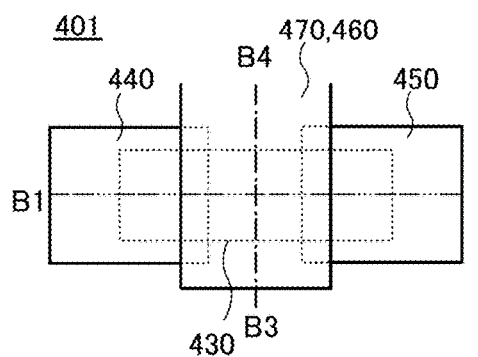
FIGS. 34A to 34F are top views and cross-sectional views illustrating transistors.
Figure 34B:
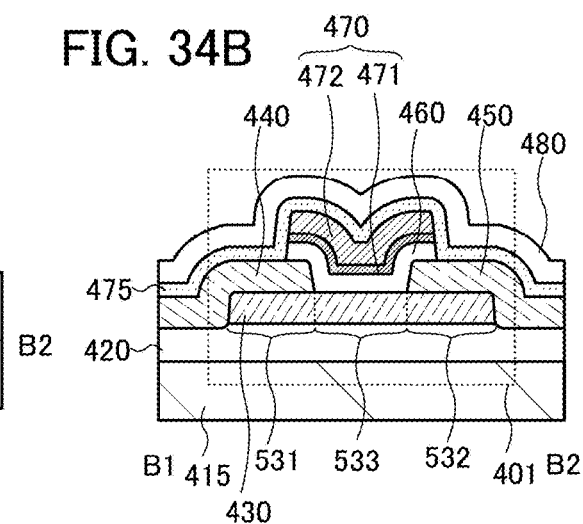
Figure 36A:
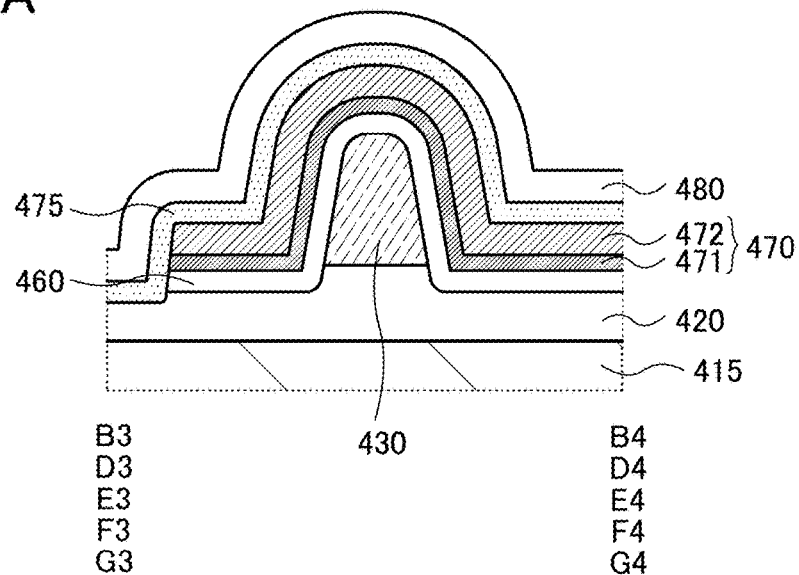
FIGS. 36A to 36D each illustrate a cross section of a transistor in a channel width direction.

FIG. 34A is a top view illustrating a transistor 401 in one embodiment of the present invention. A cross section in the direction of dashed-dotted line B1-B2 in FIG. 34A is illustrated in FIG. 34B. A cross section in the direction of dashed-dotted line B3-B4 in FIG. 34A is illustrated in FIG. 36A. Note that the direction of dashed-dotted line B1-B2 is referred to as a channel length direction, and the direction of dashed-dotted line B3-B4 is referred to as a channel width direction, in some cases.

The transistor 401 includes a substrate 415, an insulating layer 420, an oxide semiconductor layer 430, a conductive layer 440, a conductive layer 450, an insulating layer 460, a conductive layer 470, an insulating layer 475, and an insulating layer 480.

The insulating layer 420 is in contact with the substrate 415. The oxide semiconductor layer 430 is in contact with the insulating layer 420. The conductive layer 440 and the conductive layer 450 are in contact with the insulating layer 420 and the oxide semiconductor layer 430. The insulating layer 460 is in contact with the insulating layer 420, the oxide semiconductor layer 430, the conductive layer 440, and the conductive layer 450. The conductive layer 470 is in contact with the insulating layer 460. The insulating layer 475 is in contact with the insulating layer 420, the conductive layer 440, the conductive layer 450, and the conductive layer 470. The insulating layer 480 is in contact with the insulating layer 475.

Here, in the oxide semiconductor layer 430, a region in contact with the conductive layer 440, a region in contact with the conductive layer 450, and a region in contact with the insulating layer 460 are referred to as a region 531, a region 532, and a region 533, respectively.

Furthermore, the conductive layers 440 and 450 are electrically connected to the oxide semiconductor layer 430.

The conductive layer 440 can function as one of a source and a drain. The conductive layer 450 functions as the other of the source and the drain. The insulating layer 460 functions as a gate insulating layer. The conductive layer 470 functions as a gate.

The region 531, the region 532, and the region 533 that are illustrated in FIG. 34B functions as one of a source region and a drain region, the other of the source region and the drain region, and a channel formation region, respectively.

Each of the conductive layers 440 and 450 is a single layer in the drawing, but also may be a stack of two or more layers. The conductive layer 470 includes two layers, a conductive layer 471 and a conductive layer 472, in the drawing, but also may be a single layer or a stack of three or more layers. The same applies to other transistors described in this embodiment.

The insulating layer 480 may function as a planarization film as necessary.

Figure 34C:
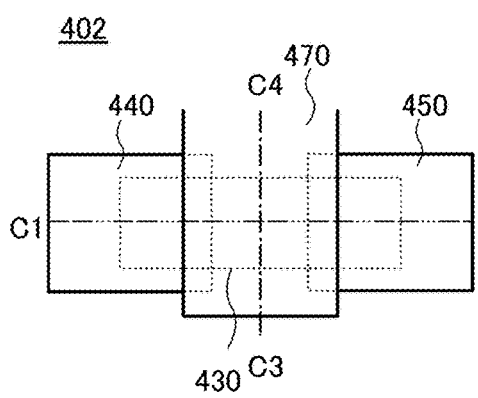
Figure 34D:
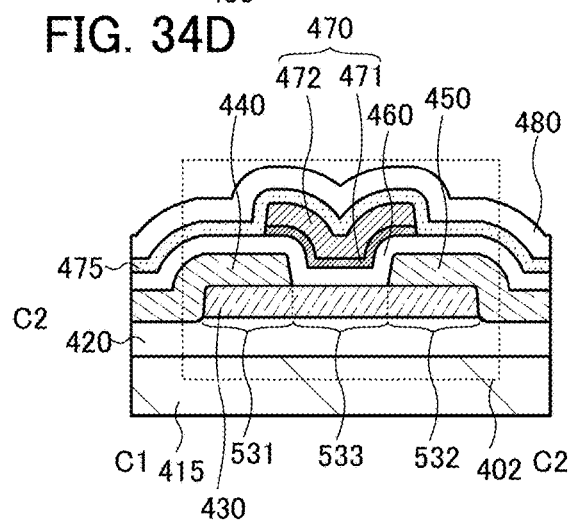
Figure 36B:
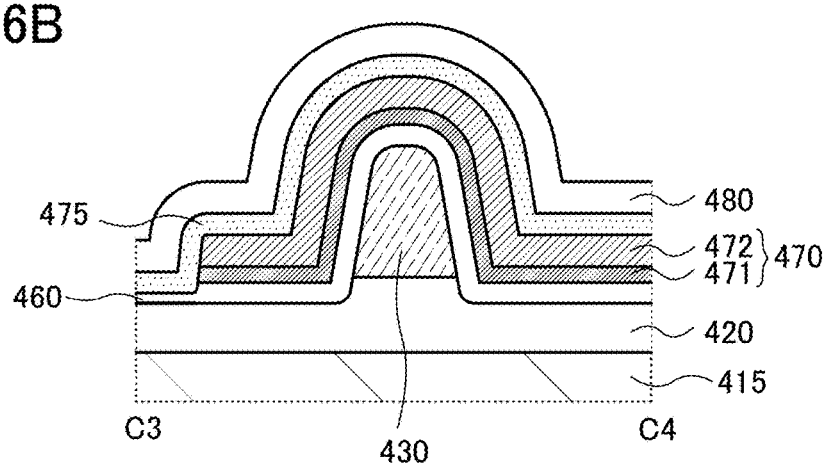

The transistor in one embodiment of the present invention may have a structure illustrated in FIGS. 34C and 34D. FIG. 34C is a top view of a transistor 402. A cross section in the direction of dashed-dotted line C1-C2 in FIG. 34C is illustrated in FIG. 34D. A cross section in the direction of dashed-dotted line C3-C4 in FIG. 34C is illustrated in FIG. 36B. The direction of dashed-dotted line C1-C2 is referred to as a channel length direction, and the direction of dashed-dotted line C3-C4 is referred to as a channel width direction in some cases.

The transistor 402 is different from the transistor 401 in that an end portion of the insulating layer 460 is not aligned with an end portion of the conductive layer 470. In the transistor 402, wide areas of the conductive layers 440 and 450 are covered with the insulating layer 460 and accordingly the electric resistance between the conductive layer 470 and the conductive layers 440 and 450 is high; therefore, the transistor 402 has a feature of a low gate leakage current.

The transistors 401 and 402 each have a top-gate structure including regions where the conductive layer 470 overlaps with the conductive layers 440 and 450. To reduce parasitic capacitance, the width of each of the regions in the channel length direction is preferably greater than or equal to 3 nm and less than 300 nm. Since an offset region is not formed in the oxide semiconductor layer 430 in this structure, a transistor with a high on-state current can be easily formed.

Figure 34E:
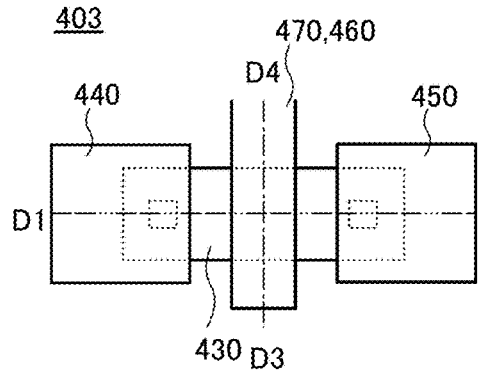
Figure 34F:
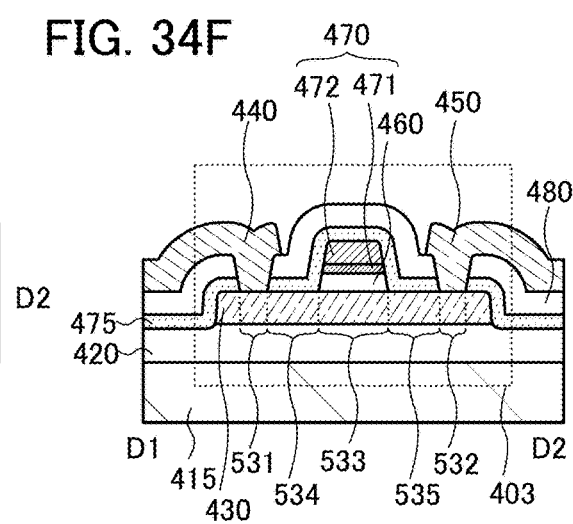

The transistor in one embodiment of the present invention may have a structure illustrated in FIGS. 34E and 34F. FIG. 34E is a top view of a transistor 403. A cross section in the direction of dashed-dotted line D1-D2 in FIG. 34E is illustrated in FIG. 34F. A cross section in the direction of dashed-dotted line D3-D4 in FIG. 34E is illustrated in FIG. 36A. The direction of dashed-dotted line D1-D2 is referred to as a channel length direction, and the direction of dashed-dotted line D3-D4 is referred to as a channel width direction.

In the transistor 403, the insulating layer 420 is in contact with the substrate 415; the oxide semiconductor layer 430 is in contact with the insulating layer 420; the insulating layer 460 is in contact with the insulating layer 420 and the oxide semiconductor layer 430; the conductive layer 470 is in contact with the insulating layer 460; the insulating layer 475 is in contact with the insulating layer 420, the oxide semiconductor layer 430, and the conductive layer 470; the insulating layer 480 is in contact with the insulating layer 475; and the conductive layer 440 and the conductive layer 450 are in contact with the oxide semiconductor layer 430 and the insulating layer 480.

Openings are formed in the insulating layers 475 and 480, and the conductive layers 440 and 450 are electrically connected to the oxide semiconductor layer 430 through the openings.

The transistor 403 may further include, for example, an insulating layer (planarization film) in contact with the conductive layers 440 and 450 and the insulating layer 480 as necessary.

In the oxide semiconductor layer 430, a region that is in contact with the insulating layer 475 and is sandwiched between the region 531 and the region 533 is referred to as a region 534, and a region that is in contact with the insulating layer 475 and is sandwiched between the region 532 and the region 533 is referred to as a region 535.

Figure 35A:
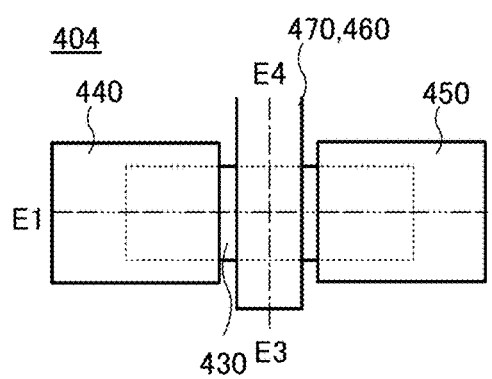
FIGS. 35A to 35F are top views and cross-sectional views illustrating transistors.
Figure 35B:
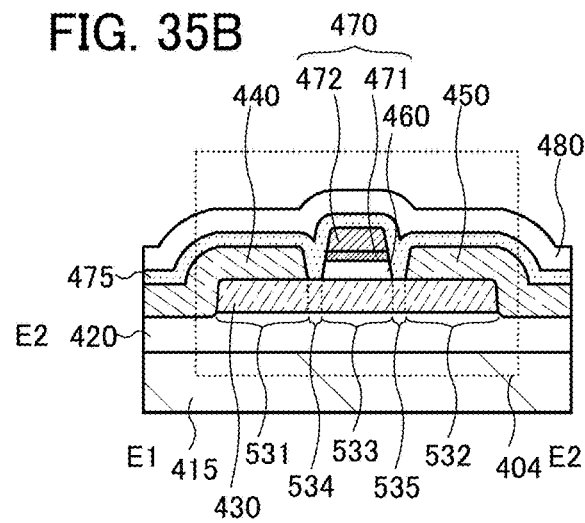

The transistor in one embodiment of the present invention may have a structure illustrated in FIGS. 35A and 35B. FIG. 35A is a top view of a transistor 404. A cross section in the direction of dashed-dotted line E1-E2 in FIG. 35A is illustrated in FIG. 35B. A cross section in the direction of dashed-dotted line E3-E4 in FIG. 35A is illustrated in FIG. 36A. The direction of dashed-dotted line E1-E2 is referred to as a channel length direction, and the direction of dashed-dotted line E3-E4 is referred to as a channel width direction in some cases.

In the transistor 404, the insulating layer 420 is in contact with the substrate 415; the oxide semiconductor layer 430 is in contact with the insulating layer 420; the conductive layers 440 and 450 are in contact with the insulating layer 420 and the oxide semiconductor layer 430; the insulating layer 460 is in contact with the insulating layer 420 and the oxide semiconductor layer 430; the conductive layer 470 is in contact with the insulating layer 460; the insulating layer 475 is in contact with the insulating layer 420, the oxide semiconductor layer 430, the conductive layer 440, the conductive layer 450, and the conductive layer 470; and the insulating layer 480 is in contact with the insulating layer 475.

The transistor 404 is different from the transistor 403 in that the conductive layers 440 and 450 in contact with the oxide semiconductor layer 430 cover end portions of the oxide semiconductor layer 430.

The transistors 403 and 404 each have a self-aligned structure that does not include regions where the conductive layer 470 overlaps with the conductive layers 440 and 450. A transistor with a self-aligned structure, which has extremely low parasitic capacitance between a gate and a source and between the gate and a drain, is suitable for applications that require high-speed operation.

Figure 35C:
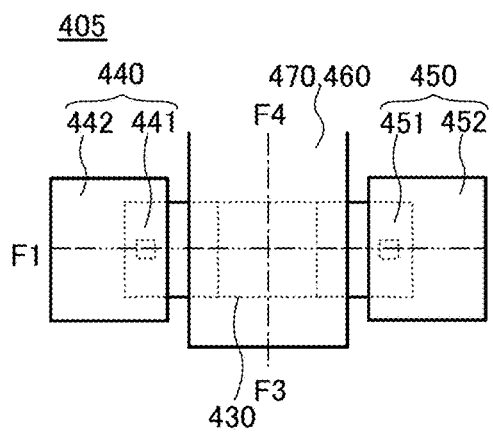
Figure 35D:
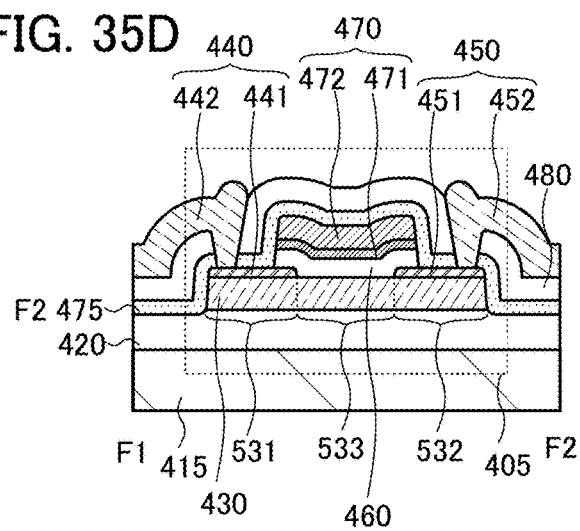

The transistor in one embodiment of the present invention may have a structure illustrated in FIGS. 35C and 35D. FIG. 35C is a top view of a transistor 405. A cross section in the direction of dashed-dotted line F1-F2 in FIG. 35C is illustrated in FIG. 35D. A cross section in the direction of dashed-dotted line F3-F4 in FIG. 35C is illustrated in FIG. 36A. The direction of dashed-dotted line F1-F2 is referred to as a channel length direction, and the direction of dashed-dotted line F3-F4 is referred to as a channel width direction in some cases.

In the transistor 405, the conductive layer 440 includes two layers, a conductive layer 441 and a conductive layer 442, and the conductive layer 450 includes two layers, a conductive layer 451 and a conductive layer 452. The insulating layer 420 is in contact with the substrate 415. The oxide semiconductor layer 430 is in contact with the insulating layer 420. The conductive layer 441 and the conductive layer 451 are in contact with the oxide semiconductor layer 430. The insulating layer 460 is in contact with the insulating layer 420, the oxide semiconductor layer 430, the conductive layer 441, and the conductive layer 451. The conductive layer 470 is in contact with the insulating layer 460. The insulating layer 475 is in contact with the insulating layer 420, the conductive layer 441, the conductive layer 451, and the conductive layer 470. The insulating layer 480 is in contact with the insulating layer 475. The conductive layer 442 is in contact with the conductive layer 441 and the insulating layer 480. The conductive layer 452 is in contact with the conductive layer 451 and the insulating layer 480.

The conductive layers 441 and 451 are in contact with the top surface of the oxide semiconductor layer 430 and are not in contact with a side surface of the oxide semiconductor layer 430.

The transistor 405 may further include, for example, an insulating layer in contact with the conductive layers 442 and 452 and the insulating layer 480 as necessary.

The conductive layer 441 and the conductive layer 451 are electrically connected to the oxide semiconductor layer 430. Furthermore, the conductive layer 442 is electrically connected to the conductive layer 441, and the conductive layer 452 is electrically connected to the conductive layer 451.

In the oxide semiconductor layer 430, a region overlapping with the conductive layer 441 is the region 531 that can function as one of a source region and a drain region, and a region overlapping with the conductive layer 451 is the region 532 that can function as the other of the source region and the drain region.

Figure 35E:
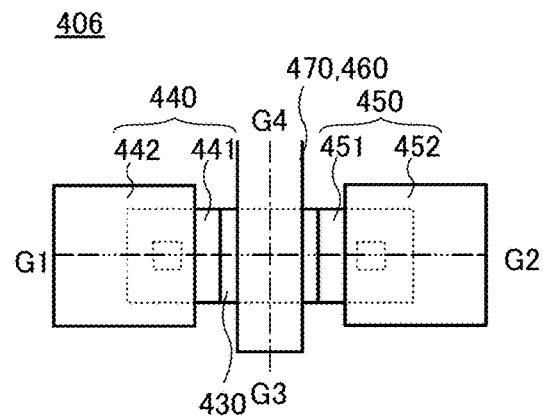
Figure 35F:
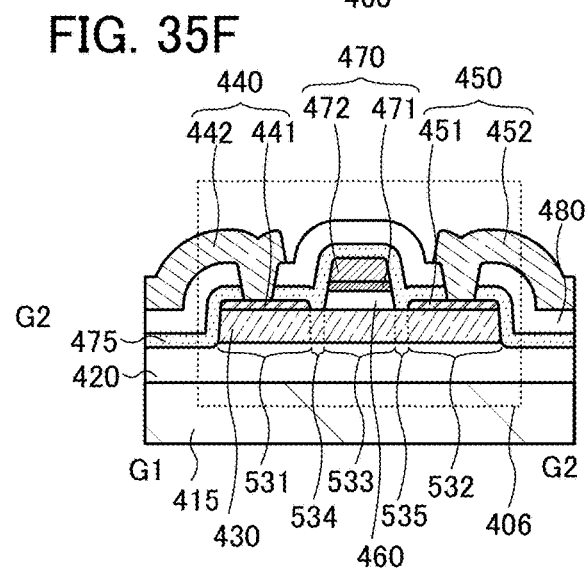

The transistor in one embodiment of the present invention may have a structure illustrated in FIGS. 35E and 35F. FIG. 35E is a top view of a transistor 406. A cross section in the direction of dashed-dotted line G1-G2 in FIG. 35E is illustrated in FIG. 35F. A cross section in the direction of dashed-dotted line G3-G4 in FIG. 35E is illustrated in FIG. 36A. The direction of dashed-dotted line G1-G2 is referred to as a channel length direction, and the direction of dashed-dotted line G3-G4 is referred to as a channel width direction in some cases.

The transistor 406 is different from the transistor 403 in that the conductive layer 440 includes two layers, the conductive layers 441 and 442, and the conductive layer 450 includes two layers, the conductive layers 451 and 452.

In the structures of the transistors 405 and 406, the conductive layers 440 and 450 are not in contact with the insulating layer 420. These structures make the insulating layer 420 less likely to be deprived of oxygen by the conductive layers 440 and 450 and facilitate oxygen supply from the insulating layer 420 to the oxide semiconductor layer 430.

An impurity for forming an oxygen vacancy to increase conductivity may be added to the regions 534 and 535 in the transistor 403, the transistor 404, and the transistor 406. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor. Note that the oxide conductor has a light-transmitting property like the oxide semiconductor.

The oxide conductor is a degenerated semiconductor and it is suggested that the conduction band edge equals or substantially equals the Fermi level. For that reason, an ohmic contact is made between an oxide conductor layer and conductive layers that function as a source and a drain; thus, contact resistance between the oxide conductor layer and the conductive layers that function as a source and a drain can be reduced.

Although the transistors 401 to 406 in FIGS. 34A to 34F, FIGS. 35A to 35F, and FIGS. 36A to 36D are examples in which the oxide semiconductor layer 430 is a single layer, the oxide semiconductor layer 430 may be a stacked layer. FIG. 37A is a top view of the oxide semiconductor layer 430, and FIGS. 37B and 37C are cross-sectional views of the oxide semiconductor layer 430 having a two-layer structure of an oxide semiconductor layer 430a and an oxide semiconductor layer 430b. FIGS. 37D and 37E are cross-sectional views of the oxide semiconductor layer 430 having a three-layer structure of the oxide semiconductor layer 430a, the oxide semiconductor layer 430b, and an oxide semiconductor layer 430c.

The oxide semiconductor layers 430a and 430c can also be referred to as insulating layers because no channel region is formed therein.

Oxide semiconductor layers with different compositions, for example, can be used as the oxide semiconductor layers 430a, 430b, and 430c.

The oxide semiconductor layer 430 in the transistors 401 to 406 can be replaced by the oxide semiconductor layer 430 in FIGS. 37B and 37C or FIGS. 37D and 37E.

Figure 38A:
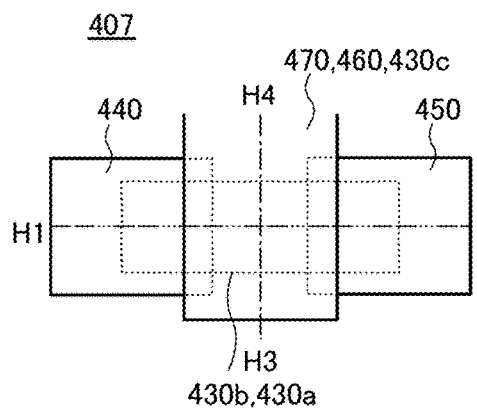
FIGS. 38A to 38F are top views and cross-sectional views illustrating transistors.
Figure 38B:
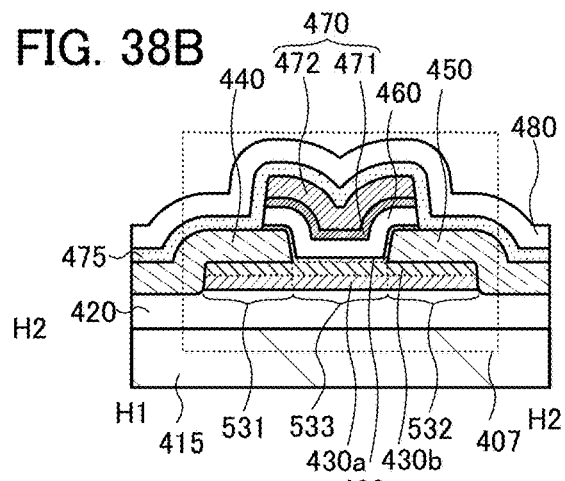
Figure 38C:
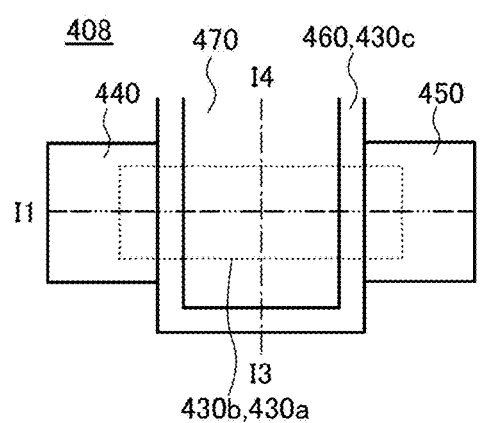
Figure 38D:
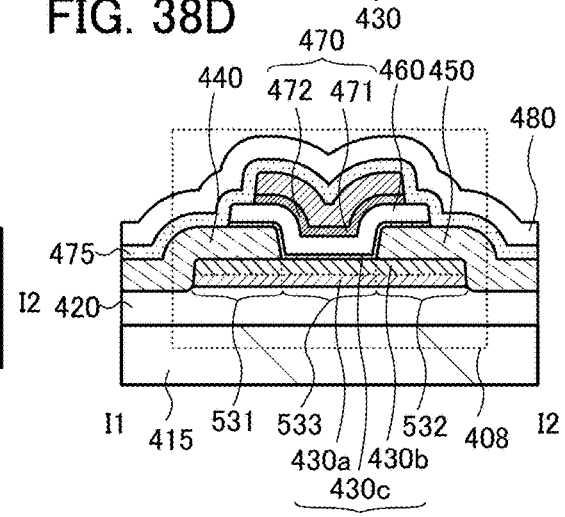
Figure 38E:
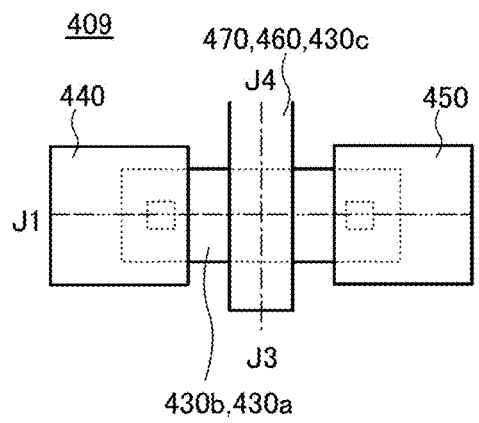
Figure 38F:
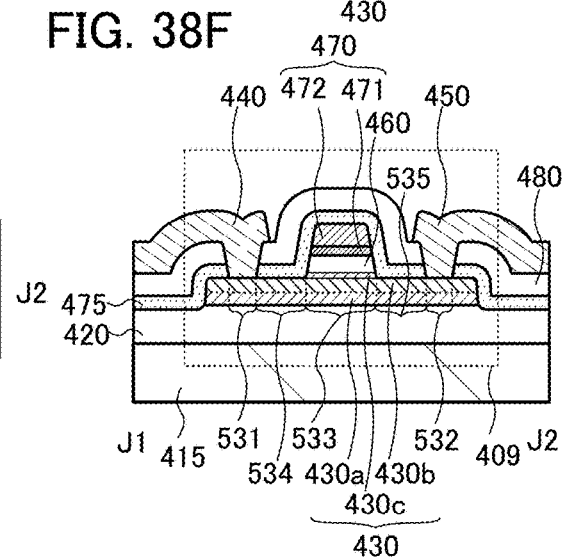
Figure 39A:
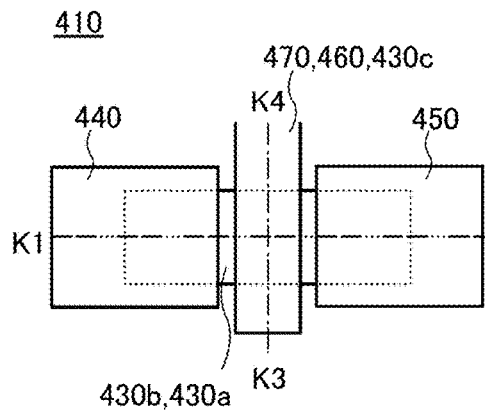
FIGS. 39A to 39F are top views and cross-sectional views illustrating transistors.
Figure 39B:
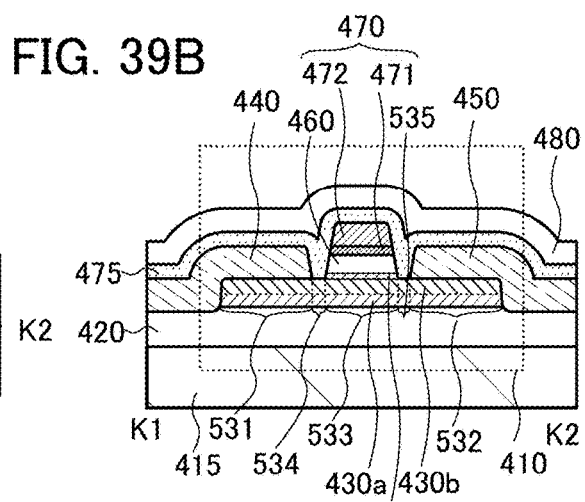
Figure 39C:
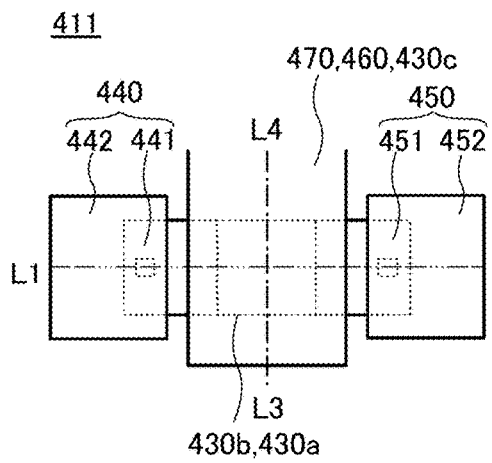
Figure 39D:
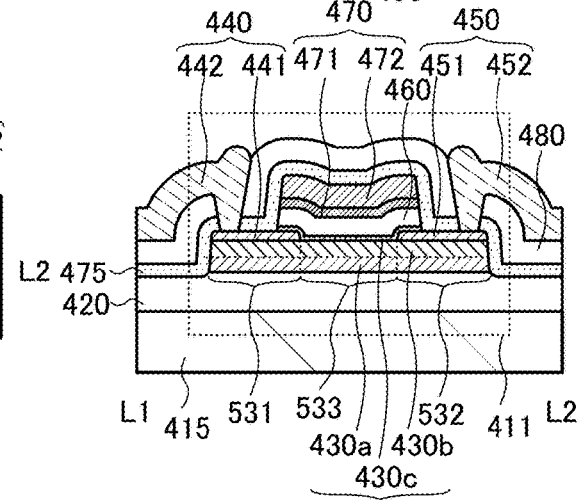
Figure 39E:
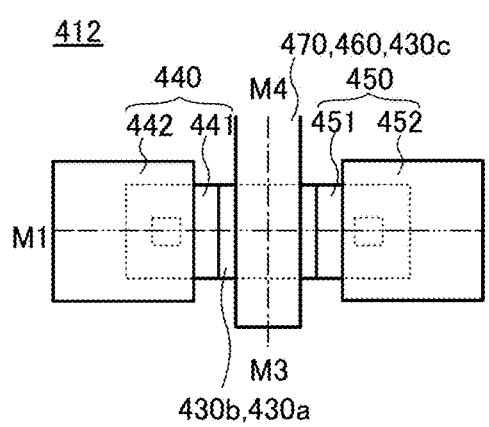
Figure 39F:
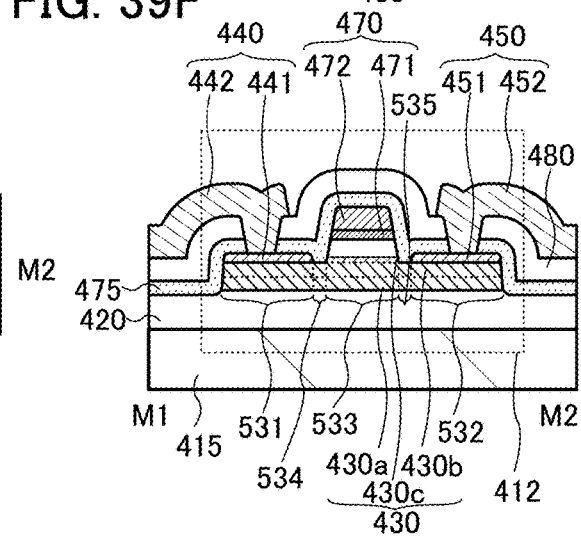
Figure 40A:
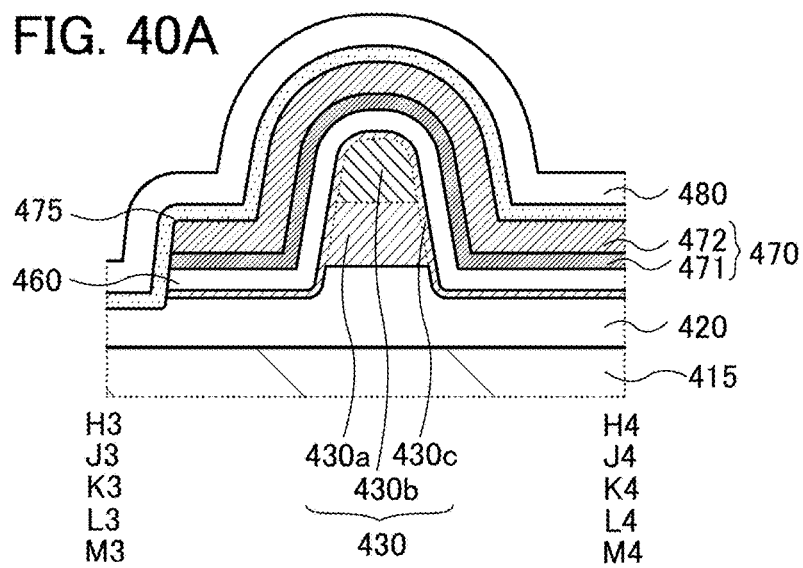
FIGS. 40A to 40D each illustrate a cross section of a transistor in a channel width direction.
Figure 40B:
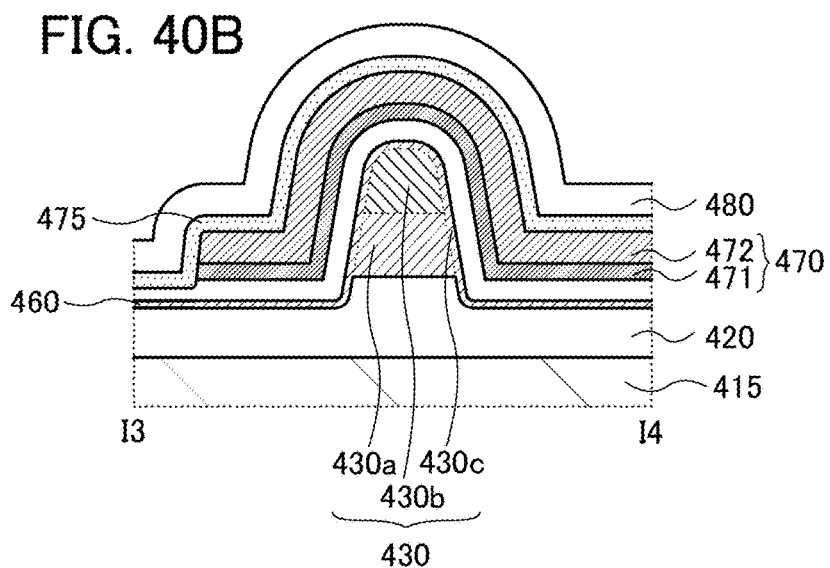

The transistor in one embodiment of the present invention may have a structure illustrated in FIGS. 38A to 38F, FIGS. 39A to 39F, and FIGS. 40A to 40D. FIGS. 38A, 38C, and 38E and FIGS. 39A, 39C, and 39E are top views of transistors 407, 408, 409, 410, 411, and 412, respectively. FIG. 38B is a cross section in the direction of dashed-dotted line H1-H2 in FIG. 38A. FIG. 38D is a cross section in the direction of dashed-dotted line I1-I2 in FIG. 38C. FIG. 38F is a cross section in the direction of dashed-dotted line J1-J2 in FIG. 38E. FIG. 39B is a cross section in the direction of dashed-dotted line K1-K2 in FIG. 39A. FIG. 39D is a cross section in the direction of dashed-dotted line L1-L2 in FIG. 39C. FIG. 39F is a cross section in the direction of dashed-dotted line M1-M2 in FIG. 39E. FIG. 40A illustrates each of cross sections in the directions of dashed-dotted lines H3-H4 in FIG. 38A, J3-J4 in FIG. 38E, K3-K4 in FIG. 39A, L3-L4 in FIG. 39C, and M3-M4 in FIG. 39E. FIG. 40B is a cross section in the direction of dashed-dotted line 13-14 in FIG. 38C. The directions of dashed-dotted lines H1-H2, I1-I2, J1-J2, K1-K2, L1-L2, and M1-M2 may be each referred to as a channel length direction, and the directions of dashed-dotted lines H3-H4, I3-I4, J3-J4, K3-K4, L3-L4, and M3-M4 may be each referred to as a channel width direction.

The transistors 407 and 408 each have the same structure as the transistors 401 and 402 except that the oxide semiconductor layer 430 includes two layers (the oxide semiconductor layers 430a and 430b) in the regions 531 and 532, that the oxide semiconductor layer 430 includes three layers (the oxide semiconductor layers 430a to 430c) in the region 533, and that part of the oxide semiconductor layer (the oxide semiconductor layer 430c) exists between the insulating layer 460 and the conductive layers 440 and 450.

The transistors 409, 410, and 412 each have the same structure as the transistors 403, 404, and 406 except that the oxide semiconductor layer 430 includes two layers (the oxide semiconductor layers 430a and 430b) in the regions 531, 532, 534, and 535 and that the oxide semiconductor layer 430 includes three layers (the oxide semiconductor layers 430a to 430c) in the region 533.

The transistor 411 has the same structure as the transistor 405 except that the oxide semiconductor layer 430 includes two layers (the oxide semiconductor layers 430a and 430b) in the regions 531 and 532, that the oxide semiconductor layer 430 includes three layers (the oxide semiconductor layers 430a to 430c) in the region 533, and that part of the oxide semiconductor layer (the oxide semiconductor layer 430c) exists between the insulating layer 460 and the conductive layers 441 and 451.

Figure 36C:
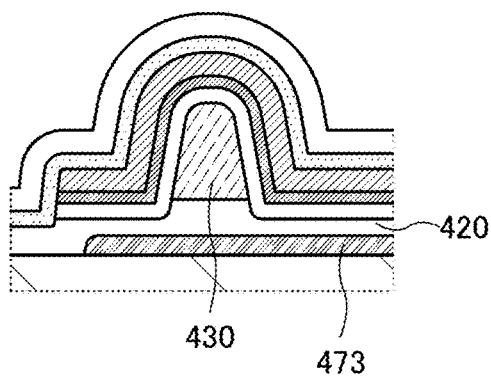
Figure 37A:
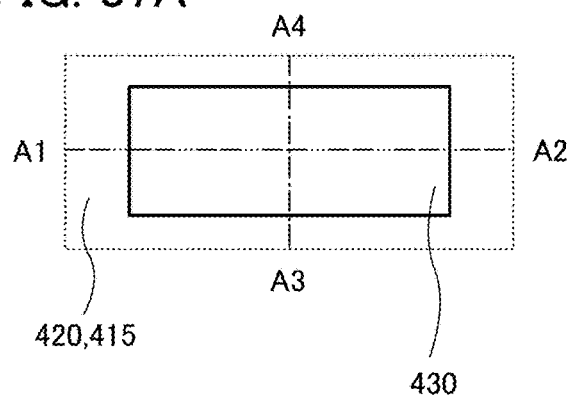
FIGS. 37A to 37E are a top view and cross-sectional views illustrating semiconductor layers.
Figure 37B:
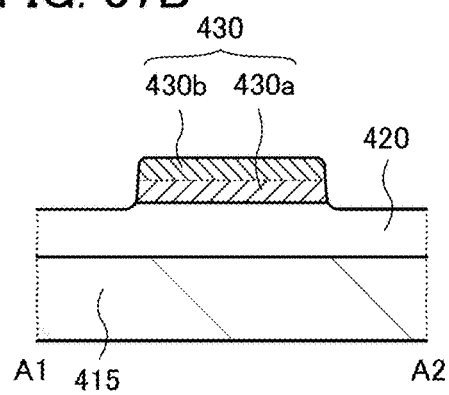
Figure 37D:
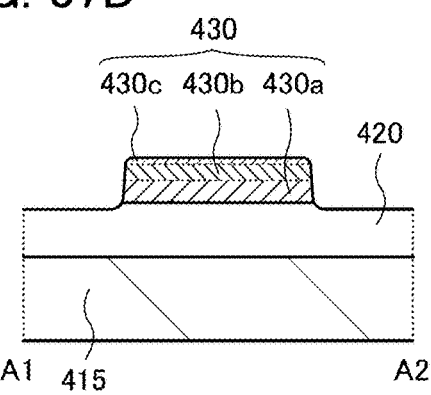
Figure 37C:
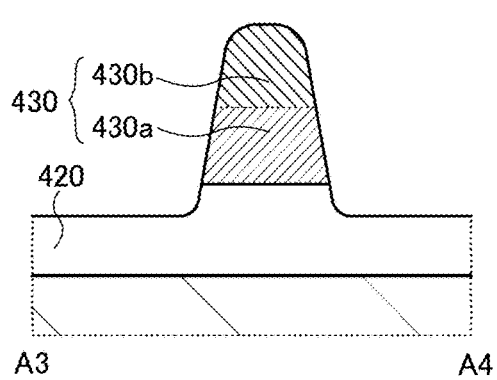
Figure 37E:
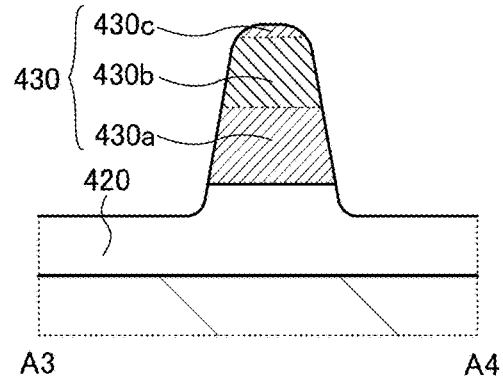
Figure 40C:
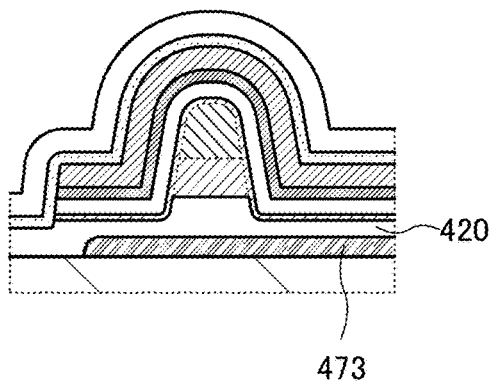

The transistor in one embodiment of the present invention may include a conductive layer 473 between the oxide semiconductor layer 430 and the substrate 415 as illustrated in cross-sectional views in the channel length directions of the transistors 401 to 412 illustrated in FIGS. 41A to 41F and FIGS. 42A to 42F, the cross-sectional view in the channel width direction of each of the transistors 401 to 406 illustrated in FIG. 36C, and the cross-sectional view in the channel width direction of each of the transistors 407 to 412 illustrated in FIG. 40C. The conductive layer 473 is used as a second gate electrode (also referred to as a back gate electrode), whereby the channel formation region in the oxide semiconductor layer 430 is electrically surrounded by the conductive layers 470 and 473. Such a transistor structure is referred to as a surrounded channel (s-channel) structure. Such a structure can increase the on-state current, and can control the threshold voltage. In the cross-sectional views in FIGS. 41A to 41F and FIGS. 42A to 42F, the width of the conductive layer 473 may be smaller than that of the oxide semiconductor layer 430. Moreover, the width of the conductive layer 473 may be shorter than that of the conductive layer 470.

Figure 36D:
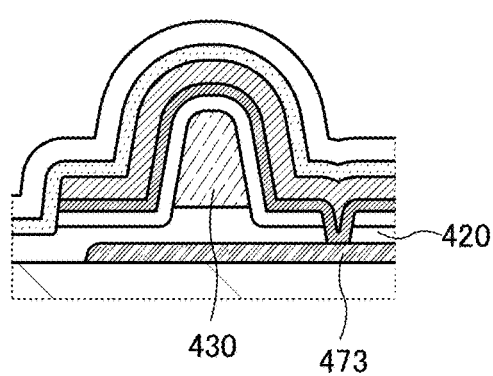
Figure 40D:
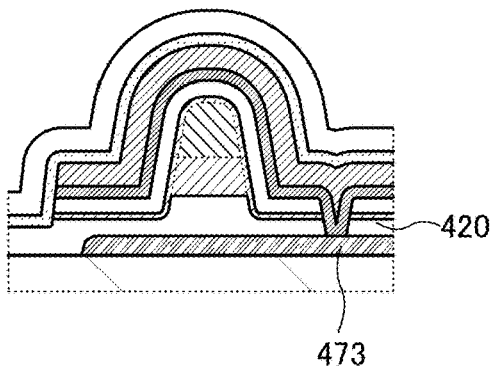
Figure 41A:
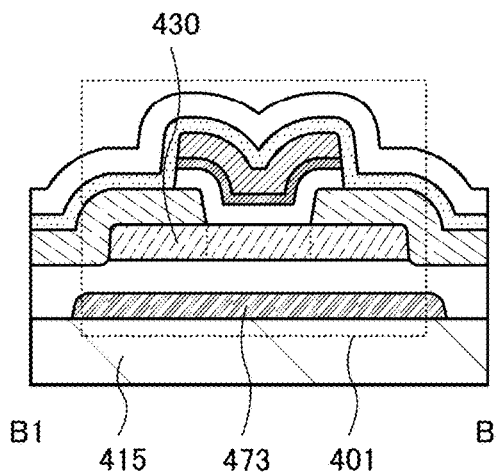
FIGS. 41A to 41F each illustrate a cross section of a transistor in a channel length direction.
Figure 41B:
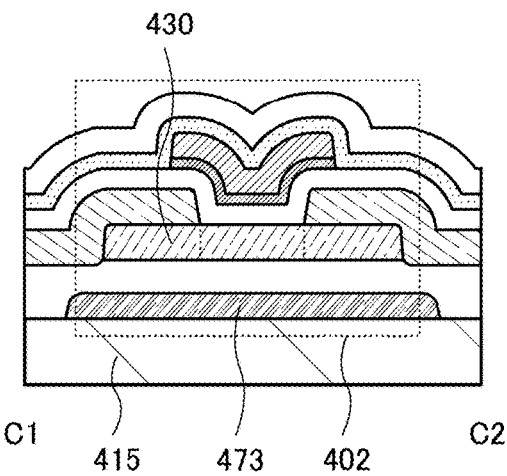
Figure 41C:
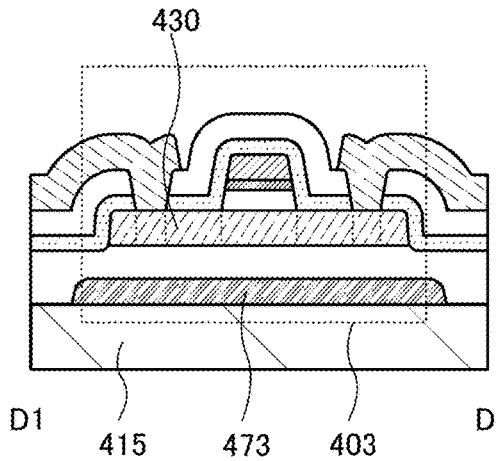
Figure 41D:
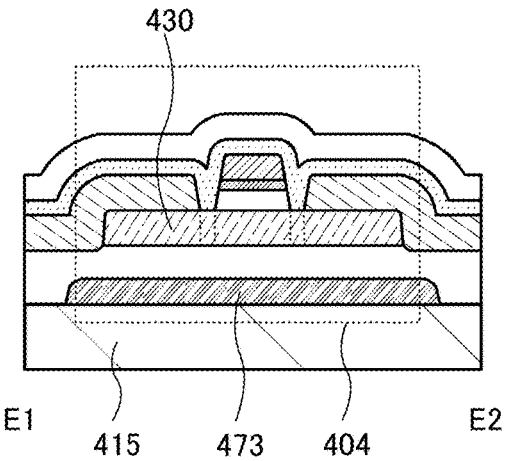
Figure 41E:
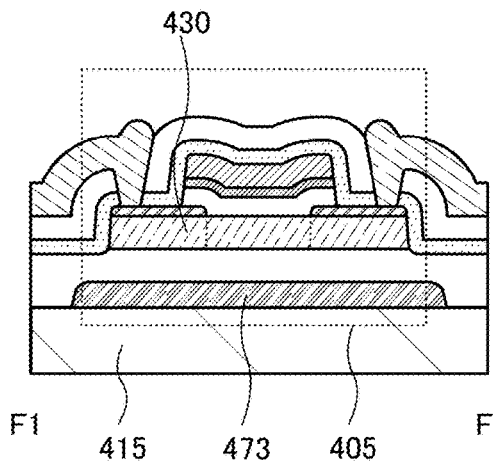
Figure 41F:
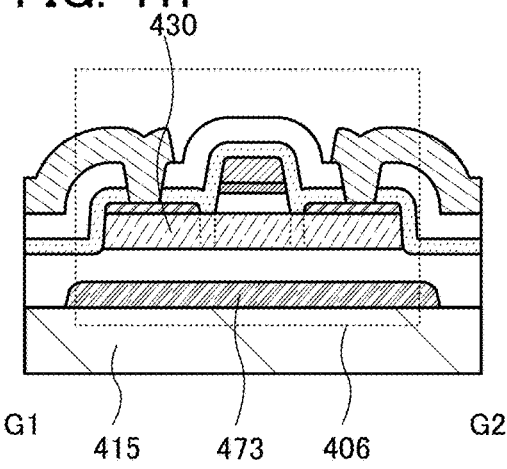
Figure 42A:
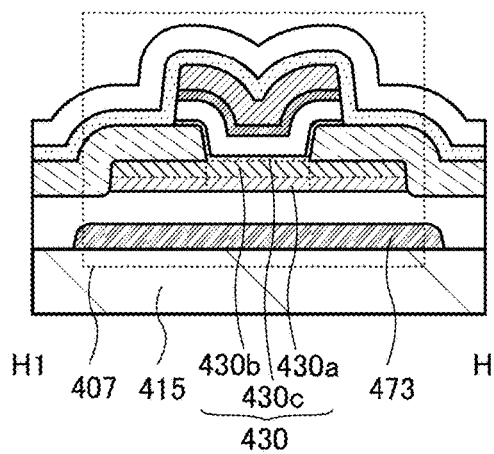
FIGS. 42A to 42F each illustrate a cross section of a transistor in a channel length direction.
Figure 42B:
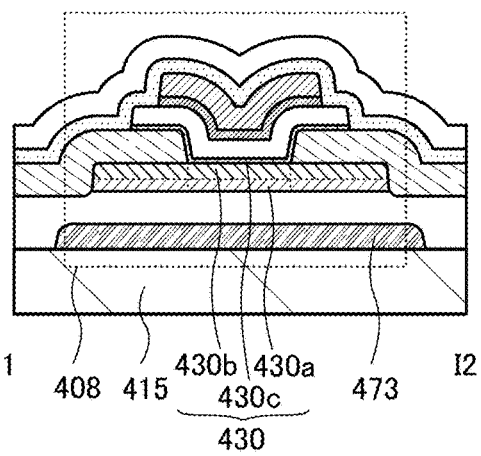
Figure 42C:
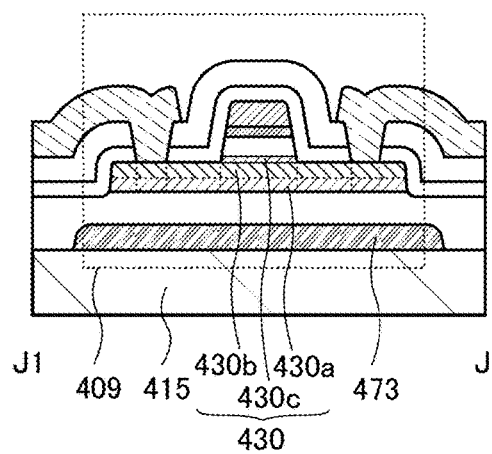
Figure 42D:
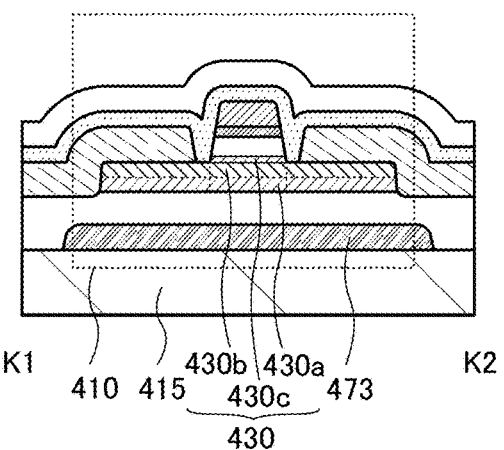
Figure 42E:
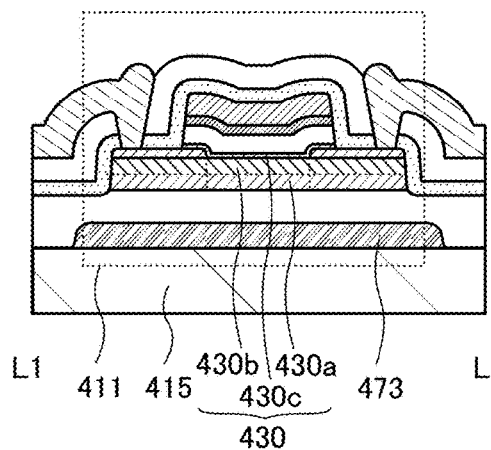
Figure 42F:
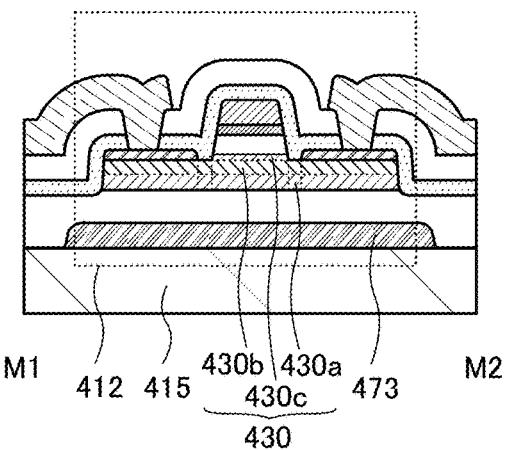

In order to increase the on-state current, for example, the conductive layers 470 and 473 are made to have the same potential, and the transistor is driven as a double-gate transistor. Furthermore, in order to control the threshold voltage, a fixed potential that is different from the potential of the conductive layer 470 is applied to the conductive layer 473. To set the conductive layers 470 and 473 at the same potential, for example, as illustrated in FIG. 36D and FIG. 40D, the conductive layers 470 and 473 may be electrically connected to each other through a contact hole.

Figure 43A:
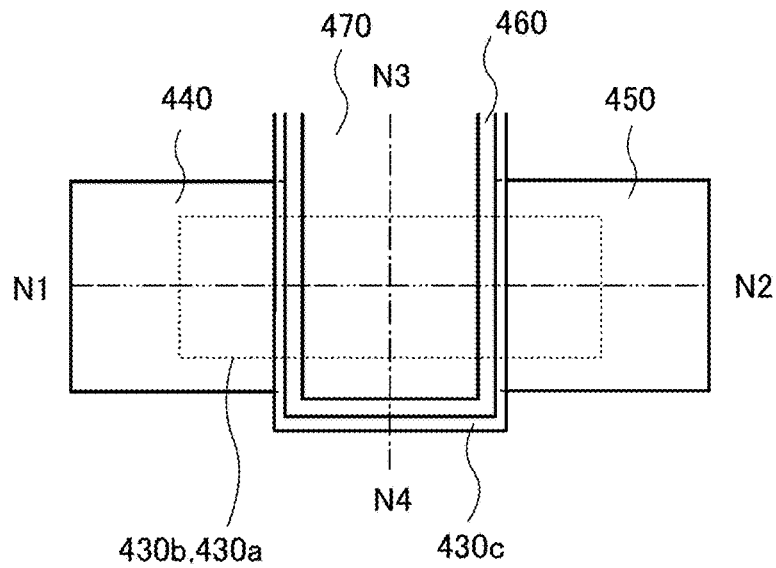
FIGS. 43A to 43C are a top view and cross-sectional views illustrating a transistor.
Figure 43B:
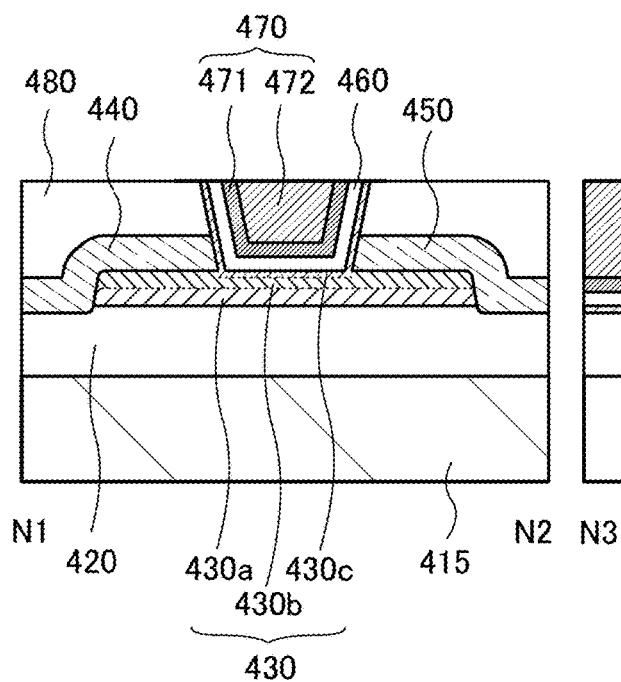
Figure 43C:
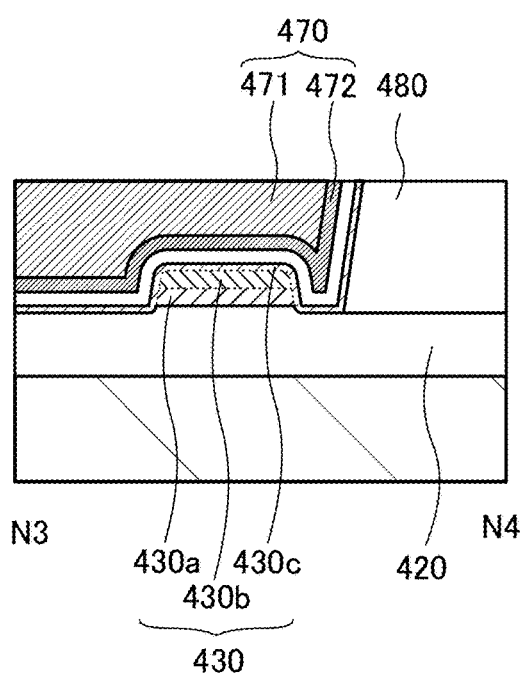

The transistor in one embodiment of the present invention may have a structure illustrated in FIGS. 43A to 43C. FIG. 43A is a top view. FIG. 43B illustrates a cross-sectional view taken along dashed-dotted line N1-N2 in FIG. 43A. FIG. 43C illustrates a cross-sectional view taken along dashed-dotted line N3-N4 in FIG. 43A. Note that for simplification of the drawing, some components are not illustrated in the top view in FIG. 43A.

In a transistor 413, the insulating layer 420 is in contact with the substrate 415; the oxide semiconductor layer 430 (the oxide semiconductor layers 430a to 430c) is in contact with the insulating layer 420; the conductive layer 440 and the conductive layer 450 are in contact with the oxide semiconductor layer 430b; the insulating layer 460 is in contact with the oxide semiconductor layer 430c; the conductive layer 470 is in contact with the insulating layer 460; and the insulating layer 480 is in contact with the insulating layer 420, the conductive layer 440, and the conductive layer 450. Note that the oxide semiconductor layer 430c, the insulating layer 460, and the conductive layer 470 are provided in an opening reaching the oxide semiconductor layer 430b in the insulating layer 480.

In the transistor 413, a region where the conductive layer 470 overlaps with the conductive layer 440 or the conductive layer 450 is smaller than that in any other transistors described above; thus, the parasitic capacitance in the transistor 413 can be reduced. Accordingly, the transistor 413 is suitable for a component of a circuit that requires high-speed operation. As illustrated in FIGS. 43B and 43C, the transistor 413 is preferably subjected to a chemical mechanical polishing (CMP) method or the like to have a flat top surface, although not necessarily.

Figure 44A:
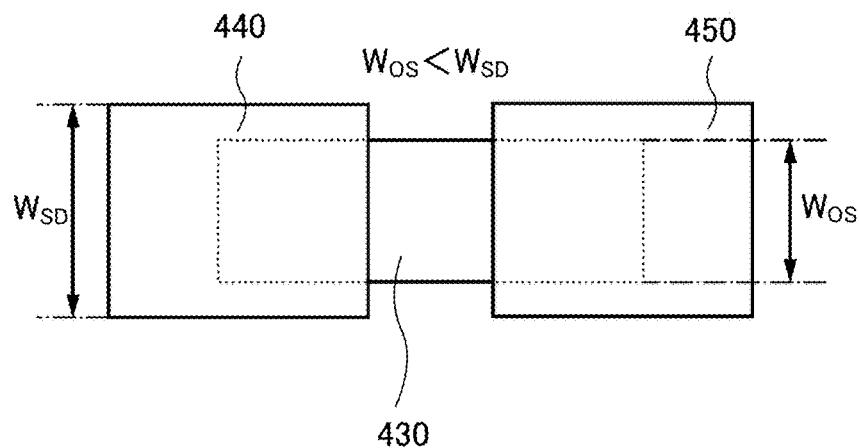
FIGS. 44A to 44C are top views each illustrating a transistor.
Figure 44B:
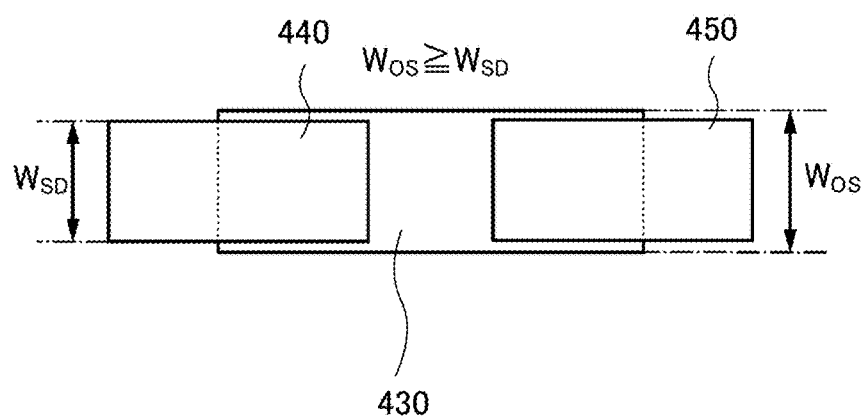
Figure 44C:
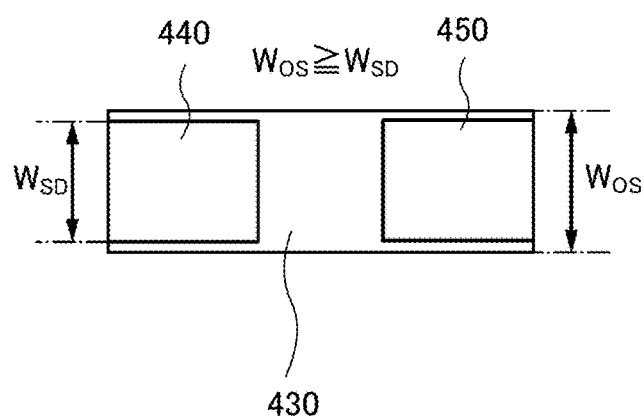

The conductive layer 440 and the conductive layer 450 in the transistor in one embodiment of the present invention may each have a width ($W_{SD}$) longer than the width ($W_{OS}$) of the oxide semiconductor layer as illustrated in the top view in FIG. 44A or shorter as illustrated in the top view in FIG. 44B. When $W_{OS} \geq W_{SD}$ ($W_{SD}$ is less than or equal to $W_{OS}$) is satisfied, a gate electric field is easily applied to the entire oxide semiconductor layer 430, so that electrical characteristics of the transistor can be particularly improved. As illustrated in FIG. 44C, the conductive layers 440 and 450 may be formed only in regions overlapping with the oxide semiconductor layer 430.

Note that FIGS. 44A to 44C only illustrate the oxide semiconductor layer 430, the conductive layer 440, and the conductive layer 450.

In the transistor including the oxide semiconductor layers 430a and 430b and the transistor including the oxide semiconductor layers 430a to 430c, selecting appropriate materials for the two or three layers forming the oxide semiconductor layer 430 makes current flow to the oxide semiconductor layer 430b. Since current flows to the oxide semiconductor layer 430b, the current is hardly influenced by interface scattering, leading to a high on-state current. Thus, increasing the thickness of the oxide semiconductor layer 430b improves the on-state current in some cases.

A semiconductor device including a transistor with any of the above structures can have favorable electrical characteristics.

The structures described in this embodiment can be used in appropriate combination with any of the structures described in the other embodiments.

Embodiment 5

In this embodiment, components of the transistors described in Embodiment 4 are described in detail.

Note that there is no particular limitation on the type of the substrate 415. As the substrate 415, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, soda lime glass substrate, and the like can be given. Examples of the flexible substrate, the attachment film, the base material film, and the like are substrates of plastics typified by polyethylene terephthalate (PET), polyethylene naphthalate (PEN), polyether sulfone (PES), and polytetrafluoroethylene (PTFE). Another example is a synthetic resin such as acrylic. Alternatively, a film of polypropylene, polyester, polyvinyl fluoride, polyvinyl chloride, or the like can be used. Alternatively, polyamide, polyimide, aramid, epoxy, an inorganic vapor deposition film, paper, or the like can be used. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

As the substrate 415, a silicon substrate provided with a transistor, or the silicon substrate over which an insulating layer, a wiring, a conductor that functions as a contact plug, and the like are provided can be used. Note that when only p-ch transistors are formed using the silicon substrate, a silicon substrate with n⁻-type conductivity is preferably used. Alternatively, an SOI substrate including an n⁻-type or i-type silicon layer may be used. A surface of the silicon substrate where the transistor is formed preferably has a (110) plane orientation. Forming a p-ch transistor with the (110) plane can increase mobility.

A flexible substrate may be used as the substrate 415, and the transistor may be formed directly over the flexible substrate. Alternatively, a separation layer may be provided between the substrate and the transistor. The separation layer can be used when part or the whole of a semiconductor device formed over the separation layer is separated from the substrate and transferred to another substrate. In such a case, the transistor can be transferred to a substrate having low heat resistance or a flexible substrate as well. For the separation layer, a stack including inorganic films, which are a tungsten film and a silicon oxide film, or a resin film of polyimide or the like formed over a substrate can be used, for example.

In other words, a transistor may be formed using one substrate and then transferred to another substrate. Examples of a substrate to which a transistor is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. By using such a substrate, a transistor with excellent properties or a transistor with low power consumption can be formed, a device with high durability can be formed, heat resistance can be provided, or reduction in weight or thickness can be achieved.

The insulating layer 420 can have a function of supplying oxygen to the oxide semiconductor layer 430 as well as a function of preventing diffusion of impurities from a component included in the substrate 415. For this reason, the insulating layer 420 is preferably an insulating layer containing oxygen and further preferably, the insulating layer 420 is an insulating layer containing oxygen in which the oxygen content is higher than that in the stoichiometric composition. The insulating layer 420 is, for example, a film in which the amount of released oxygen when converted into oxygen atoms is greater than or equal to $1.0 \times 10^{19}$ atoms/cm³ in thermal desorption spectroscopy (TDS) analysis. In the TDS analysis, the film surface temperature is preferably higher than or equal to 100° C. and lower than or equal to 700° C., or higher than or equal to 100° C. and lower than or equal to 500° C. In the case where the substrate 415 is provided with another device, the insulating layer 420 also functions as an interlayer insulating layer. In that case, the insulating layer 420 is preferably subjected to planarization treatment such as CMP treatment so as to have a flat surface.

For example, the insulating layer 420 can be formed using an oxide insulating layer including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating layer including silicon nitride, silicon nitride oxide, aluminum nitride, aluminum nitride oxide, or the like; or a mixed material of any of these. The insulating layer 420 may be a stack of any of the above materials.

In this embodiment, detailed description is given mainly on the case where the oxide semiconductor layer 430 of the transistor has a three-layer structure in which the oxide semiconductor layers 430a, 430b, and 430c are sequentially stacked from the insulating layer 420 side.

Note that in the case where the oxide semiconductor layer 430 is a single layer, a layer corresponding to the oxide semiconductor layer 430b described in this embodiment is used.

In the case where the oxide semiconductor layer 430 has a two-layer structure, a stack in which layers corresponding to the oxide semiconductor layer 430a and the oxide semiconductor layer 430b described in this embodiment are sequentially stacked from the insulating layer 420 side is used. In such a case, the oxide semiconductor layers 430a and 430b can be replaced with each other.

In the case where the oxide semiconductor layer 430 has a layered structure of four or more layers, for example, a structure in which another oxide semiconductor layer is added to the three-layer stack of the oxide semiconductor layer 430 described in this embodiment can be employed.

For the oxide semiconductor layer 430b, for example, an oxide semiconductor whose electron affinity (an energy difference between a vacuum level and the conduction band minimum) is higher than those of the oxide semiconductor layers 430a and 430c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layers 430a and 430c each contain one or more kinds of metal elements contained in the oxide semiconductor layer 430b. For example, the oxide semiconductor layers 430a and 430c are preferably formed using an oxide semiconductor whose conduction band minimum is closer to a vacuum level than that of the oxide semiconductor layer 430b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the conductive layer 470, a channel is formed in the oxide semiconductor layer 430b whose conduction band minimum is the lowest in the oxide semiconductor layer 430.

Furthermore, since the oxide semiconductor layer 430a contains one or more kinds of metal elements contained in the oxide semiconductor layer 430b, an interface state is unlikely to be formed at the interface between the oxide semiconductor layers 430a and 430b, compared with the interface between the oxide semiconductor layer 430b and the insulating layer 420 on the assumption that the oxide semiconductor layer 430b is in contact with the insulating layer 420. The interface state sometimes forms a channel; therefore, the threshold voltage of the transistor is changed in some cases. Thus, with the oxide semiconductor layer 430a, variations in electrical characteristics of the transistor, such as a threshold voltage, can be reduced. Moreover, the reliability of the transistor can be improved.

Since the oxide semiconductor layer 430c contains one or more kinds of metal elements contained in the oxide semiconductor layer 430b, scattering of carriers is unlikely to occur at the interface between the oxide semiconductor layers 430b and 430c, compared with the interface between the oxide semiconductor layer 430b and the gate insulating layer (the insulating layer 460) on the assumption that the oxide semiconductor layer 430b is in contact with the gate insulating layer. Thus, with the oxide semiconductor layer 430c, the field-effect mobility of the transistor can be increased.

For the oxide semiconductor layers 430a and 430c, for example, a material containing Al, Ti, Ga, Ge, Y, Zr, Sn, La, Ce, or Hf with a higher atomic ratio than that used for the oxide semiconductor layer 430b can be used. Specifically, the atomic ratio of any of the above metal elements in the oxide semiconductor layers 430a and 430c is 1.5 times or more, preferably 2 times or more, and further preferably 3 times or more as large as that in the oxide semiconductor layer 430b. Any of the above metal elements is strongly bonded to oxygen and thus can have a function of suppressing generation of an oxygen vacancy in the oxide semiconductor layers 430a and 430c. That is, an oxygen vacancy is less likely to be generated in the oxide semiconductor layers 430a and 430c than in the oxide semiconductor layer 430b.

An oxide semiconductor that can be used for each of the oxide semiconductor layers 430a, 430b, and 430c preferably contains at least In or Zn. Both In and Zn are preferably contained. In order to reduce variations in electrical characteristics of the OS transistor, a stabilizer is preferably contained in addition to In and Zn.

Examples of a stabilizer include Ga, Sn, Hf, Al, and Zr. Other examples of the stabilizer include lanthanoids such as La, Ce, Pr, Nd, Sm, Eu, Gd, Tb, Dy, Ho, Er, Tm, Yb, and Lu.

As the oxide semiconductor, for example, any of the following can be used: indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide means an oxide containing In, Ga, and Zn as its main components. The In—Ga—Zn oxide may contain another metal element in addition to In, Ga, and Zn. In this specification, a film containing the In—Ga—Zn oxide is also referred to as an IGZO film.

A material represented by $InMO_3(ZnO)_m$ (m>0, where m is not an integer) may be used. Note that M represents one or more metal elements selected from Ga, Y, Zr, La, Ce, and Nd. Alternatively, a material represented by $In_2SnO_5(ZnO)_n$ (n>0, where n is an integer) may be used.

Note that when each of the oxide semiconductor layers 430a, 430b, and 430c is an In-M-Zn oxide containing at least indium, zinc, and M (M is a metal such as Al, Ti, Ga, Ge, Y, Zr, Sn, La, Ce, or Hf), in the case where the oxide semiconductor layer 430a has an atomic ratio of In to M and Zn that is $x_1:y_1:z_1$, the oxide semiconductor layer 430b has an atomic ratio of In to M and Zn that is $x_2:y_2:z_2$, and the oxide semiconductor layer 430c has an atomic ratio of In to M and Zn that is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, and further preferably 3 times or more as large as $y_2/x_2$. At this time, when $y_2$ is greater than or equal to $x_2$ in the oxide semiconductor layer 430b, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in each of the oxide semiconductor layers 430a and 430c are preferably less than 50 atomic % and greater than 50 atomic %, respectively, and further preferably less than 25 atomic % and greater than 75 atomic %, respectively. Furthermore, in the case where Zn and O are not taken into consideration, the proportion of In and the proportion of M in the oxide semiconductor layer 430b are preferably greater than 25 atomic % and less than 75 atomic %, respectively, and further preferably greater than 34 atomic % and less than 66 atomic %, respectively.

The indium content in the oxide semiconductor layer 430b is preferably higher than those in the oxide semiconductor layers 430a and 430c. In an oxide semiconductor, the s orbital of heavy metal mainly contributes to carrier transfer, and when the proportion of In in the oxide semiconductor is increased, overlap of the s orbitals is likely to be increased. Therefore, an oxide in which the proportion of In is higher than that of M has higher mobility than an oxide in which the proportion of In is equal to or lower than that of M. Thus, with the use of an oxide having a high content of indium for the oxide semiconductor layer 430b, a transistor having high field-effect mobility can be obtained.

The thickness of the oxide semiconductor layer 430a is greater than or equal to 3 nm and less than or equal to 100 nm, preferably greater than or equal to 5 nm and less than or equal to 50 nm, and further preferably greater than or equal to 5 nm and less than or equal to 25 nm. The thickness of the oxide semiconductor layer 430b is greater than or equal to 3 nm and less than or equal to 200 nm, preferably greater than or equal to 5 nm and less than or equal to 150 nm, and further preferably greater than or equal to 10 nm and less than or equal to 100 nm. The thickness of the oxide semiconductor layer 430c is greater than or equal to 1 nm and less than or equal to 50 nm, preferably greater than or equal to 2 nm and less than or equal to 30 nm, and further preferably greater than or equal to 3 nm and less than or equal to 15 nm. In addition, the oxide semiconductor layer 430b is preferably thicker than the oxide semiconductor layer 430c.

In order that a transistor in which a channel is formed in an oxide semiconductor layer have stable electrical characteristics, it is effective to make the oxide semiconductor layer intrinsic or substantially intrinsic by reducing the concentration of impurities in the oxide semiconductor layer. The term "substantially intrinsic" refers to a state where an oxide semiconductor layer has a carrier density lower than $1\times10^{15}/cm^3$, lower than $1\times10^{13}/cm^3$, lower than $8\times10^{11}/cm^3$, or lower than $1\times10^{8}/cm^3$, and is higher than or equal to $1\times10^{-9}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density, and silicon forms impurity levels in the oxide semiconductor layer. The impurity levels serve as traps and might cause deterioration of electrical characteristics of the transistor. Therefore, it is preferable to reduce the concentration of the impurities in the oxide semiconductor layers 430a, 430b, and 430c and at interfaces between the oxide semiconductor layers.

In order to form an intrinsic or substantially intrinsic oxide semiconductor layer, the oxide semiconductor layer is arranged to have a region in which the concentration of silicon estimated by secondary ion mass spectrometry (SIMS) is lower than $1\times10^{19}$ atoms/$cm^3$, preferably lower than $5\times10^{18}$ atoms/$cm^3$, and further preferably lower than $1\times10^{18}$ atoms/$cm^3$. The oxide semiconductor layer is arranged to have a region in which the concentration of hydrogen is lower than or equal to $2\times10^{20}$ atoms/$cm^3$, preferably lower than or equal to $5\times10^{19}$ atoms/$cm^3$, further preferably lower than or equal to $1\times10^{19}$ atoms/$cm^3$, and still further preferably lower than or equal to $5\times10^{18}$ atoms/$cm^3$. The concentration of nitrogen at a certain depth of the oxide semiconductor layer or in a region of the oxide semiconductor layer is lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, and still further preferably lower than or equal to $5\times10^{17}$ atoms/$cm^3$.

The high concentration of silicon or carbon might reduce the crystallinity of the oxide semiconductor layer. In order not to lower the crystallinity of the oxide semiconductor layer, for example, the oxide semiconductor layer is controlled to have a region in which the concentration of silicon is lower than $1\times10^{19}$ atoms/$cm^3$, preferably lower than $5\times10^{18}$ atoms/$cm^3$, and further preferably lower than $1\times10^{18}$ atoms/$cm^3$. Furthermore, the oxide semiconductor layer is controlled to have a region in which the concentration of carbon is lower than $1\times10^{19}$ atoms/$cm^3$, preferably lower than $5\times10^{18}$ atoms/$cm^3$, and further preferably lower than $1\times10^{18}$ atoms/$cm^3$.

As described above, a transistor in which a highly purified oxide semiconductor layer is used for a channel formation region exhibits an extremely low off-state current. When voltage between a source and a drain is set at about 0.1 V, 5 V, or 10 V, for example, the off-state current per channel width of the transistor can be as low as several yoctoamperes per micrometer to several zeptoamperes per micrometer.

As the gate insulating layer of the transistor, an insulating layer containing silicon is used in many cases; thus, it is preferable that, as in the transistor in one embodiment of the present invention, a region of the oxide semiconductor layer that serves as a channel not be in contact with the gate insulating layer for the above reason. In the case where a channel is formed at the interface between the gate insulating layer and the oxide semiconductor layer, scattering of carriers occurs at the interface, so that the field-effect mobility of the transistor is reduced in some cases. Also from the view of the above, it is preferable that the region of the oxide semiconductor layer that serves as a channel be separated from the gate insulating layer.

Accordingly, with the oxide semiconductor layer 430 having a layered structure including the oxide semiconductor layers 430a, 430b, and 430c, a channel can be formed in the oxide semiconductor layer 430b; thus, the transistor can have high field-effect mobility and stable electrical characteristics.

In a band structure, the conduction band minimums of the oxide semiconductor layers 430a, 430b, and 430c are continuous. This can be understood also from the fact that the compositions of the oxide semiconductor layers 430a, 430b, and 430c are close to one another and oxygen is easily diffused among the oxide semiconductor layers 430a, 430b, and 430c. Thus, the oxide semiconductor layers 430a, 430b, and 430c have a continuous physical property though they have different compositions and form a stack. In the drawings, interfaces between the oxide semiconductor layers of the stack are indicated by dotted lines.

The oxide semiconductor layer 430 in which layers containing the same main components are stacked is formed to have not only a simple layered structure of the layers but also a continuous energy band (here, in particular, a well structure having a U shape in which the conduction band minimums are continuous (U-shape well)). In other words, the layered structure is formed such that there exists no impurity that forms a defect level such as a trap center or a recombination center at each interface. If impurities exist between the stacked oxide semiconductor layers, the continuity of the energy band is lost and carriers disappear because of a trap or recombination at the interface.

For example, an In—Ga—Zn oxide whose atomic ratio of In to Ga and Zn is 1:3:2, 1:3:3, 1:3:4, 1:3:6, 1:4:5, 1:6:4, or 1:9:6 can be used for the oxide semiconductor layers 430a and 430c, and an In—Ga—Zn oxide whose atomic ratio of In to Ga and Zn is 1:1:1, 2:1:3, 5:5:6, or 3:1:2 can be used for the oxide semiconductor layer 430b. In each of the oxide semiconductor layers 430a to 430c, the proportion of each atom in the atomic ratio varies within a range of ±40% as a margin.

The atomic ratio of In to Ga and Zn is not necessarily an integer ratio.

The oxide semiconductor layer 430b of the oxide semiconductor layer 430 serves as a well, so that a channel is formed in the oxide semiconductor layer 430b. Since the conduction band minimums are continuous, the oxide semiconductor layer 430 can also be referred to as a U-shaped well. Furthermore, a channel formed to have such a structure can also be referred to as a buried channel.

Trap levels due to impurities or defects might be formed in the vicinity of the interface between an insulating layer such as a silicon oxide film and each of the oxide semiconductor layers 430a and 430c. The oxide semiconductor layer 430b can be distanced away from the trap levels owing to the existence of the oxide semiconductor layers 430a and 430c.

However, when the energy differences between the conduction band minimum of the oxide semiconductor layer 430b and the conduction band minimum of each of the oxide semiconductor layers 430a and 430c are small, an electron in the oxide semiconductor layer 430b might reach the trap level by passing over the energy differences. When the electron is trapped in the trap level, negative charge is generated at the interface with the insulating layer, so that the threshold voltage of the transistor is shifted in the positive direction.

The oxide semiconductor layers 430a, 430b, and 430c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 440 functioning as one of a source and a drain and the conductive layer 450 functioning as the other of the source and the drain, for example, a single layer or a stacked layer formed using a material selected from Al, Cr, Cu, Ta, Ti, Mo, W, Ni, Mn, Nd, and Sc and alloys of any of these metal materials can be used. It is preferable to use Ti, which is particularly easily bonded to oxygen, or W, which has a high melting point and thus allows subsequent processes to be performed at relatively high temperatures, as a typical example. It is also possible to use a stack of any of the above materials and Cu or an alloy such as Cu—Mn, which has low resistance. In the transistors 405, 406, 411, and 412, for example, it is possible to use W for the conductive layers 441 and 451 and use a stack of Ti and Al for the conductive layers 442 and 452.

The above materials are capable of extracting oxygen from an oxide semiconductor layer. Therefore, in a region of the oxide semiconductor layer that is in contact with any of the above materials, oxygen is released from the oxide semiconductor layer and an oxygen vacancy is formed. Hydrogen slightly contained in the layer and the oxygen vacancy are bonded to each other, so that the region is markedly changed to an n-type region. Accordingly, the n-type region can serve as a source or a drain of the transistor.

In the case where W is used for the conductive layers 440 and 450, the conductive layers 440 and 450 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor layer as the conductive layers 440 and 450 and putting the n-type semiconductor layer in contact with the oxide semiconductor layer. As the n-type semiconductor layer, an In—Ga—Zn oxide, zinc oxide, indium oxide, tin oxide, indium tin oxide, or the like to which nitrogen is added can be used.

The insulating layer 460 functioning as a gate insulating layer can be formed using an insulating layer containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 460 may be a stack including any of the above materials. The insulating layer 460 may contain La, N, Zr, or the like as an impurity.

An example of a layered structure of the insulating layer 460 is described. The insulating layer 460 includes, for example, oxygen, nitrogen, silicon, or hafnium. Specifically, the insulating layer 460 preferably includes hafnium oxide and silicon oxide or silicon oxynitride.

Hafnium oxide and aluminum oxide have higher dielectric constants than silicon oxide and silicon oxynitride. Therefore, the insulating layer 460 using hafnium oxide or aluminum oxide can have larger thickness than the insulating layer 460 using silicon oxide, so that leakage current due to tunnel current can be reduced. That is, a transistor with a low off-state current can be provided. Moreover, hafnium oxide with a crystalline structure has a higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to these examples.

For the insulating layers 420 and 460 in contact with the oxide semiconductor layer 430, a film that releases less nitrogen oxide is preferably used. In the case where the oxide semiconductor is in contact with an insulating layer that releases a large amount of nitrogen oxide, the density of states due to nitrogen oxide increases in some cases. The density of states due to nitrogen oxide can be formed in the energy gap of the oxide semiconductor. For the insulating layers 420 and 460, for example, an oxide insulating layer such as a silicon oxynitride film or an aluminum oxynitride film that releases less nitrogen oxide can be used.

A silicon oxynitride film that releases less nitrogen oxide is a film of which the amount of released ammonia is larger than the amount of released nitrogen oxide in TDS; the amount of released ammonia is typified by greater than or equal to $1\times10^{18}/cm^3$ and less than or equal to $5\times10^{19}/cm^3$. Note that the amount of released ammonia is the amount of ammonia released by heat treatment with which the surface temperature of the film becomes higher than or equal to 50° C. and lower than or equal to 650° C., and preferably higher than or equal to 50° C. and lower than or equal to 550° C.

By using the above oxide insulating layer for the insulating layers 420 and 460, a shift in the threshold voltage of the transistor can be reduced, which leads to reduced fluctuations in the electrical characteristics of the transistor.

For the conductive layer 470 functioning as a gate, for example, a conductive layer formed using Al, Ti, Cr, Co, Ni, Cu, Y, Zr, Mo, Ru, Ag, Mn, Nd, Sc, Ta, or W can be used. Alternatively, an alloy or a conductive nitride of any of these materials may be used. Alternatively, a stack of a plurality of materials selected from these materials, alloys of these materials, and conductive nitrides of these materials may be used. As a typical example, tungsten, a stack of tungsten and titanium nitride, a stack of tungsten and tantalum nitride, or the like can be used. Alternatively, Cu or an alloy such as Cu—Mn, which has low resistance, or a stack of any of the above materials and Cu or an alloy such as Cu—Mn may be used. In this embodiment, tantalum nitride is used for the conductive layer 471 and tungsten is used for the conductive layer 472 to form the conductive layer 470.

As the insulating layer 475, a silicon nitride film, an aluminum nitride film, or the like containing hydrogen can be used. In the transistors 403, 404, 406, 409, 410, and 412, the use of an insulating layer containing hydrogen is used as the insulating layer 475 allows the oxide semiconductor layer 430 to be partly changed to n-type because the oxide semiconductor layer 430 is partly in contact with the insulating layer 475. In addition, a nitride insulating layer functions as a blocking film against moisture and the like and can improve the reliability of the transistor.

An aluminum oxide film can also be used as the insulating layer 475. It is particularly preferable to use an aluminum oxide film as the insulating layer 475 in the transistors 401, 402, 405, 407, 408, and 411. The aluminum oxide film has a significant effect of blocking both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 430, preventing release of oxygen from the oxide semiconductor layer, and preventing unnecessary release of oxygen from the insulating layer 420. Furthermore, oxygen contained in the aluminum oxide film can be diffused into the oxide semiconductor layer.

Furthermore, the insulating layer 480 is preferably formed over the insulating layer 475. The insulating layer 480 can be formed using an insulating layer containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 480 may be a stack of any of the above materials.

Here, like the insulating layer 420, the insulating layer 480 preferably contains oxygen more than that in the stoichiometric composition. Oxygen released from the insulating layer 480 can be diffused into the channel formation region in the oxide semiconductor layer 430 through the insulating layer 460, so that oxygen vacancies formed in the channel formation region can be filled with oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. In particular, a decrease in channel width causes a reduction in on-state current.

In the transistors 407 to 412 in one embodiment of the present invention, the oxide semiconductor layer 430c is formed to cover the oxide semiconductor layer 430b where a channel is formed; thus, a channel formation layer is not in contact with the gate insulating layer. Accordingly, scattering of carriers at the interface between the channel formation layer and the gate insulating layer can be reduced and the on-state current of the transistor can be increased.

In the transistor in one embodiment of the present invention, as described above, the gate (the conductive layer 470) is formed to electrically surround the oxide semiconductor layer 430 in the channel width direction; accordingly, a gate electric field is applied to the oxide semiconductor layer 430 in the direction perpendicular to the side surface in addition to the direction perpendicular to the top surface. In other words, a gate electric field is applied to the entire channel formation layer and an effective channel width is increased, leading to a further increase in on-state current.

Furthermore, in the transistor in one embodiment of the present invention in which the oxide semiconductor layer 430 has a two-layer structure or a three-layer structure, since the oxide semiconductor layer 430b where a channel is formed is provided over the oxide semiconductor layer 430a, an interface state is less likely to be formed. In the transistor in one embodiment of the present invention in which the oxide semiconductor layer 430 has a three-layer structure, since the oxide semiconductor layer 430b is positioned at the middle of the three-layer structure, the influence of an impurity that enters from upper and lower layers on the oxide semiconductor layer 430b can also be eliminated. Therefore, the transistor can achieve not only the increase in on-state current but also stabilization of the threshold voltage and a reduction in S value (subthreshold value). Thus, current at a gate voltage VG of 0 V can be reduced and power consumption can be reduced. In addition, since the threshold voltage of the transistor becomes stable, long-term reliability of the semiconductor device can be improved. Furthermore, the transistor in one embodiment of the present invention is suitable for a highly integrated semiconductor device because deterioration of electrical characteristics due to miniaturization is reduced.

Although the variety of films such as the metal films, the semiconductor films, and the inorganic insulating films that are described in this embodiment typically can be formed by sputtering or plasma-enhanced chemical vapor deposition (CVD), such films may be formed by another method such as thermal CVD. Examples of the thermal CVD include MOCVD and atomic layer deposition (ALD).

Since plasma is not used for deposition, thermal CVD has an advantage that no defect due to plasma damage is generated.

Deposition by thermal CVD may be performed in such a manner that a source gas and an oxidizer are supplied to the chamber at the same time, the pressure in the chamber is set to an atmospheric pressure or a reduced pressure, and reaction is caused in the vicinity of the substrate or over the substrate.

Deposition by ALD is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is adsorbed and reacted. That is, a second layer is stacked over the first layer, so that a thin film is formed. The sequence of gas introduction is controlled and repeated more than once until desired thickness is obtained, so that a thin film with excellent step coverage can be formed. The thickness of the thin film can be adjusted by the number of repetition times of the sequence of gas introduction; therefore, ALD makes it possible to accurately adjust thickness and thus is suitable for manufacturing a minute FET.

The variety of films such as the metal film, the semiconductor film, and the inorganic insulating film that have been disclosed in the above embodiments can be formed by thermal CVD such as MOCVD or ALD. For example, in the case where an In—Ga—Zn—O film is formed, trimethylindium ($In(CH_3)_3$), trimethylgallium ($Ga(CH_3)_3$), and dimethylzinc ($Zn(CH_3)_2$) can be used. Without limitation to the above combination, triethylgallium ($Ga(C_2H_5)_3$) can be used instead of trimethylgallium and diethylzinc ($Zn(C_2H_5)_2$) can be used instead of dimethylzinc.

For example, in the case where a hafnium oxide film is formed with a deposition apparatus using ALD, two kinds of gases, i.e., ozone ($O_3$) as an oxidizer and a source material gas that is obtained by vaporizing liquid containing a solvent and a hafnium precursor (hafnium alkoxide and a hafnium amide such as tetrakis(dimethylamide)hafnium (TDMAH, $Hf[N(CH_3)_2]_4$) and tetrakis(ethylmethylamide)hafnium) are used.

For example, in the case where an aluminum oxide film is formed with a deposition apparatus using ALD, two kinds of gases, i.e., $H_2O$ as an oxidizer and a source gas that is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed with a deposition apparatus using ALD, hexachlorodisilane is adsorbed on a surface where a film is to be formed, and radicals of an oxidizing gas (e.g., $O_2$ or dinitrogen monoxide) are supplied to react with an adsorbate.

For example, in the case where a tungsten film is formed with a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that an $SiH_4$ gas may be used instead of a $B_2H_6$ gas.

For example, in the case where an oxide semiconductor layer, e.g., an In—Ga—Zn—O film is formed with a deposition apparatus using ALD, an $In(CH_3)_3$ gas and an $O_3$ gas are sequentially introduced to form an In—O layer, a $Ga(CH_3)_3$ gas and an $O_3$ gas are sequentially introduced to form a Ga—O layer, and then a $Zn(CH_3)_2$ gas and an $O_3$ gas are sequentially introduced to form a Zn—O layer. Note that the order of these layers is not limited to this example. A mixed compound layer such as an In—Ga—O layer, an In—Zn—O layer, or a Ga—Zn—O layer may be formed using these gases. Although an $H_2O$ gas that is obtained by bubbling with an inert gas such as Ar may be used instead of an $O_3$ gas, it is preferable to use an $O_3$ gas, which does not contain H.

A facing-target-type sputtering apparatus can be used for deposition of an oxide semiconductor layer. Deposition using the facing-target-type sputtering apparatus can also be referred to as vapor deposition SP (VDSP).

When an oxide semiconductor layer is deposited using a facing-target-type sputtering apparatus, plasma damage to the oxide semiconductor layer at the time of deposition can be reduced. Thus, oxygen vacancies in the film can be reduced. In addition, the use of the facing-target-type sputtering apparatus enables low-pressure deposition. Accordingly, the concentration of impurities (e.g., hydrogen, a rare gas (e.g., argon), and water) in a deposited oxide semiconductor layer can be lowered.

The structures described in this embodiment can be used in appropriate combination with any of the structures described in the other embodiments.

Embodiment 6

A structure of an oxide semiconductor layer that can be used in one embodiment of the present invention is described below.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and have no fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

First, a CAAC-OS is described.

A CAAC-OS is one of oxide semiconductors having a plurality of c-axis aligned crystal parts (also referred to as pellets).

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle (2θ) of around 31° as shown in FIG. 45A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the $InGaZnO_4$ crystal. When analysis (ϕ scan) is performed with 2θ fixed at around 56° and with the sample rotated using a normal vector to the sample surface as an axis (ϕ axis), as shown in FIG. 45B, a peak is not clearly observed. In contrast, in the case where single crystal $InGaZnO_4$ is subjected to ϕ scan with 2θ fixed at around 56°, as shown in FIG. 45C, six peaks that are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 45D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 45E shows a diffraction pattern obtained in such a manner that an electron beam with a probe diameter of 300 nm is incident on the same sample in a direction perpendicular to the sample surface. As shown in FIG. 45E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 45E is considered to be derived from the (010) plane, the (100) plane, and the like of the InGaZnO$_4$ crystal. The second ring in FIG. 45E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed in some cases. Thus, in the CAAC-OS, a reduction in electron mobility due to the grain boundary is less likely to occur.

Figure 46A:
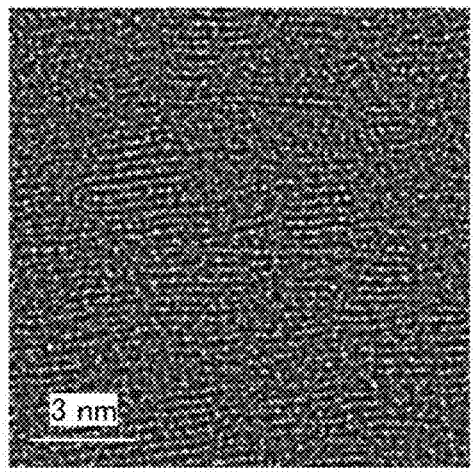
FIGS. 46A to 46E show a cross-sectional TEM image and plan-view TEM images of a CAAC-OS and images obtained through analysis thereof.

FIG. 46A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 46A shows pellets in which metal atoms are arranged in a layered manner. FIG. 46A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 46B:
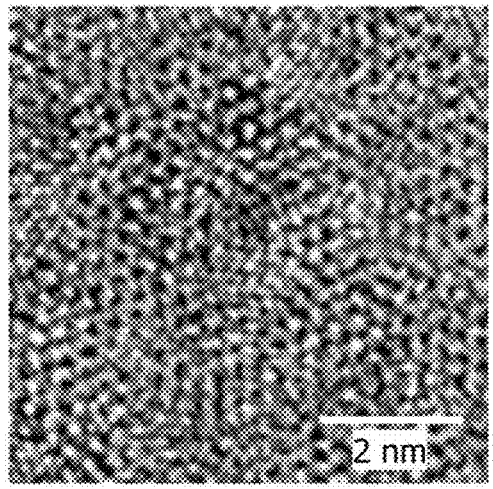
Figure 46C:
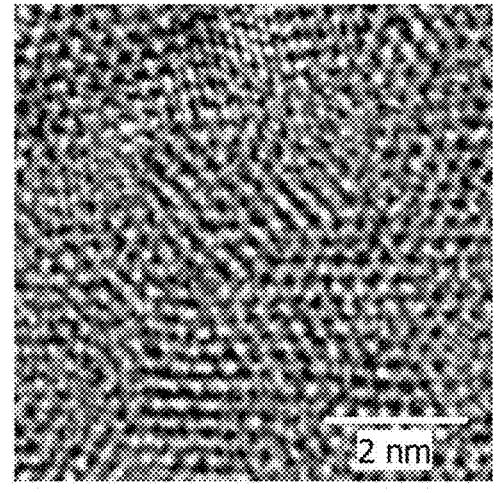
Figure 46D:
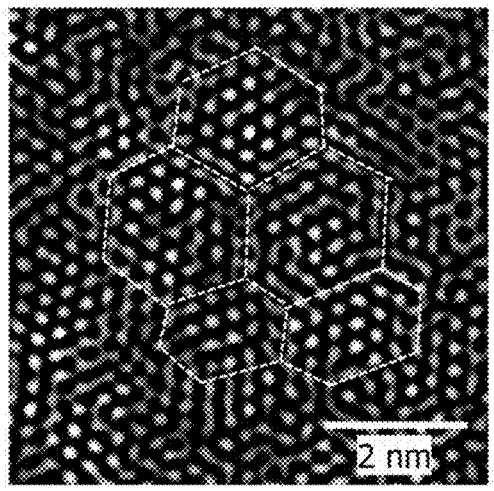
Figure 46E:
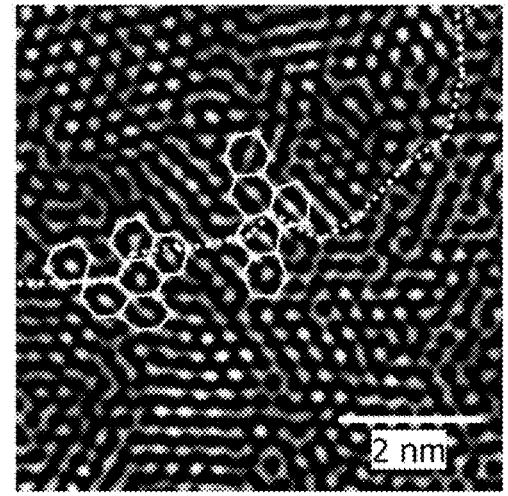

FIGS. 46B and 46C show Cs-corrected high-resolution TEM images of a plane of the CAAC-OS observed from a direction substantially perpendicular to the sample surface. FIGS. 46D and 46E are images obtained through image processing of FIGS. 46B and 46C. The method of image processing is as follows. The image in FIG. 46B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 46D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 46E, a dotted line denotes a portion where the direction of a lattice arrangement changes between a region with a regular lattice arrangement and another region with a regular lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 47A:
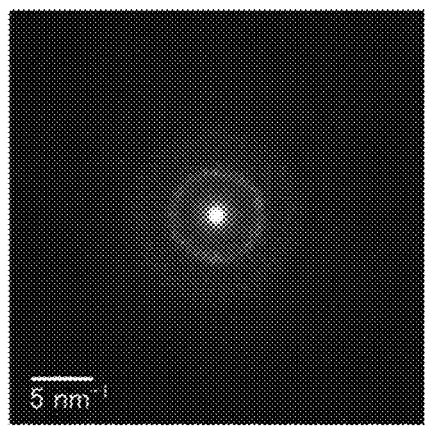
FIGS. 47A to 47D show electron diffraction patterns and a cross-sectional TEM image of an nc-OS.
Figure 47B:
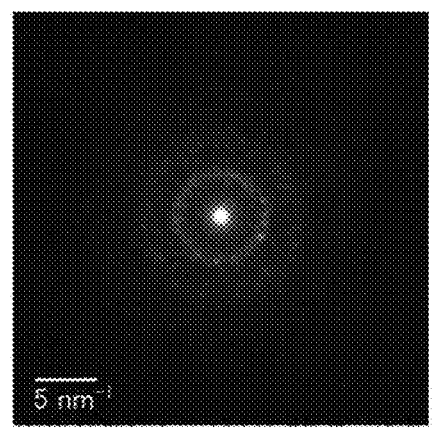

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 47A is observed. FIG. 47B shows a diffraction pattern obtained when an electron beam with a probe diameter of 1 nm is incident on the same sample. As shown in FIG. 47B, a plurality of spots are observed in a ring-like region. In other words, ordering in an nc-OS is not observed with an electron beam with a probe diameter of 50 nm but is observed with an electron beam with a probe diameter of 1 nm.

Figure 47C:
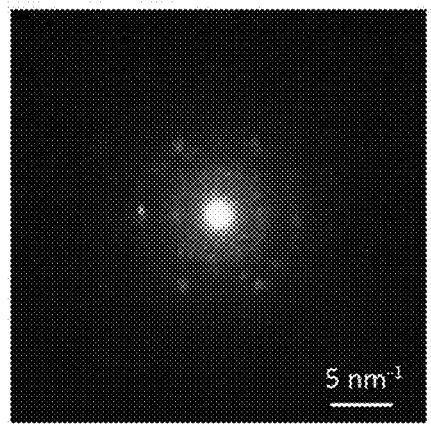

Furthermore, an electron diffraction pattern in which spots are arranged in an approximately regular hexagonal shape is observed in some cases as shown in FIG. 47C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 47D:
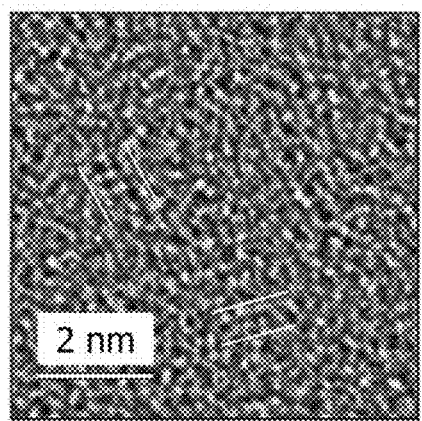

FIG. 47D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 47D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

An a-like OS has a structure intermediate between those of the nc-OS and the amorphous oxide semiconductor.

FIGS. 48A and 48B are high-resolution cross-sectional TEM images of an a-like OS. FIG. 48A is the high-resolution cross-sectional TEM image of the a-like OS at the start of the electron irradiation. FIG. 48B is the high-resolution cross-sectional TEM image of the a-like OS after the electron ($e^-$) irradiation at $4.3\times10^8$ $e^-/nm^2$. FIGS. 48A and 48B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 49:
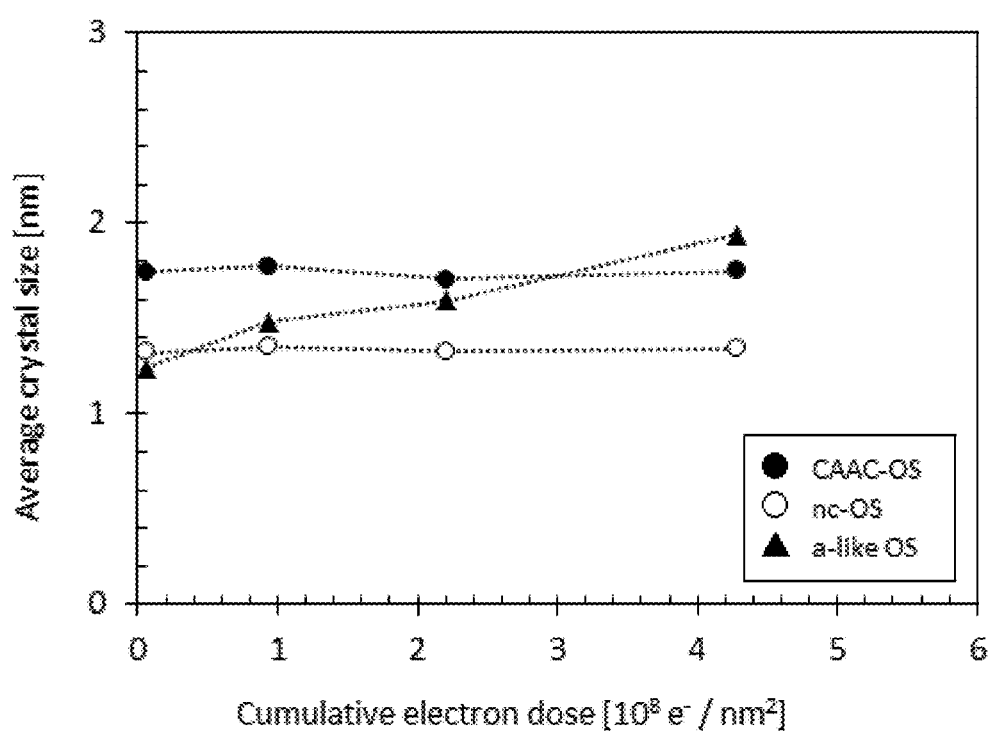
FIG. 49 shows a change in crystal part of an In—Ga—Zn oxide induced by electron irradiation.

FIG. 49 shows change in the average size of crystal parts (at 22 points to 30 points) in each sample. Note that the crystal part size corresponds to the length of a lattice fringe. FIG. 49 indicates that the crystal part size in the a-like OS increases with an increase in the cumulative electron dose in obtaining TEM images, for example. As shown in FIG. 49, a crystal part of approximately 1.2 nm (also referred to as an initial nucleus) at the start of TEM observation grows to a size of approximately 1.9 nm at a cumulative electron (e) dose of $4.2\times10^8$ $e^-/nm^2$. In contrast, the crystal part size in the nc-OS and the CAAC-OS shows little change from the start of electron irradiation to a cumulative electron dose of $4.2\times10^8$ $e^-/nm^2$. As shown in FIG. 49, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7\times10^5$ $e^-/(nm^2 \cdot s)$; and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:

Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

Next, the carrier density of an oxide semiconductor is described below.

Examples of a factor affecting the carrier density of an oxide semiconductor include oxygen vacancy ($V_o$) and impurities in the oxide semiconductor.

As the amount of oxygen vacancy in the oxide semiconductor increases, the density of defect states increases when hydrogen is bonded to the oxygen vacancy (this state is also referred to as $V_oH$). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region is described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified oxide semiconductor is lower than 8×10$^{15}$ cm$^{-3}$, preferably lower than 1×10$^{11}$ cm$^{-3}$, and further preferably lower than 1×10$^{10}$ cm$^{-3}$ and is higher than or equal to 1×10$^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The aforementioned oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to 1×10$^5$ cm$^{-3}$ and lower than 1×10$^{18}$ cm$^{-3}$, further preferably higher than or equal to 1×10$^7$ cm$^{-3}$ and lower than or equal to 1×10$^{17}$ cm$^{-3}$, still further preferably higher than or equal to 1×10$^9$ cm$^{-3}$ and lower than or equal to 5×10$^{16}$ cm$^{-3}$, yet further preferably higher than or equal to 1×10$^{10}$ cm$^{-3}$ and lower than or equal to 1×10$^{16}$ cm$^{-3}$, and yet still preferably higher than or equal to 1×10$^{11}$ cm$^{-3}$ and lower than or equal to 1×10$^{15}$ cm$^{-3}$.

The structures described in this embodiment can be used in appropriate combination with any of the structures described in the other embodiments.

Embodiment 7

In this embodiment, examples of a package and a module each including an image sensor chip are described. For the image sensor chip, the structure of an imaging device of one embodiment of the present invention can be used.

Figure 50A:
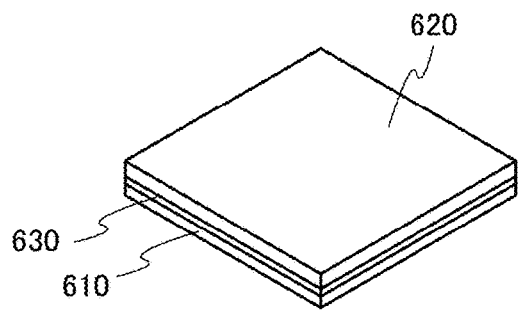
FIGS. 50A to 50D are perspective views and a cross-sectional view of a package including an imaging device.

FIG. 50A is an external perspective view showing the top surface side of a package including an image sensor chip. The package includes a package substrate 610 to which an image sensor chip 650 is fixed, a cover glass 620, an adhesive 630 for bonding the package substrate 610 and the cover glass 620 to each other, and the like.

Figure 50B:
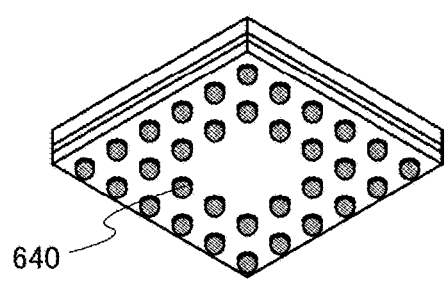

FIG. 50B is an external perspective view showing the bottom surface side of the package. On the bottom surface of the package, ball grid array (BGA) including solder balls as bumps 640 is formed. Although BGA is employed here, land grid array (LGA), pin grid array (PGA), or the like may be alternatively employed.

Figure 50C:
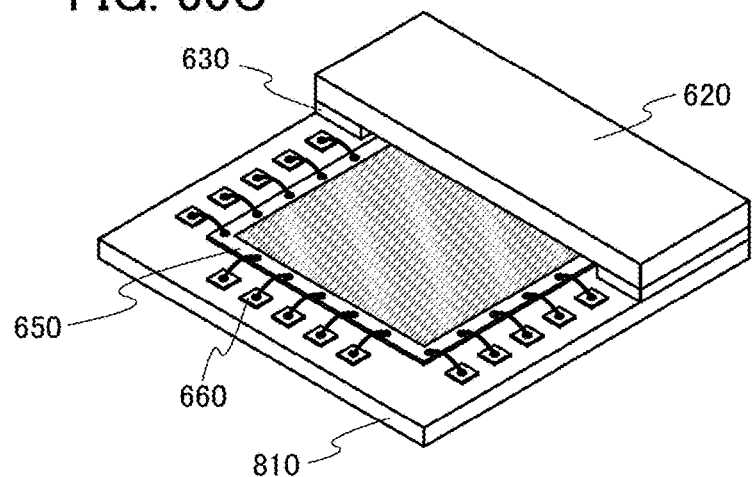
Figure 50D:
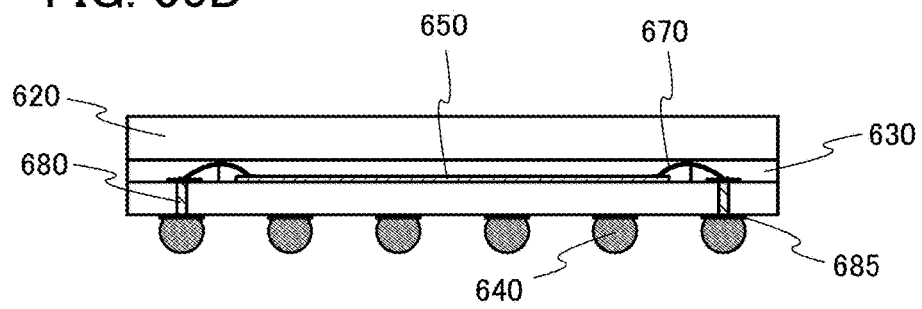

FIG. 50C is a perspective view of the package, in which the cover glass 620 and the adhesive 630 are partly illustrated. FIG. 50D is a cross-sectional view of the package. Electrode pads 660 are formed over the package substrate 610, and electrically connected to the bumps 640 through through-holes 680 and lands 685. The electrode pads 660 are electrically connected to electrodes of the image sensor chip 650 through wires 670.

FIG. 51A is an external perspective view showing the top surface side of a camera module in which an image sensor chip is mounted on a package with a built-in lens. The camera module includes a package substrate 611 to which an image sensor chip 651 is fixed, a lens cover 621, a lens 635, and the like. Furthermore, an IC chip 690 having functions of a driver circuit, a signal converter circuit, and the like of an imaging device is provided between the package substrate 611 and the image sensor chip 651. Thus, a system in package (SiP) is formed.

FIG. 51B is an external perspective view showing the bottom surface side of the camera module. On the bottom surface and four side surfaces of the package substrate 611, mounting lands 641 are provided; this structure can be called a quad flat no-lead package (QFN). Although QFN is employed here, quad flat package (QFP), the above BGA, or the like may be alternatively employed.

FIG. 51C is a perspective view of the module, in which the lens cover 621 and the lens 635 are partly illustrated. FIG. 51D is a cross-sectional view of the camera module.

The lands 641 are partly used as electrode pads 661. The electrode pads 661 are electrically connected to electrodes of the image sensor chip 651 and the IC chip 690 through wires 671.

The image sensor chip can be easily mounted by being provided in the package having the above structure, and can be incorporated into a variety of semiconductor devices or a variety of electronic devices.

The structures described in this embodiment can be used in appropriate combination with any of the structures described in the other embodiments.

Embodiment 8

In this embodiment, examples of an electronic device in which the imaging device of one embodiment of the present invention can be used is described.

Examples of an electronic device that can use the imaging device according to one embodiment of the present invention or a semiconductor device including the imaging device include display devices, personal computers, image memory devices or image reproducing devices provided with storage media, mobile phones, game machines (including portable game machines), portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 52A to 52F illustrate specific examples of these electronic devices.

Figure 52A:
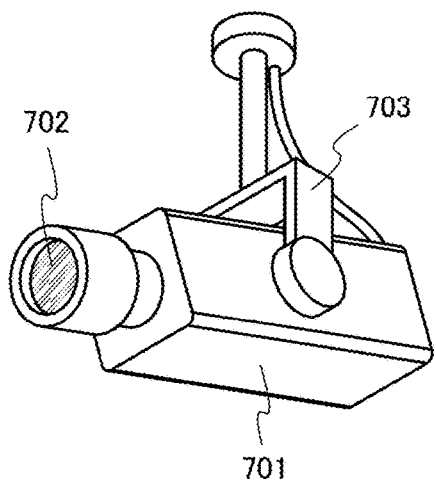
FIGS. 52A to 52F illustrate electronic devices.

FIG. 52A illustrates a monitoring camera, which includes a housing 701, a lens 702, a support portion 703, and the like. The imaging device of one embodiment of the present invention can be included as a component for obtaining an image in the monitoring camera. Note that a "monitoring camera" is a common name and does not limit the uses. For example, a device that has a function of a monitoring camera can also be called a camera or a video camera.

Figure 52B:
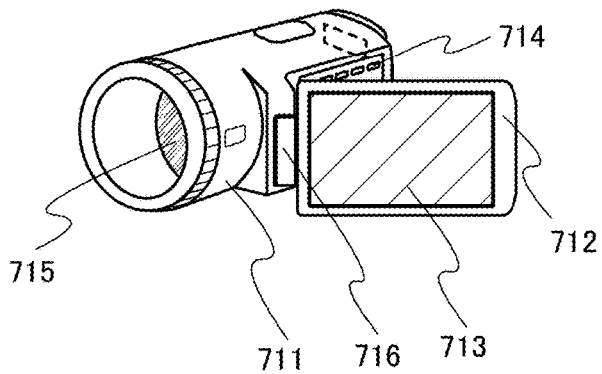

FIG. 52B illustrates a video camera, which includes a first housing 711, a second housing 712, a display portion 713, operation keys 714, a lens 715, a joint 716, and the like. The operation keys 714 and the lens 715 are provided in the first housing 711, and the display portion 713 is provided in the second housing 712. The imaging device of one embodiment of the present invention can be included as a component for obtaining an image in the video camera.

Figure 52C:
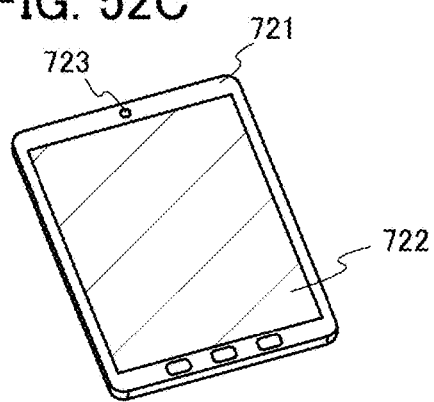

FIG. 52C illustrates a portable data terminal, which includes a housing 721, a display portion 722, a camera 723, and the like. A touch panel function of the display portion 722 enables input and output of information. The imaging device of one embodiment of the present invention can be included as one component for obtaining an image in the portable data terminal.

Figure 52D:
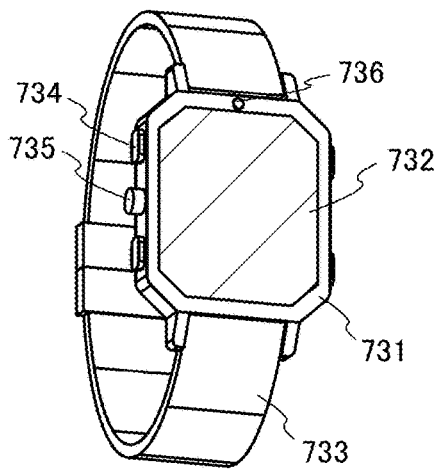

FIG. 52D illustrates a wrist-watch-type information terminal, which includes a housing 731, a display portion 732, a wristband 733, operation buttons 734, a winder 735, a camera 736, and the like. The display portion 732 may be a touch panel. The imaging device of one embodiment of the present invention can be included as a component for obtaining an image in the information terminal.

Figure 52E:
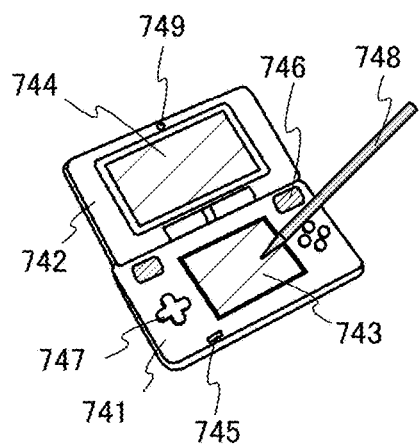

FIG. 52E illustrates a portable game machine, which includes housings 741 and 742, display portions 743 and 744, a microphone 745, speakers 746, an operation key 747, a stylus 748, a camera 749, and the like. Although the portable game machine in FIG. 52E has the two display portions 743 and 744, the number of display portions included in a portable game machine is not limited to this. The imaging device of one embodiment of the present invention can be included as one component in the portable game machine for obtaining an image.

Figure 52F:
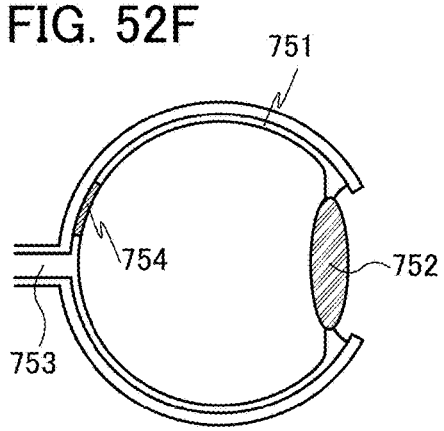

FIG. 52F illustrates an eyeball including a retina 751, a lens 752, an optic nerve 753, and the like. A sensor 754 is embedded in the retina 751 and can serve as the retina 751 when the retina 751 loses a function of converting visual information into an electrical signal, which leads to recovery in vision. The imaging device of one embodiment of the present invention can be used for the sensor 754.

Note that the examples are not limited to the above-described electronic devices as long as they include the imaging device of one embodiment of the present invention.

This embodiment can be combined with any of the other embodiments described in this specification as appropriate.

This application is based on Japanese Patent Application serial no. 2015-175427 filed with Japan Patent Office on Sep. 7, 2015, the entire contents of which are hereby incorporated by reference.

What is claimed is:

1. An imaging device comprising:
   a first pixel and a second pixel, each of the pixels comprising:
     a first photoelectric conversion element;
     a second photoelectric conversion element;
     a first transistor including a first active layer comprising a first oxide semiconductor;
     a second transistor including a second active layer comprising a second oxide semiconductor;
     a third transistor including a third active layer comprising a third oxide semiconductor;
     a fourth transistor including a fourth active layer comprising a fourth oxide semiconductor;
     a fifth transistor; and
     a sixth transistor,
   wherein one of terminals of the first photoelectric conversion element is electrically connected to one of a source and a drain of the first transistor,
   wherein one of terminals of the second photoelectric conversion element is electrically connected to one of a source and a drain of the second transistor,
   wherein the other of the source and the drain of the first transistor is electrically connected to one of a source and a drain of the third transistor,
   wherein the other of the source and the drain of the second transistor is electrically connected to one of a source and a drain of the fourth transistor,
   wherein the other of the source and the drain of the third transistor, the other of the source and the drain of the fourth transistor, one of a source and a drain of the fifth transistor, and a gate of the sixth transistor are electrically connected to each other, and
   wherein one of a source and a drain of the sixth transistor of the first pixel is directly connected to a power supply line and the other one of a source and a drain of the sixth transistor of the first pixel is directly connected to the sixth transistor of the second pixel.

2. The imaging device according to claim 1,
   wherein a high potential is applied to the other of the terminals of the first photoelectric conversion element, and
   wherein a high potential is applied to the other of the terminals of the second photoelectric conversion element.

3. The imaging device according to claim 1, wherein the first and second photoelectric conversion elements and the first to sixth transistors are stacked.

4. The imaging device according to claim 1,
wherein the first oxide semiconductor, the second oxide semiconductor, the third oxide semiconductor, and the fourth oxide semiconductor include In, Zn, and M, and
wherein M is Al, Ti, Ga, Sn, Y, Zr, La, Ce, Nd, or Hf.

5. The imaging device according to claim 1, wherein the fifth transistor includes a fifth active layer comprising a fifth oxide semiconductor.

6. The imaging device according to claim 1,
wherein the sixth transistor is an Si transistor.

7. The imaging device according to claim 1,
wherein the first photoelectric conversion element and the second photoelectric conversion element each comprise a material containing selenium.

8. A module comprising:
the imaging device according to claim 1; and
a lens.

9. An electronic device comprising:
the imaging device according to claim 1; and
a display device.

10. An imaging device comprising:
a first pixel and a second pixel, each of the pixels comprising:
    a first photoelectric conversion element;
    a second photoelectric conversion element;
    a first transistor including a first active layer comprising a first oxide semiconductor;
    a second transistor including a second active layer comprising a second oxide semiconductor;
    a third transistor including a third active layer comprising a third oxide semiconductor;
    a fourth transistor including a fourth active layer comprising a fourth oxide semiconductor;
    a fifth transistor;
    a sixth transistor;
    a first capacitor including a terminal electrically connected to the other of the source and the drain of the first transistor; and
    a second capacitor including a terminal electrically connected to the other of the source and the drain of the second transistor,
wherein one of terminals of the first photoelectric conversion element is electrically connected to one of a source and a drain of the first transistor,
wherein one of terminals of the second photoelectric conversion element is electrically connected to one of a source and a drain of the second transistor,
wherein the other of the source and the drain of the first transistor is electrically connected to one of a source and a drain of the third transistor,
wherein the other of the source and the drain of the second transistor is electrically connected to one of a source and a drain of the fourth transistor,
wherein the other of the source and the drain of the third transistor, the other of the source and the drain of the fourth transistor, one of a source and a drain of the fifth transistor, and a gate of the sixth transistor are electrically connected to each other, and
wherein one of a source and a drain of the sixth transistor of the first pixel is directly connected to a power supply line and the other one of a source and a drain of the sixth transistor of the first pixel is directly connected to the sixth transistor of the second pixel.

11. The imaging device according to claim 10,
wherein a high potential is applied to the other of the terminals of the first photoelectric conversion element, and
wherein a high potential is applied to the other of the terminals of the second photoelectric conversion element.

12. The imaging device according to claim 10, wherein the first and second photoelectric conversion elements and the first to sixth transistors are stacked.

13. The imaging device according to claim 10,
wherein the first oxide semiconductor, the second oxide semiconductor, the third oxide semiconductor, and the fourth oxide semiconductor include In, Zn, and M, and
wherein M is Al, Ti, Ga, Sn, Y, Zr, La, Ce, Nd, or Hf.

14. The imaging device according to claim 10, wherein the fifth transistor includes a fifth active layer comprising a fifth oxide semiconductor.

15. The imaging device according to claim 10,
wherein the sixth transistor is an Si transistor.

16. The imaging device according to claim 10,
wherein the first photoelectric conversion element and the second photoelectric conversion element each comprise a material containing selenium.

17. A module comprising:
the imaging device according to claim 10; and
a lens.

18. An electronic device comprising:
the imaging device according to claim 10; and
a display device.

19. The imaging device according to claim 1,
wherein a gate of the first transistor and a gate of the second transistor are electrically connected to each other.

20. The imaging device according to claim 10,
wherein a gate of the first transistor and a gate of the second transistor are electrically connected to each other.

* * * * *